United States Patent
Sharon et al.

(10) Patent No.: US 9,032,269 B2
(45) Date of Patent: May 12, 2015

(54) SYSTEMS AND METHODS OF STORING DATA

(75) Inventors: Eran Sharon, Rishon Lezion (IL); Idan Alrod, Herzliya (IL); Simon Litsyn, Givat Shmuel (IL)

(73) Assignee: Sandisk Technologies Inc., Plano, TX (US)

( * ) Notice: Subject to any disclaimer, the term of this patent is extended or adjusted under 35 U.S.C. 154(b) by 189 days.

(21) Appl. No.: 13/329,819

(22) Filed: Dec. 19, 2011

(65) Prior Publication Data

US 2013/0024748 A1 Jan. 24, 2013

Related U.S. Application Data

(60) Provisional application No. 61/510,892, filed on Jul. 22, 2011.

(51) Int. Cl.
| | | |
|---|---|---|
| H03M 13/00 | (2006.01) | |
| G11C 7/10 | (2006.01) | |
| G06F 11/10 | (2006.01) | |
| G11C 11/56 | (2006.01) | |

(52) U.S. Cl.
CPC .......... *G11C 7/1006* (2013.01); *G06F 11/1072* (2013.01); *G11C 11/5628* (2013.01); *G11C 11/5642* (2013.01); *G11C 2211/5641* (2013.01); *G06F 11/1044* (2013.01); *G06F 11/1068* (2013.01)
USPC ........................ 714/763; 711/103; 365/185.33

(58) Field of Classification Search
CPC .................................................. G11C 7/1006
USPC ........................ 714/763; 711/103; 365/185.33
See application file for complete search history.

(56) References Cited

U.S. PATENT DOCUMENTS

| | | | |
|---|---|---|---|
| 4,365,295 A | 12/1982 | Katzman et al. | |
| 4,484,275 A | 11/1984 | Katzman et al. | |
| 4,701,884 A | 10/1987 | Aoki et al. | |
| 5,367,383 A | 11/1994 | Godshalk et al. | |
| 5,671,239 A | 9/1997 | Higashitani et al. | |

(Continued)

FOREIGN PATENT DOCUMENTS

| | | | |
|---|---|---|---|
| WO | 2009053962 A3 | 4/2009 | |
| WO | 2009104063 A1 | 8/2009 | |

(Continued)

OTHER PUBLICATIONS

Wachsmann, Udo et al. "Multilevel Codes: Theoretical Concepts and Practical Design Rules," IEEE Transactions on Information Theory, vol. 45, No. 5, Jul. 1999, pp. 1361-1391.

(Continued)

*Primary Examiner* — Esaw Abraham
(74) *Attorney, Agent, or Firm* — Toler Law Group, PC

(57) ABSTRACT

A method of writing data includes receiving data pages to be stored in a data storage device and generating codewords corresponding to the received data pages. The codewords are stored to physical pages of a first memory portion of the data storage device. A first portion of a particular codeword that corresponds to a particular data page is stored at a first physical page of the first memory portion. A second portion of the particular codeword is stored at a second physical page of the first memory portion. The codewords are copied from the physical pages of the first memory portion to a physical page of a second memory portion of the data storage device.

29 Claims, 31 Drawing Sheets

(56) References Cited

U.S. PATENT DOCUMENTS

| | | |
|---|---|---|
| 5,687,184 A | 11/1997 | Lorenz et al. |
| 5,859,795 A | 1/1999 | Rolandi |
| 5,903,495 A | 5/1999 | Takeuchi et al. |
| 6,046,935 A | 4/2000 | Takeuchi et al. |
| 6,597,605 B2 | 7/2003 | Kreifels et al. |
| 6,674,385 B2 | 1/2004 | Micheloni et al. |
| 6,778,479 B2 | 8/2004 | Weng |
| 6,792,565 B1 | 9/2004 | Koyama |
| 6,966,024 B2 | 11/2005 | Park |
| 7,304,893 B1 | 12/2007 | Hemink |
| 7,388,781 B2 | 6/2008 | Litsyn et al. |
| 7,436,733 B2 | 10/2008 | Mokhlesi |
| 7,493,457 B2 | 2/2009 | Murin |
| 7,502,254 B2 | 3/2009 | Murin et al. |
| 7,526,715 B2 | 4/2009 | Litsyn et al. |
| 7,545,673 B2 | 6/2009 | Lasser |
| 7,616,483 B2 | 11/2009 | Murin |
| 7,660,941 B2 | 2/2010 | Lee et al. |
| 7,814,401 B2 | 10/2010 | Alrod et al. |
| 7,844,877 B2 | 11/2010 | Litsyn et al. |
| 7,913,153 B2 | 3/2011 | Orio |
| 7,924,628 B2 | 4/2011 | Danon et al. |
| 7,975,192 B2 | 7/2011 | Sommer et al. |
| 8,019,938 B2 | 9/2011 | Flynn et al. |
| 8,019,959 B2 | 9/2011 | Wu et al. |
| 8,020,081 B2 | 9/2011 | Kong et al. |
| 8,042,029 B2 | 10/2011 | Alrod et al. |
| 8,099,652 B1 | 1/2012 | Alrod et al. |
| 8,156,398 B2 | 4/2012 | Sommer |
| 8,189,407 B2 | 5/2012 | Strasser et al. |
| 8,266,496 B2 | 9/2012 | Flynn et al. |
| 8,281,227 B2 | 10/2012 | Thatcher et al. |
| 8,316,277 B2 | 11/2012 | Flynn et al. |
| 8,391,062 B2 | 3/2013 | Jang |
| 8,402,201 B2 | 3/2013 | Flynn et al. |
| 8,482,993 B2 | 7/2013 | Strasser et al. |
| 8,514,621 B2 | 8/2013 | Choi et al. |
| 8,539,195 B2 | 9/2013 | Wu et al. |
| 8,559,223 B2 | 10/2013 | Takashima |
| 8,719,501 B2 | 5/2014 | Flynn et al. |
| 8,832,528 B2 | 9/2014 | Thatcher et al. |
| 8,892,980 B2 | 11/2014 | Fillingim |
| 2005/0024943 A1 | 2/2005 | Chen et al. |
| 2005/0213393 A1 | 9/2005 | Lasser |
| 2006/0271725 A1 | 11/2006 | Wong |
| 2007/0089034 A1 | 4/2007 | Litsyn et al. |
| 2007/0124652 A1 | 5/2007 | Litsyn et al. |
| 2007/0133249 A1 | 6/2007 | Roohparvar |
| 2007/0206426 A1 | 9/2007 | Mokhlesi |
| 2007/0266296 A1 | 11/2007 | Conley |
| 2007/0283214 A1 | 12/2007 | Lasser |
| 2007/0283227 A1 | 12/2007 | Sharon et al. |
| 2008/0109702 A1 | 5/2008 | Brandman |
| 2008/0151617 A1 | 6/2008 | Alrod et al. |
| 2008/0183953 A1 | 7/2008 | Flynn et al. |
| 2008/0192544 A1 | 8/2008 | Berman et al. |
| 2008/0215801 A1 | 9/2008 | Tan et al. |
| 2008/0244360 A1 | 10/2008 | Mokhlesi et al. |
| 2008/0294960 A1 | 11/2008 | Sharon et al. |
| 2008/0313388 A1 | 12/2008 | Chow et al. |
| 2009/0024905 A1 | 1/2009 | Shalvi et al. |
| 2009/0100315 A1 | 4/2009 | Lee |
| 2009/0113115 A1 | 4/2009 | Nazarian et al. |
| 2009/0122610 A1 | 5/2009 | Danon et al. |
| 2009/0150744 A1 | 6/2009 | Flynn et al. |
| 2009/0172308 A1 | 7/2009 | Prins et al. |
| 2009/0217124 A1 | 8/2009 | Litsyn et al. |
| 2009/0241009 A1 | 9/2009 | Kong et al. |
| 2009/0327591 A1 | 12/2009 | Moshayedi |
| 2010/0082878 A1 | 4/2010 | Inoue et al. |
| 2010/0082885 A1 | 4/2010 | Litsyn et al. |
| 2010/0131806 A1 | 5/2010 | Weingarten et al. |
| 2010/0177567 A1 | 7/2010 | Honma |
| 2010/0205352 A1 | 8/2010 | Chu et al. |
| 2010/0211833 A1 | 8/2010 | Weingarten |
| 2010/0250836 A1 | 9/2010 | Sokolov et al. |
| 2010/0251076 A1 | 9/2010 | Wu et al. |
| 2010/0287440 A1 | 11/2010 | Alrod et al. |
| 2010/0293440 A1 | 11/2010 | Thatcher et al. |
| 2011/0041037 A1 | 2/2011 | Frost et al. |
| 2011/0066808 A1 | 3/2011 | Flynn et al. |
| 2011/0090734 A1 | 4/2011 | Burger, Jr. et al. |
| 2011/0125953 A1 | 5/2011 | Sartore |
| 2011/0157992 A1 | 6/2011 | Strasser et al. |
| 2011/0161560 A1 | 6/2011 | Hutchison et al. |
| 2011/0185251 A1 | 7/2011 | d'Abreu et al. |
| 2011/0213919 A1 | 9/2011 | Frost et al. |
| 2011/0213920 A1 | 9/2011 | Frost et al. |
| 2011/0228603 A1 | 9/2011 | Takashima |
| 2011/0258514 A1 | 10/2011 | Lasser |
| 2011/0258517 A1 | 10/2011 | Kodama |
| 2011/0264981 A1 | 10/2011 | Alrod et al. |
| 2011/0289267 A1 | 11/2011 | Flynn et al. |
| 2011/0302354 A1 | 12/2011 | Miller |
| 2011/0307758 A1 | 12/2011 | Fillingim |
| 2011/0314354 A1 | 12/2011 | Fillingim |
| 2011/0320688 A1 | 12/2011 | Lee |
| 2012/0059981 A1 | 3/2012 | Flynn et al. |
| 2012/0079331 A1 | 3/2012 | Toda |
| 2012/0131413 A1 | 5/2012 | Thatcher et al. |
| 2012/0166715 A1 | 6/2012 | Frost et al. |
| 2012/0215961 A1 | 8/2012 | Strasser et al. |
| 2012/0233521 A1 | 9/2012 | Kwok et al. |
| 2012/0243311 A1 | 9/2012 | Chen et al. |
| 2012/0304039 A1 | 11/2012 | Peterson et al. |
| 2013/0024605 A1 | 1/2013 | Sharon et al. |
| 2013/0024743 A1 | 1/2013 | Sharon et al. |
| 2013/0024746 A1 | 1/2013 | Sharon et al. |
| 2013/0024747 A1 | 1/2013 | Sharon et al. |
| 2013/0047056 A1 | 2/2013 | Hsu et al. |
| 2013/0073924 A1 | 3/2013 | d'Abreu et al. |
| 2013/0121090 A1 | 5/2013 | Park et al. |
| 2013/0179753 A1 | 7/2013 | Flynn et al. |
| 2013/0205183 A1 | 8/2013 | Fillingim et al. |
| 2013/0246839 A1 | 9/2013 | Werner et al. |

FOREIGN PATENT DOCUMENTS

| | | |
|---|---|---|
| WO | 2009114618 A2 | 9/2009 |
| WO | 2009114618 A3 | 9/2009 |
| WO | 2010092536 A1 | 8/2010 |

OTHER PUBLICATIONS

U.S. Appl. No. 60/939,092, filed May 21, 2007, entitled "Method for Memory Efficient Decoding," 36 pages.

U.S. Appl. No. 61/176,123, filed May 7, 2009, entitled "Strong ECC Matrix-Algebraic Approach," 33 pages.

Invitation to Pay Additional Fees, and, Where Applicable, Protest Fee and Partial International Search Report mailed Jan. 31, 2013 in International Application No. PCT/US2012/047545, 9 pages.

The International Search Report and Written Opinion mailed Apr. 4, 2013 in International Application No. PCT/US2012/047545, 23 pages.

Non-Final Office Action mailed Jul. 18, 2013 in U.S. Appl. No. 13/329,757, 6 pages.

Non-Final Office Action mailed Aug. 1, 2013 in U.S. Appl. No. 13/329,788, 5 pages.

Non-Final Office Action mailed Oct. 2, 2013 in U.S. Appl. No. 13/329,684, 16 pages.

Non-Final Office Action mailed Nov. 14, 2013 in U.S. Appl. No. 13/329,732, 36 pages.

Final Office Action mailed Feb. 28, 2014 in U.S. Appl. No. 13/329,684, 15 pages.

Notice of Allowance and Fee(s) Due mailed Dec. 26, 2013 in U.S. Appl. No. 13/329,757, 6 pages.

Notice of Allowance and Fee(s) Due mailed Jan. 6, 2014 in U.S. Appl. No. 13/329,788, 6 pages.

Final Office Action mailed Apr. 22, 2014 in U.S. Appl. No. 13/329,732, 46 pages.

Notice of Allowance and Fee(s) Due mailed Apr. 28, 2014 in U.S. Appl. No. 13/329,788, 7 pages.

(56) References Cited

OTHER PUBLICATIONS

Notice of Allowance and Fee(s) Due mailed Jun. 25, 2014 in U.S. Appl. No. 13/329,684, 8 pages.
Notice of Allowance and Fee(s) Due mailed Aug. 27, 2014 in U.S. Appl. No. 13/329,788, 7 pages.
Notice of Allowance and Fee(s) Due mailed Jul. 10, 2014 in U.S. Appl. No. 13/329,757, 7 pages.
"Module—14 Flash Memory Basics and Its Interface to a Processor", EE Herald, Apr. 30, 2009, retrieved from https://web.archive.org/web/20090430114459/http://www.eeherald.com/section/design-guide/esmod16.html on Apr. 16, 2014, 6 pages.
"NAND Flash ECC Algorithm (Error Checking & Correction)", Product Planning & Application Engineering Team, Samsung Electronics Co. Ltd., Jun. 2004, retrieved from http://www.elnec.com/sw/samsung_ecc_algorithm_for_256b.pdf on Nov. 4, 2013, 8 pages.
"What Are Bit-Lines and Word-Lines on a SDRAM Chip?", SDRAM Technology, Sep. 1, 2009, retrieved from http://www.sdram-technology.info/bitlines-wordlines.html on Apr. 15, 2014, 3 pages.
Cassuto et al., "Codes for Multi-Level Flash Memories: Correcting Asymmetric Limited-Magnitude Errors", IEEE International Symposium on Information Theory 2007 (ISIT 2007), Jun. 24-Jun. 29, 2007, pp. 1176-1180.
Cooke, "The Inconvenient Truths of NAND Flash Memory", Memory Summit, Santa Clara, California, Aug. 2007, retrieved from http://www.micron.com/-/media/Documents/Products/Presentation/flash_mem_summit_jcookie_inconvenient_truths_nand.pdf on Apr. 14, 2014, 32 pages.
Deal, "Trends in NAND Flash Memory Error Correction", Cyclic Design, Jun. 2009, retrieved from http://cyclicdesign.com/whitepapers/Cyclic_Design_NAND_ECC.pdf on Apr. 14, 2014, 11 pages.
Lowe, "Electronics Basics: What is a Latch Circuit", Electronics All-in-One For Dummies, retrieved from http://www.dummies.com/how-to/content/electronics-basics-what-is-a-latch-circuit.html on Nov. 4, 2013, 3 pages.
Yaakobi et al., "Error Correction Coding for Flash Memories", Center for Magnetic Recording Research, Report No. 31, Winter 2009, retrieved from http://cmrr.ucsd.edu/research/documents/Number31Winter2009_000.pdf on Apr. 4, 2014, 6 pages.

FIG. 25

SYSTEMS AND METHODS OF STORING DATA

CROSS-REFERENCE TO RELATED APPLICATIONS

The present application claims priority to U.S. Provisional Application No. 61/510,892, filed Jul. 22, 2011, which application is hereby incorporated by reference in its entirety.

FIELD OF THE DISCLOSURE

The present disclosure is generally related to storing data at a memory.

BACKGROUND

Non-volatile memory devices, such as universal serial bus (USB) flash memory devices or removable storage cards have allowed for increased portability of data and software applications. Flash memory devices can enhance cost efficiency by storing multiple bits in each flash memory cell. For example, Multi-Level Cell (MLC) flash memory devices provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the flash memory cell may be programmed to a state corresponding to the sequence of bits.

A particular mapping of sequences of bits to states used by a flash memory device impacts a relative reliability of bits stored at flash memory cells. To illustrate, if a flash memory cell is programmed to a first state (corresponding to an analog threshold voltage V and associated with the data "110") but is incorrectly read as a second state (corresponding to an analog threshold voltage V+$\Delta$V and associated with the data "010"), a bit error occurs at the most significant bit (i.e. "1" becomes "0"), but no error occurs at the middle bit or at the least-significant bit. In other words, there is a transition in the most significant bit (MSB) between the two states, but there is no transition in the other bits. Logical pages of data may be stored based on a common bit position in multiple flash memory cells. A read error between adjacent states (i.e. a state whose analog threshold is V is mistakenly read as a state whose analog threshold is V+$\Delta$V) may have a probability p. A read error between non-adjacent states (e.g. states whose analog threshold voltage difference is typically greater than three times $\Delta$V) may have a probability that is very small compared top and that may be approximated as zero. The number of data errors in a logical page may therefore be approximated to be proportional to the number of pairs of adjacent states whose corresponding bit in the logical page changes between the two states. Such a pair occurs whenever there is a transition of sign between a state and an adjacent state. Therefore, logical pages with many such pairs (i.e. with many transitions from 1 to 0 and from 0 to 1) will have more errors than pages whose number of transitions is smaller, provided that the states are uniformly spread within the voltage window. Some logical pages may be more reliable than other logical pages. Unequal reliability of logical pages may impact certain flash memory access methods and performance.

SUMMARY

An amount of protection that is provided in a codeword may be provided according to a reliability of a page in which the codeword is stored. For pages with lower reliability, additional redundant information provided in the codeword may cause the codeword length to exceed a single page. An encoded data page may be split and written to two or more physical pages in a binary cache (e.g. a single level cell (SLC) portion) of a flash memory device. Data pages may be copied from multiple physical pages in the binary cache to a multi-level cell (MLC) portion of the memory device.

A data page may be encoded as a concatenated codeword that includes multiple sub-codes and joint parity of the multiple sub-codes. The concatenated codeword may be split into a first portion that includes sub-code data portions and a second portion that includes the joint parity. The first portion may be written to a first physical page of the binary cache and the second portion may be written to a second physical page of the binary cache. Generating and storing the multiple sub-codes and the joint parity enables multi-phase decoding of the sub-codes.

BRIEF DESCRIPTION OF THE DRAWINGS

FIG. 25 is a general diagram illustrating a particular embodiment of page-by-page, two-soft bit read reliability settings;

DETAILED DESCRIPTION

Figure 1:
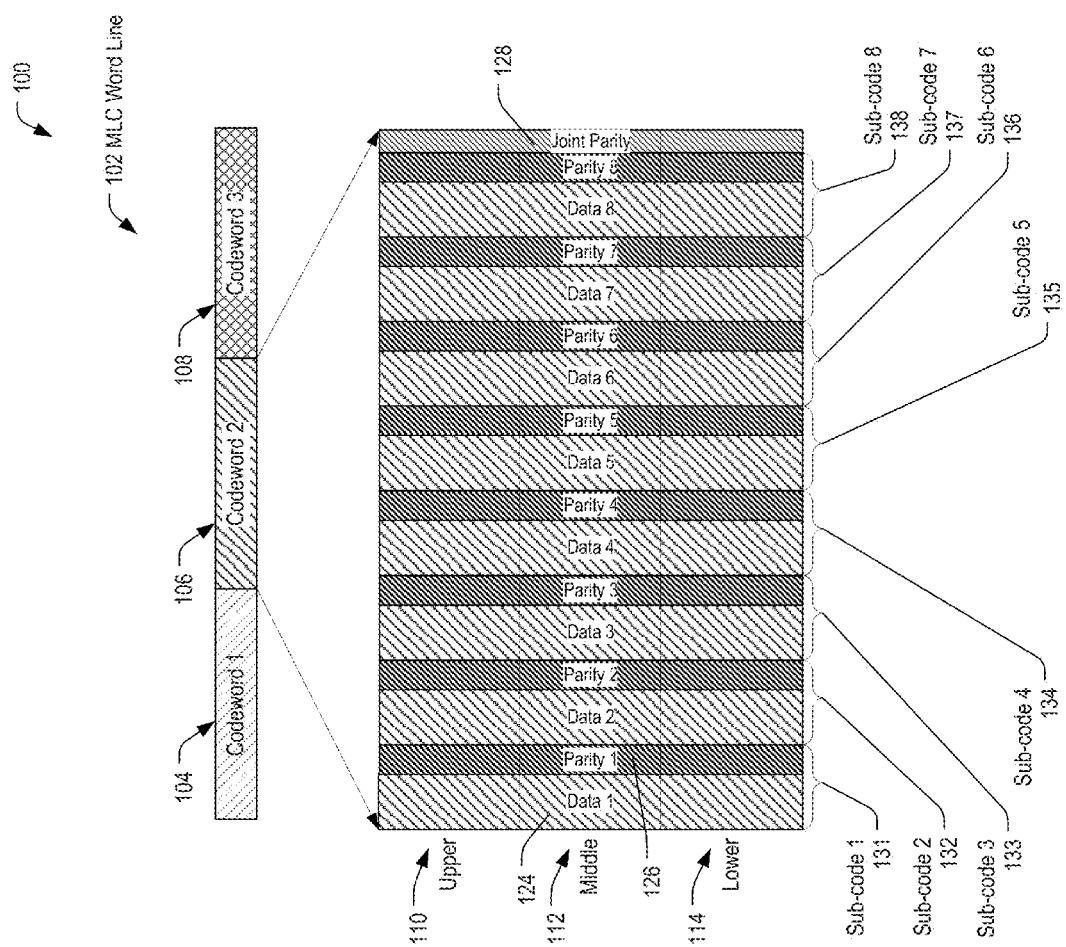
FIG. 1 is a general diagram of a first embodiment of mapping concatenated codewords into pages of a word line with sub-code data and parity of a single concatenated codeword stored across multiple pages.

An efficient coding scheme that provides a good tradeoff between reliability, access time, and complexity can be implemented at a flash memory by using a multi-phase decoding concatenated code construction. Such a code construction enables efficient access to small amounts of data by protecting each small amount of data individually, using a sub-code that is stored as a short sub-word in the flash memory. The sub-code can include the data and parity bits that provide redundancy to protect the data. The sub-word can later be read from the flash memory, transferred to a flash memory controller, and decoded in order to retrieve the data of the sub-code. Reading the sub-word alone and decoding the sub-code enables faster read performance of random read requests of the flash memory, as compared to reading and decoding an entire codeword to access the data. If decoding the sub-code fails because too many errors have occurred in the sub-word, a longer codeword can be read from the flash memory, transferred to the controller, and decoded to recover the data.

In order to further improve reading time, a sub-code's data and some or preferably all of the sub-code's parity bits can be stored within a single page of a word line of the flash memory. For example, the flash memory may include storage elements that are arranged to be accessible via a word line. Each storage element may be programmed to be in one of M possible states by adjusting a threshold voltage of the flash memory cell to be within a particular voltage range of M defined voltage ranges. This enables each storage element to store $\log_2(M)$ bits and sets a correspondence between the set of M voltage ranges and the set of M strings where each of the strings contains $\log_2(M)$ bits. Each particular voltage range corresponds to a specific string. The word line is also considered as a page for writing multiple strings, each of the strings of length $\log_2(M)$, and the word line may be partitioned into logical pages, where each logical page is the place of a specific bit. For example, an MLC flash memory with M=8 states can store 3 bits per cell. Each bit of the three bits may correspond to a different logical page of data stored at the word line. For example, the logical pages of data stored at the word line may be referred to as an upper page, a middle page, and a lower page. The upper page may be read by identifying the set of states where the upper bit has a transition (i.e. the upper bit is 0 in one state and is 1 in an adjacent state) and performing sense operations by applying reading voltages between these states. The result of the reading with this set of reading voltages is used for determining a value of the most significant bit of each storage element in the word line. The middle page may be read in a similar fashion for determining a value of the middle bit of each storage element in the word line, and the lower page may be read in a similar fashion for determining a value of the least significant bit of each storage element in the word line.

Assuming that an error rate of a logical page is low enough, the data encoded within a sub-code can be retrieved by reading a single page, requiring an average of only $(M-1)/\log_2(M)$ sense operations and providing short reading latency. In case of a decoding failure resulting from a number of errors occurring in the sub-code that exceeds an error correction capability of the sub-code, several actions may be taken. These actions may include any combination of the following:

1) Adjusting reading thresholds and re-reading the single page of data with the adjusted thresholds;

2) Increasing the reading resolution of the same page;

3) Activating certain "noise" mitigation techniques, such as mitigation of cross-coupling effects or program disturb effects—these techniques may include performing additional reading of neighboring word lines or pages or cells;

4) Reading additional parity bits of the sub-codes (possibly from another page where the additional parity bits may be stored);

5) Reading the entire concatenated codeword, i.e. the other sub-codes and joint parity for the concatenated codeword (possibly from another page or pages, where the other sub-codes and joint parity may be stored).

Performing one or more of the described actions increases the probability that data can be retrieved after an initial sub-code decoding fails.

FIGS. 1-6 show examples of mapping a concatenated codeword into pages of MLC word lines. In these examples, an MLC flash memory with M=8 states (i.e. 3 bits per cell) is assumed, such that the word line includes three pages that are denoted Upper, Middle, and Lower. While an example MLC flash memory with 3 bits per cell is shown, other mapping examples can be used.

FIG. 1 shows an example 100 of mapping a concatenated codeword into pages of a word line where sub-codes span multiple pages rather than being confined to a single page. An MLC word line 102 is illustrated as storing a first codeword (codeword 1) 104, a second codeword (codeword 2) 106, and a third codeword (codeword 3) 108. An upper page 110, a middle page 112, and a lower page 114 of a portion of the MLC word line 102 that stores the second codeword 106 is illustrated. The second codeword 106 includes eight sub-codes 131-138. Each sub-code 131-138 includes a data portion and also includes a parity portion that corresponds to the data portion. For example, the first sub-code 131 includes first data (data 1) 124 and first parity (parity 1) 126. The second codeword 106 also includes joint parity 128. The joint parity 128 includes parity data that can be used to assist in decoding individual sub-codes 131-138 that may not be decodable using sub-code parity.

For example, data of each of the sub-codes 131-138 (e.g. the first data 124) may be encoded using a systematic ECC scheme to produce a codeword that includes the data and also includes parity bits. The codeword may be punctured to remove a portion of the parity bits, and the punctured codeword (e.g. the first data 124 and the first parity 126) may be stored as a sub-code (e.g. the first sub-code 131). The parity bits that have been removed from each of the codewords may be combined and added as the joint parity 128. For example, the parity bits that are removed from each of the codewords may be combined via a bitwise exclusive-OR (XOR) operation. When one of the sub-codes 131-138 is uncorrectable because a number of bit errors in the sub-code exceeds a correction capability of the sub-code's ECC scheme, one or more of the other sub-codes 131-138 may be read and decoded to recover the original punctured parity bits of one or more of the other sub-codes 131-138. The recovered punctured parity bits can be combined with the joint parity 128 to reconstruct the full codeword corresponding to the uncorrectable sub-code.

For example, when the first sub-code 131 (i.e. the first data 124 and the first parity 126) is uncorrectable using only the first parity 126, each remaining sub-code 132-138 may be decoded to generate the parity bits that were removed from each of the sub-codes 132-138. The re-generated parity bits may be XORed with the joint parity 128 to recover the parity bits that were removed from the first sub-code 131. The first sub-code 131 can be un-punctured by adding the recovered parity bits. ECC decoding of the un-punctured first sub-code may be performed with a greater error correction capability due to the additional parity that has been recovered from joint parity 128.

Each flash memory cell in the MLC word line 102 can be programmed to store a string of three bits of data by programming the cell to a particular physical state from a set of M=8 states, i.e. by adjusting a threshold voltage of the flash memory cell to be within a particular voltage range of M=8 defined voltage ranges, and the entire word line is associated with a page (denoted physical page) for storing multiple strings, each of the strings comprising three bits of data. Each of the physical states is partitioned into three pages (denoted logical pages) where each logical page stores a bit in a different position. The upper page 110 may correspond to the most significant bit of the flash memory cells, the middle page 112 may correspond to the middle bits, and the lower page 114 may correspond to the least significant bits of the flash memory cells.

Reading data from the MLC word line 102 can include performing one or more sense operations. For example, M−1=7 reading thresholds (i.e. 7 sense operations) may be used to define the M=8 voltage ranges. A sensing operation can include comparing a threshold voltage of each flash memory cell in the MLC word line 102 to a selected reading threshold to determine which flash memory cells have a threshold voltage that exceeds the selected reading threshold and which flash memory cells have a threshold voltage that does not exceed the selected reading threshold. In order to read all three bits of each flash memory cell (i.e. all three pages 110, 112, and 114 of the MLC word line 102), a total of M−1=7 sense operations (one sense operation at each reading threshold) are required to identify the specific state of each flash memory cell. However, a single page 110, 112, or 114 may be read from the MLC word line 102 using fewer than M−1 sense operations, and in some cases a single page 110, 112, or 114 may be read using a single sense operation.

In the example of FIG. 1, each sub-code 131-138 is interleaved over all of the pages 110-114 and hence all of the sub-codes 131-138 may exhibit similar error rates. For example, if the upper page 110 has a higher expected error rate than the middle page 112 and the lower page 114, each of the sub-codes 131-138 would be equally affected because each sub-code 131-138 is evenly distributed across all of the pages 110-114. However, reading any one of the sub-codes 131-138 requires reading all three pages 110-114, and therefore requires performing M−1=7 sense operations. Reading a single one of the sub-codes 131-138 may result in a greater latency than other configurations where a sub-code is stored at only one or two of the pages 110-114 and hence can be read using fewer sense operations.

Figure 2:
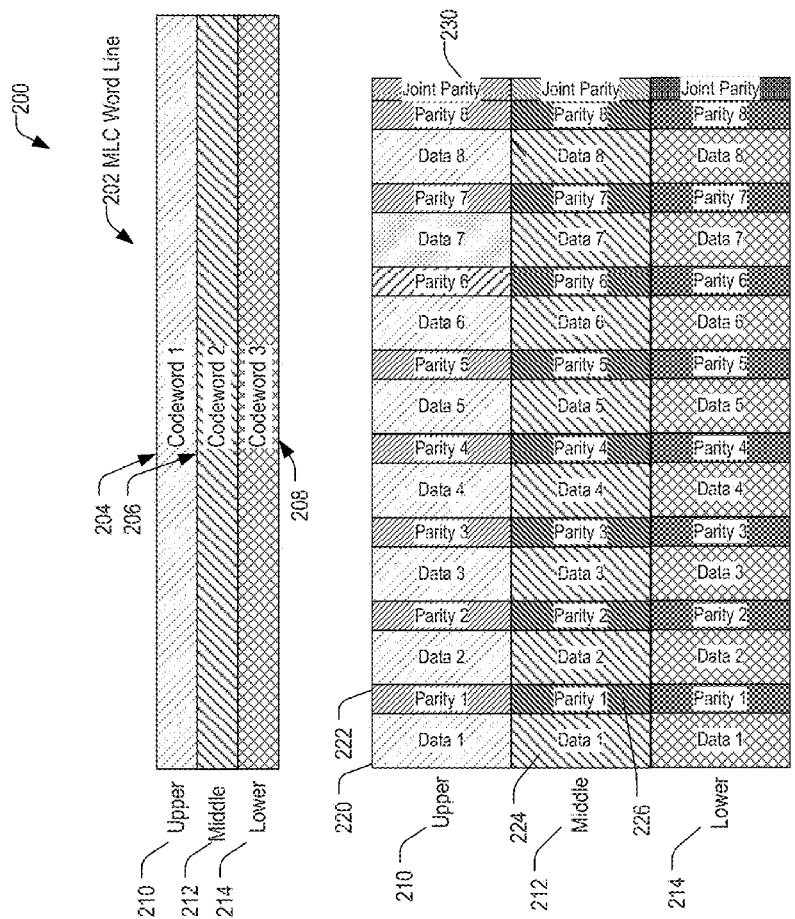
FIG. 2 is a general diagram of a second embodiment of mapping concatenated codewords into pages of a word line with sub-code data and parity of a concatenated codeword stored at a single page.
Figure 3:
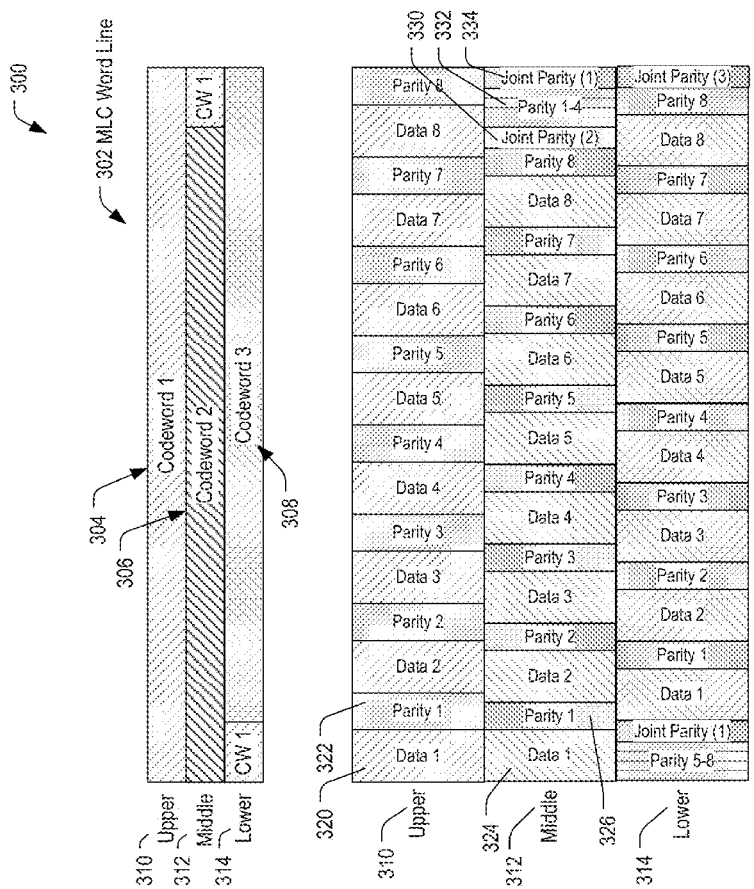
FIG. 3 is a general diagram of a third embodiment of mapping concatenated codewords into pages of a word line that have unequal reliability, where a concatenated codeword that spans a less-reliable page has more parity than concatenated codewords stored at more-reliable pages and extends across multiple pages.

FIGS. 2-3 show different examples of mapping concatenated codewords into pages of a word line such that data of a sub-code and some or all the parity of the sub-code are confined to a single page. The mappings of FIGS. 2-3 can allow efficient reading of the data with a reduced number of sense operations.

FIG. 2 shows an example 200 of storing three concatenated codewords 204, 206, 208 at an MLC word line 202 such that each codeword 204-208 is mapped to a separate page of the MLC word line 202. The first codeword 204 is stored entirely in an upper page 210, the second codeword 206 is stored entirely in the middle page 212, and the third codeword 208 is stored entirely in a lower page 214 of the MLC word line 202. Each codeword 204-208 includes eight sub-codes. For example, the first codeword 204 includes a first sub-code having first data 220 and first parity 222, and the second codeword 206 includes a first sub-code having first data 224 and first parity 226. Each codeword 204-208 also includes joint parity, such as joint parity 230 of the second codeword 206. The joint parity includes parity data that can be used to assist in decoding individual sub-codes that may not be decodable using the parity of the sub-code, such as described with respect to FIG. 1. The codewords 204-208 use a common concatenated coding scheme that results in a same number and configuration of sub-codes in each codeword 204-208. For example, in FIG. 2, each codeword 204, 206, 208 has eight sub-codes that have a common size and that include equal amounts of data.

The scheme illustrated in FIG. 2 may have increased efficiency when the reliabilities of the different pages 210-214 of the MLC word line 202 are balanced. Also, each sub-code is stored in a single page 210, 212, or 214 and can be read faster (requiring fewer sense operations) than the sub-codes of FIG. 1 that span all three pages 110-114. However, if different pages 210-214 of the MLC word line 202 have different reliabilities (i.e. error rates), then the mapping scheme of FIG. 2 may have reduced achievable error correction capability. Methods for controlling reliability of different pages of a word line are described in further detail with respect to Tables 1-4 and FIGS. 7-10.

FIG. 3 shows a mapping example 300 which may be suitable when an upper page is less reliable than a lower page and a middle page (which may have substantially equal reliabilities). An MLC word line 302 is illustrated as storing a first codeword 304, a second codeword 306, and a third codeword 308. The first codeword 304 has portions stored in an upper page 310, a middle page 312, and a lower page 314 of the MLC word line 302. The second codeword 306 is stored entirely in the middle page 312, and the third codeword 308 is stored entirely in a lower page 314. Each codeword 304-308 includes eight sub-codes. For example, the first codeword 304 includes a first sub-code having first data 320 and first parity 322, and the second codeword 306 includes a first sub-code having first data 324 and first parity 326. Each codeword 304-308 also includes joint parity, such as a joint parity 330 of the second codeword 306.

In the example of FIG. 3, a lower rate code (i.e. a code that uses more parity to provide more redundancy) is used for protecting data at the upper page 310 and higher rate codes (i.e. codes that use less parity to provide less redundancy) are used for protecting data at the lower page 314 and at the middle page 312. Each sub-code of the first codeword 304 has substantially the same amount of data as each sub-code of the second codeword 306 and of the third codeword 308 (e.g. the first data 320 is the same size as the first data 324). However, because the sub-codes of the first codeword 304 have more redundancy than the sub-codes of the other codewords 306-308, each parity block in the upper page 310 is larger than the parity blocks of the middle page 312 and the lower page 314 (e.g. the first parity 322 is larger than the first parity 326).

Some of the redundancy protecting data of the upper page 310 is stored on the lower and middle pages 312-314. For example, the middle page 312 includes additional parity 332 for sub-codes 1-4 of the first codeword 304 and also includes a first portion of joint parity 334 for the first codeword 304. The lower page 314 includes additional parity for sub-codes 5-8 of the first codeword 304 and a second portion of the joint parity for the first codeword 304.

Mappings similar to the mapping 300 of FIG. 3 can be designed for other page reliabilities. Methods for controlling a reliability of different pages of a word line are described with respect to Tables 1-4 and FIGS. 7-10.

Figure 4:
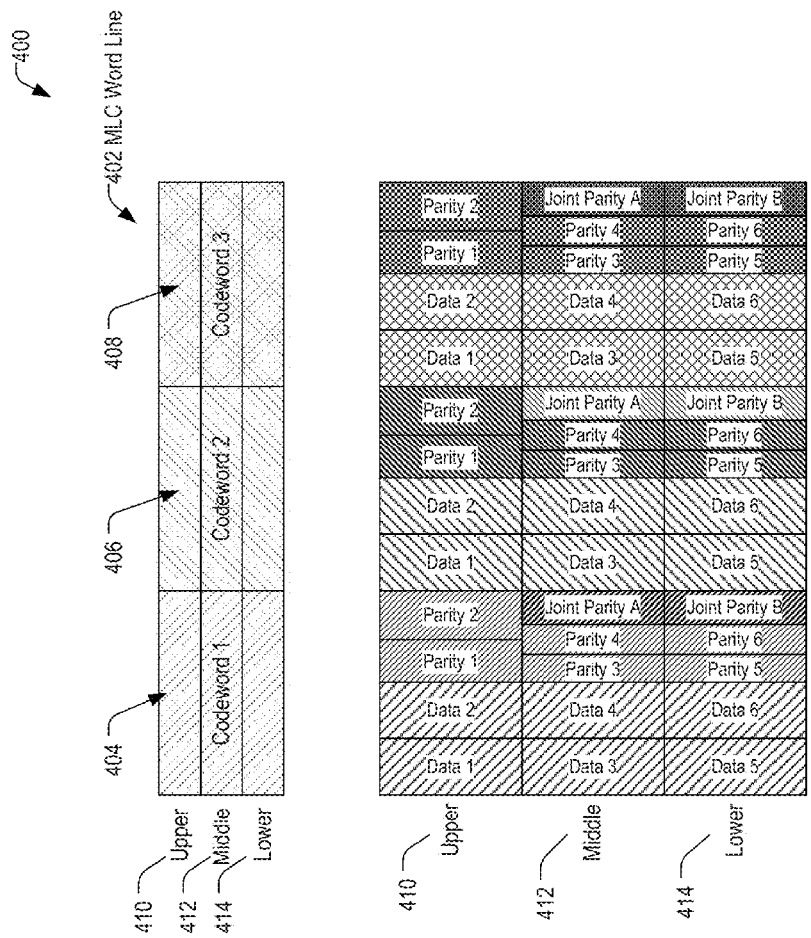
FIG. 4 is a general diagram of a fourth embodiment of mapping concatenated codewords into pages of a word line that have unequal reliability, where each concatenated codeword spans multiple pages and includes more sub-code parity for sub-code data stored at less-reliable pages than for sub-code data stored at more-reliable pages.

FIG. 4 shows another mapping example 400 that may be suitable when an upper page is less reliable than lower and middle pages and the lower and middle pages have substantially the same reliability. An MLC word line 402 is illustrated as storing a first codeword 404, a second codeword 406, and a third codeword 408. Each codeword 404-408 includes eight sub-codes and joint parity. Each codeword 404-408 has portions in an upper page 410, a middle page 412, and a lower page 414 of the MLC word line 402.

In the example of FIG. 4, the codewords 404-408 are symmetric (i.e. all of the codewords 404-408 belong to the same code) and each codeword 404, 406, 408 is spanned over all of the pages 410-414 of the MLC word line 402. However, the sub-codes within each concatenated codeword 404, 406, 408 are not symmetric. For example, lower-rate sub-codes (i.e. more parity) are used for protecting the less reliable upper page 410 and higher-rate sub-codes (i.e. less parity) are used for protecting the more reliable lower page 412 and middle page 414. To illustrate, the first codeword 404 has a first sub-code (Data 1 and Parity 1) and a second sub-code (Data 2 and Parity 2) in the upper page 410. The first codeword 404 also has a third sub-code (Data 3 and Parity 3), a fourth sub-code (Data 4 and Parity 4), and a first portion of the joint parity (Joint Parity A) in the middle page 412. Because the middle page 412 is more reliable than the upper page 410, each sub-code in the middle page 412 has less parity than each sub-code in the upper page 410 to protect a same amount of data. The reduced amount of sub-code parity in the middle page 412 enables storage of the third and fourth sub-codes and the first portion of the joint parity in a same amount of space as occupied by the first two sub-codes in the upper page 410.

Figure 5:
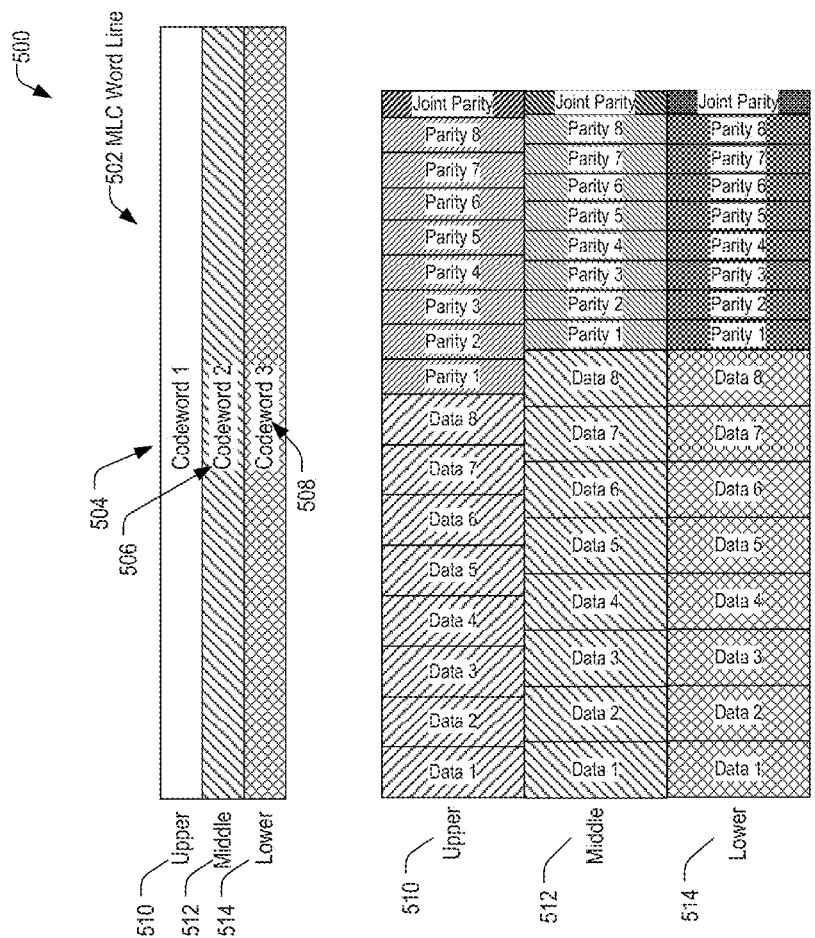
FIG. 5 is a general diagram of a fifth embodiment of mapping concatenated codewords into pages of a word line that have unequal reliability, where a concatenated codeword stored at a less-reliable page has a same number of sub-codes as concatenated codewords stored at more-reliable pages and the concatenated codeword stored at the less-reliable page holds less information than a concatenated codeword stored at a more-reliable page.
Figure 6:
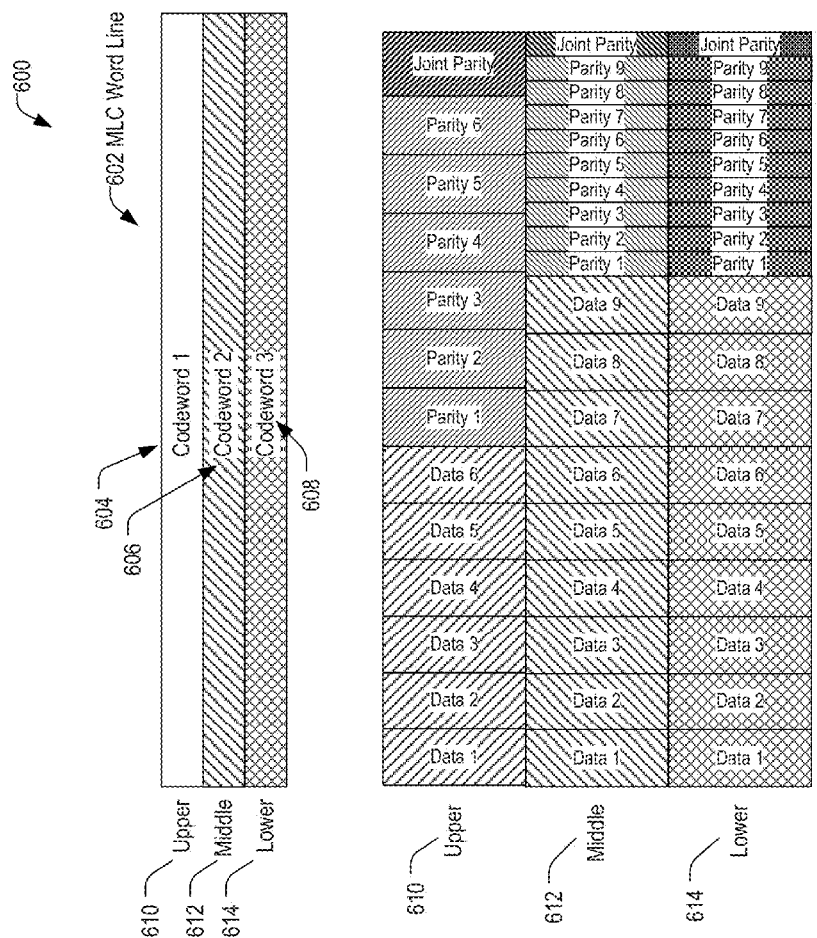
FIG. 6 is a general diagram of a sixth embodiment of mapping concatenated codewords into pages of a word line that have unequal reliability, where a concatenated codeword stored at a less-reliable page has fewer sub-codes than concatenated codewords stored at more-reliable pages.

FIGS. 5 and 6 show additional mapping examples that may be suitable when an upper page is less reliable than a lower page and a middle page that have equal reliabilities. FIG. 5 illustrates a mapping example 500 including an MLC word line 502 storing a first codeword 504, a second codeword 506, and a third codeword 508. The first codeword 504 is stored entirely in an upper page 510, the second codeword 506 is stored entirely in a middle page 512, and the third codeword 508 is stored entirely in a lower page 514. Each codeword 504, 506, 508 includes eight sub-codes and joint parity. However, each sub-code of the first codeword 504 includes less data than each sub-code of the second codeword 506 and of the third codeword 508.

FIG. 6 illustrates a mapping example 600 including an MLC word line 602 storing a first codeword 604, a second codeword 606, and a third codeword 608. The first codeword 604 is stored entirely in an upper page 610 and includes six sub-codes and joint parity. The second codeword 606 is stored entirely in a middle page 612 and includes nine sub-codes and joint parity. The third codeword 608 is stored entirely in a lower page 614 and includes nine sub-codes and joint parity.

In contrast to the mappings of FIG. 3 and FIG. 4 where each page stores a same amount of data, the mappings of FIG. 5 and FIG. 6 store less data on the less-reliable upper pages 510, 610 as compared to more reliable lower pages 514, 614 and middle pages 512, 612. In FIG. 5 the sub-codes of the upper page 510 protect less data than those of the lower and middle pages 512, 514, while in FIG. 6 all of the sub-codes protect the same amount of data, but the upper page codeword 604 has fewer sub-codes than the lower and middle page codewords 606, 608.

In all of the examples shown in FIGS. 2-6, a sub-code (or a major part of the sub-code) is confined into a single page of a word line in order to allow fast reading of the sub-code. However, confining a sub-code (or major part of a sub-code) into a single page of a word line may possibly result in the sub-code exhibiting a higher error rate than the average error rate over the entire word line, due to the possibly unequal reliabilities of the different pages of the word line. A higher sub-code error rate may cause non-optimal utilization of the word line and reduced information density per cell of the word line because the ECC redundancy may be determined based on the error rate of the less reliable page instead of the average error rate over all of the pages.

Various techniques described herein for better utilization of the word line may be categorized into one or more of several groups:

1) Techniques that include improving a balance of reliabilities of all pages of a word line;

2) Techniques that include more closely matching a protection level of data to a reliability of a page in which the data is stored (i.e. match an error correction capability to an expected error rate, with unequal redundancy allocation among codewords or sub-codes);

3) Techniques that include more closely matching an amount of data stored on a page to a reliability of the page;

4) Techniques that utilize some of the redundancy bits in the more reliable pages for shaping the probability distribution over the programmed levels (for endurance enhancement and/or error rate reduction and "noise" mitigation).

Any combination of techniques (e.g. a combination of techniques from two or more different groups) is also possible.

Balancing Page Reliabilities

The coding scheme depicted in FIG. 2 may be suitable when all pages of a word line have equal reliabilities (i.e. equal error rates). There may be several approaches that may be taken in order to fully or partially balance reliabilities of different pages of a word line.

One approach is to adjust verify levels of different states so that equal (or more balanced) error rates are induced over the different pages of the word line. For example, Table 1 illustrates a possible mapping from bits to states for an MLC flash memory with M=4 states.

TABLE 1

An example mapping for M = 4

| | State: | | | |
|---|---|---|---|---|
| | Erase (Er) | A | B | C |
| Upper Page: | 1 | 0 | 0 | 1 |
| Lower Page: | 1 | 1 | 0 | 0 |

When verify levels are set such that an error probability from each state to an adjacent state is equal, the error rates over the different pages are not equal. For example, the verify levels may be set so that a probability of an error between states Er and A (i.e. a cell placed in the Er state is read as the A state or a cell placed in the A state is read as the Er state) is substantially equal to a probability of an error between states A and B and substantially equal to a probability of an error between states B and C. When errors between states are equally probable, an error rate of the upper page is twice an error rate of the lower page because the upper page contains two transitions from 1 to 0 (or vice versa).

A shift from one state to another will not result in an error if the shift does not change a bit value of the page. To illustrate, an error occurring between states Er and A or between states B and C of Table 1 will cause an erroneous bit to be read at the upper page but will not cause an erroneous bit to be read at the lower page. An error between states A and B will not cause a bit error when reading the upper page but will cause an erroneous bit to be read at the lower page. When the error probability from every state to an adjacent state is equal, a page reliability may be determined based on a number of state transitions that correspond to changes of a bit value of the page. In Table 1, the upper page has two such transitions (Er and A, B and C) while the lower page has a single such transition (A and B). As a result, if all erroneous state transitions are equally probable, an erroneous bit value is twice as likely to occur in the upper page as compared to the lower page. Thus, the page reliabilities are not balanced when the verify levels cause error probabilities between states to be equal.

Page reliabilities may be balanced by setting the verify levels in such a way that states A and B are placed closer to one another and further from states Er and C. As a result, an error probability between states A and B can be induced that is twice as large compared to the error probability between Er and A or between B and C, inducing equal error rates for the upper and lower pages. However, a verify level setting that induces unequal error rates among the states may be suboptimal in terms of induced storage capacity. To illustrate, ECC redundancy required to satisfy a given error correction capability will be larger than ECC redundancy for an interleaved coding scheme with verify levels that induce equal error rates over states. In addition, a verify level setting that induces unequal error rates over the states may be less robust to variation effects from die-to-die, block-to-block, page-to-page, etc.

Another approach for partially balancing page reliabilities includes using an appropriate mapping from bits to states. Table 2 depicts an example mapping for an MLC flash memory with M=8 states.

TABLE 2

An example mapping for M = 8

| State: | Er | A | B | C | D | E | F | G |
|---|---|---|---|---|---|---|---|---|
| Upper Page: | 1 | 0 | 0 | 1 | 1 | 0 | 0 | 1 |
| Middle Page: | 1 | 1 | 0 | 0 | 0 | 0 | 1 | 1 |
| Lower Page: | 1 | 1 | 1 | 1 | 0 | 0 | 0 | 0 |

According to the mapping of Table 2, if an error rate of the lower page is given as a value "p" then an error rate of the middle page is 2*p and an error rate of the upper page is 4*p (because the lower page has one transition from 1 to 0, the middle page has two transitions and the upper page has four transitions).

On the other hand, if the mapping of Table 3 is used, more balanced error rates are achieved over pages of the word line.

TABLE 3

Another mapping for M = 8

| State: | Er | A | B | C | D | E | F | G |
|---|---|---|---|---|---|---|---|---|
| Upper Page: | 1 | 1 | 0 | 0 | 1 | 1 | 0 | 0 |
| Middle Page: | 1 | 0 | 0 | 0 | 0 | 1 | 1 | 1 |
| Lower Page: | 1 | 1 | 1 | 0 | 0 | 0 | 0 | 1 |

Using the mapping of Table 3, if a bit error rate of the lower page is p then a bit error rate of the middle page is also p. If cell states are determined as threshold voltage ranges that are distributed uniformly over a voltage band, a bit error rate of the upper page is (3/2)*p because both the lower and middle pages have two transitions from 0 to 1, while the upper page has three transitions. Therefore, the lower and middle pages have a same reliability and the upper page has a lower reliability. The coding schemes depicted in FIGS. 2-6 are suitable for a reliability allocation of the pages according to the mapping of Table 3.

The mappings depicted in Table 2 and Table 3 corresponds to a same average number of sense operations per page. In the mapping of Table 2, the lower page can be read using a single sense operation (between states C and D), the middle page can be read using two sense operations (between states A and B and between states E and F) and the upper page can be read using four sense operations (between states Er and A, between states B and C, between states D and E, and between states F and G). Overall, an average number of sense operations per page reading can be given as (1+2+4)/3=2.333. Similarly, in the mapping of Table 3, the lower page can be read using two sense operation (between states B and C and between states F and G), the middle page using two sense operations (between states Er and A and between states D and E) and the upper pages can be read using three sense operations (between states A and B, between states C and D, and between states E and F). Overall, an average number of sense operations per page reading is (2+2+3)/3=2.333.

Grey mappings are mappings in which a single bit is changed between the bit mappings of any two adjacent states. Grey mappings can reduce an average bit error rate and an average number of sense operations per page. For a Grey mapping over M states, an average number of sense operations per page reading is $(M-1)/\log_2(M)$.

The mappings described in Table 2 and Table 3 are only examples. Different mappings can be used to achieve different levels of reliability balancing. However, complete balancing may not be achievable for a Grey mapping when a number of states is a power of two (e.g. 2, 4, 8, 16) because a number of transitions from 0 to 1 (i.e., M−1) is not divisible by the number of pages (i.e., $\log_2(M)$).

A third approach that may be used to improve reliability balancing is to use more than one mapping per word line. For example, some storage elements of a word line may be programmed using one mapping and other storage elements of the word line may be programmed using a different mapping.

One example for such reliability balancing using multiple mappings per word line is shown in Table 4.

middle page and the lower page). The remaining ⅓ of the cells are programmed according to the right-side mapping, where the lower and middle bits of the cells exhibit an error rate of 3*p and the upper bit exhibits an error rate of p (i.e. the upper page is more reliable than the middle page and the lower page). This way, the overall bit error rate of the lower and middle pages is (2/3)*2*p+(1/3)*3*p=2.33*p and the overall bit error rate of the upper page is (2/3)*3*p+(1/3)*p=2.33*p. Hence, the upper, middle, and lower pages have equal overall reliabilities.

An alternative to using multiple bit-to-state mappings per word line can be used in multi-plane flash memory devices. Instead of mixing two or more mapping schemes in one wordline, each plane of a multi-plane memory device may have a different mapping (or different setting of read thresholds). Codewords may be stored in the multi-plane memory device to have one portion in one plane and another portion in a corresponding location in another plane to balance overall bit error rates of stored codewords.

Supporting Multiple Mappings in a Flash Memory

Multiple mappings from bits to state may be supported in a storage device such as a flash memory device. For example, multiple mappings from bits to states may be supported for balancing page reliabilities, or for implementing a new mapping, while still supporting an existing mapping for backward compatibility with other flash memory controllers. To illustrate, some existing flash memory devices may have a data programming sequence that implements a single mapping of bits to states. Such flash memory devices may program data to a flash array by writing bits into internal flash memory latches and then applying a built-in mapping to the bits in the latches to determine programming states for an MLC word line. Multiple mappings from bits to states may be implemented in such existing flash memory devices by using the following sequence of operations:

1) Write data into the internal flash memory latches.
2) Perform a sequence of logical operations on selected bits in the flash memory latches in order to convert the mapping of the bits from a second mapping (a desired mapping of bits into states) into a first mapping according to which the flash memory converts bits to states.
3) Program the data from the internal flash memory latches to the MLC word line.

Figure 7:
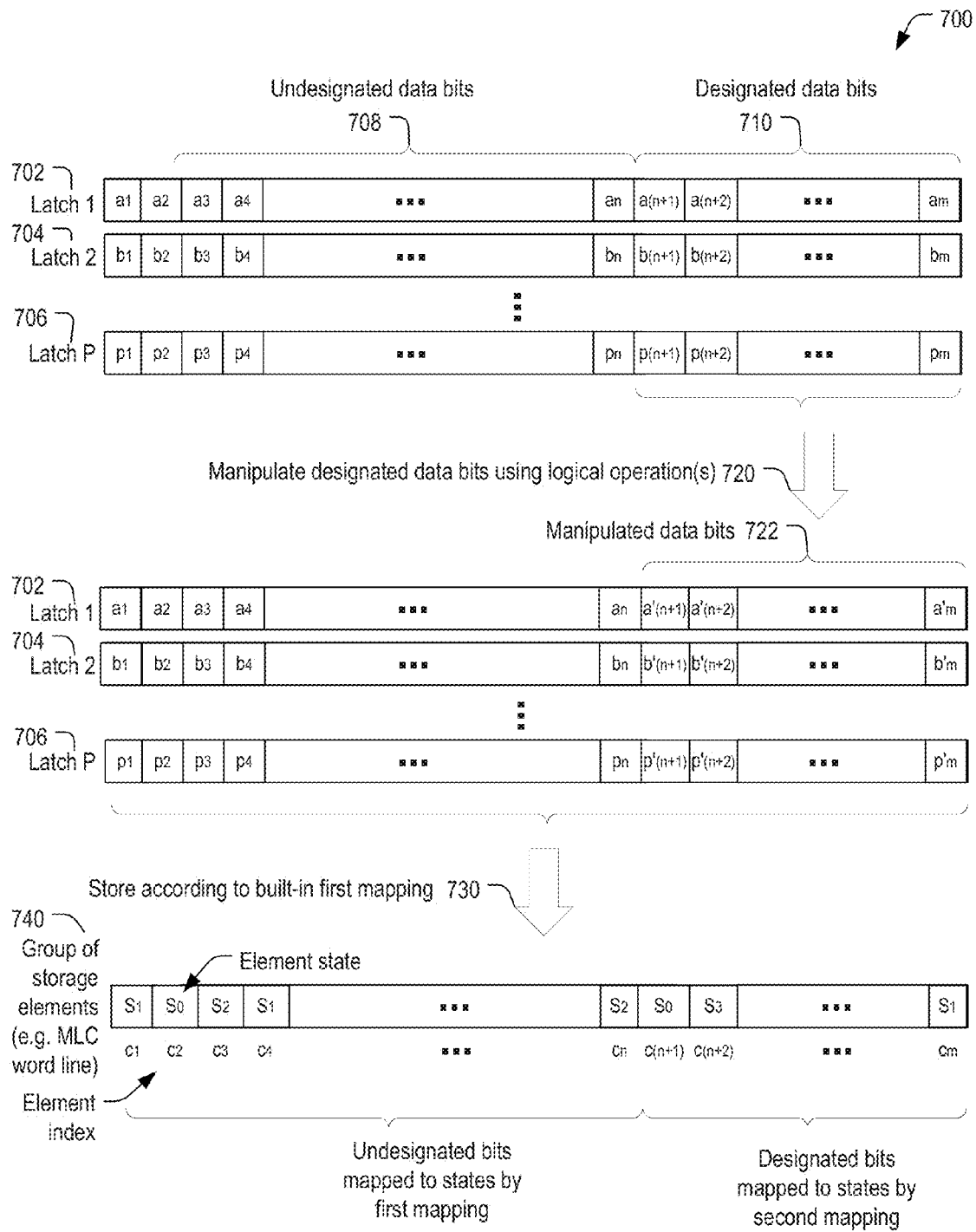
FIG. 7 is a diagrammatic illustration of manipulating bits to achieve a second mapping of bits to states using a storage device having a first built-in mapping of bits to states.

FIG. 7 depicts a particular embodiment 700 of manipulating bits to achieve a second mapping of bits to states using a storage device having a built-in first mapping 730 of bits to states. Data bits are loaded into a set of P latches in a memory, illustrated as including a first latch 702, a second latch 704, and a P-th latch 706. Each latch 702, 704, 706 stores m data

TABLE 4

| An example of multiple mappings per word line | | | | | | | | | | | | | | | |
|---|---|---|---|---|---|---|---|---|---|---|---|---|---|---|---|
| | Mapping for the first ⅔ of the cells | | | | | | | Mapping for the last ⅓ of the cells | | | | | | | |
| State | Er | A | B | C | D | E | F | G | Er | A | B | C | D | E | F | G |
| Upper Page | 1 | 1 | 0 | 0 | 1 | 1 | 0 | 0 | 1 | 1 | 1 | 1 | 0 | 0 | 0 | 0 |
| Middle Page | 1 | 0 | 0 | 0 | 0 | 1 | 1 | 1 | 1 | 0 | 0 | 1 | 1 | 1 | 0 | 0 |
| Lower Page | 1 | 1 | 1 | 0 | 0 | 0 | 0 | 1 | 1 | 1 | 0 | 0 | 0 | 1 | 1 | 0 |

When assigning bits to states according to Table 4, ⅔ of the cells (e.g. flash memory cells in a MLC word line) are programmed using the left-side mapping. According to the left-side mapping, if the lower and middle bits of these cells exhibit an error rate of 2*p then the upper bit exhibits an error probability of 3*p (i.e. the upper page less is reliable than the bits, labeled bits $a_1 \ldots a_m$ in the first latch 702, bits $b_1 \ldots b_m$ in the second latch 704, and bits $p_1 \ldots p_m$ in the P-th latch 706.

Designated data bits 710 are designated to be manipulated within the latches 702-706 and undesignated data bits 708 are not manipulated within the latches 702-706. The designated data bits 710 (bits indexed from n+1 to m) are manipulated in the latches 702-706 using one or more logical operations 720 to generate manipulated data bits 722 in the latches 702-706. Sets of the manipulated data bits 722 and the undesignated data bits 708 (bits indexed from 1 to n) are stored to respective storage elements of a group of storage elements 740 (e.g. a MLC word line) according to the built-in first mapping 730. Each storage element of the group 740 may be programmed to a state s0, s1, . . . , sM. For example, the states s0, s1, . . . , sM may correspond to the states Er, A, B, . . . G illustrated in Table 4.

The undesignated data bits 708 are mapped to states according to the first mapping, while the designated data bits 710 are mapped to states according to the second mapping. To illustrate, first bits a1, b1, . . . p1 are mapped to a state s1 of a first element c1 according to the first mapping. Second bits a2, b2, . . . p2 are mapped to a state s0 of a second element c2 according to the first mapping, and n-th bits an, bn, . . . pn are mapped to a state sn of an n-th element cn. The (n+1)-th through m-th bits are mapped to elements c(n+1) through cm according to the second mapping, by first manipulating the bits in the latches 702-706 and then applying the built-in first mapping 730.

By manipulating the designated bits 710 but not the undesignated bits 708 in the latches 702-706, two (or more) different mappings can be applied when storing data to the group of storage elements 740. By using multiple mappings, a lower reliability resulting from one mapping may be at least partially balanced by a higher reliability resulting from another mapping, such as described with respect to Table 4. In addition, application of both mappings may be implemented internal to a flash memory die instead of at a flash memory controller.

Figure 8:
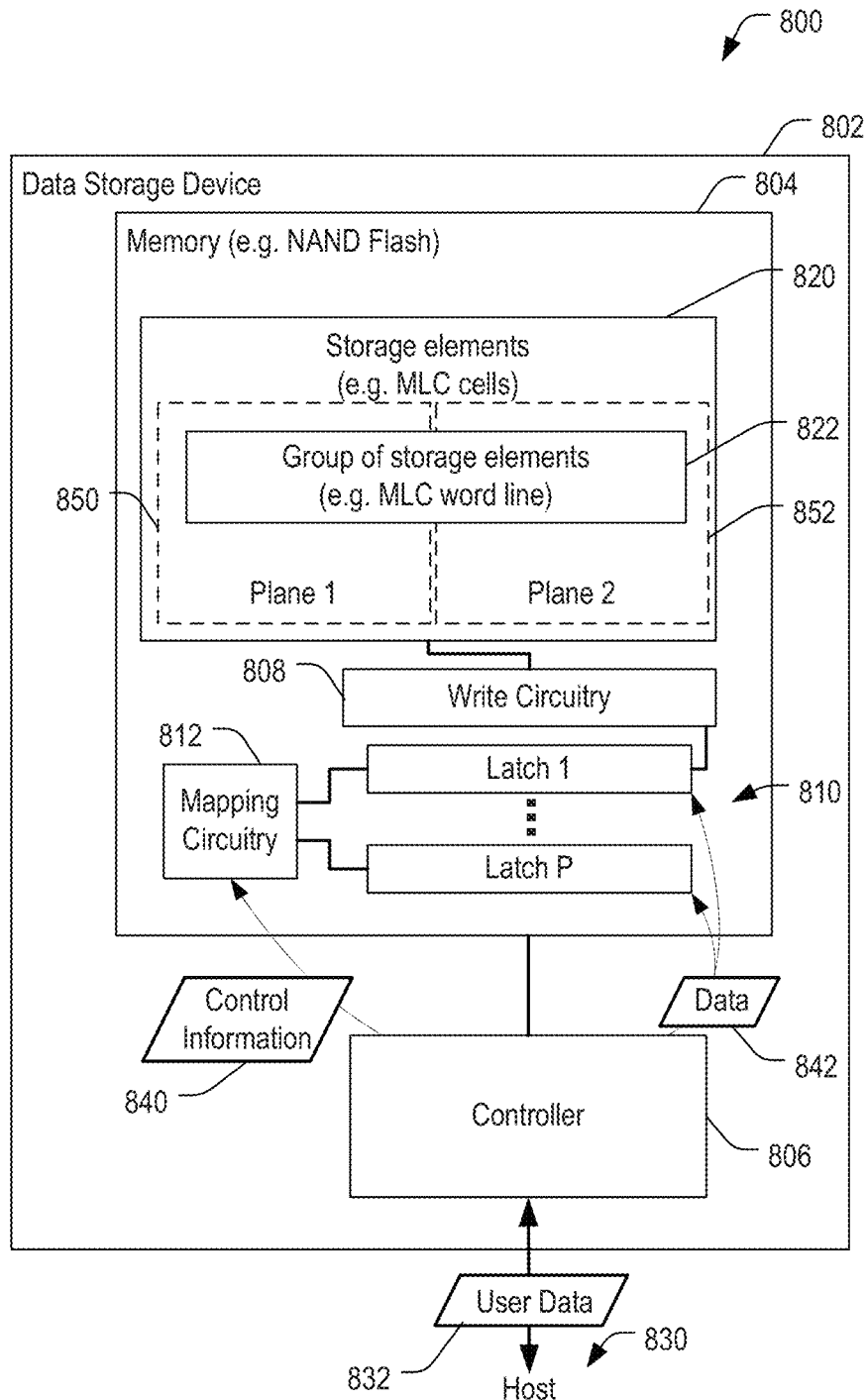
FIG. 8 is a block diagram of a particular embodiment of a system including a storage device to store data using multiple mappings of bits to states.

FIG. 8 depicts a particular embodiment of a system 800 that includes a data storage device 802 that can be operatively coupled to a host device 830. The data storage device 802 includes a memory 804, such as a NAND flash memory, coupled to a controller 806. The memory 804 includes storage elements 820, write circuitry 808, latches 810, and mapping circuitry 812. The mapping circuitry 812 enables the data storage device 802 to apply multiple mappings of bits within the latches 810 to states of storage elements in the memory 804.

The data storage device 802 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 802 may be embedded memory in the host device 830, such as eMMC® (trademark of JEDEC Solid State Technology Association, Arlington, Va.) and eSD, as illustrative examples.

The memory 804 includes the multiple storage elements 820, including a group 822 of the storage elements 820. For example, the storage elements 820 may include MLC cells. To illustrate, the memory 804 may include a multi-level cell (MLC) flash memory and the group 822 of the storage elements 820 may be a MLC word line.

The latches 810 are operative to latch data 842 to be stored at the group 822 of the storage elements 820, such as an MLC word line. The data 842 may be received at the latches 810 from the controller 806 and may correspond to codewords generated by the controller 806 in response to user data 832 that is received from the host device 830. Each latch of the latches 810 may store bits corresponding to a logical page of data to be stored at the group 822 of storage elements. For example, the latches 810 may correspond to the latches 702-706 of FIG. 7.

The mapping circuitry 812 is operative to generate manipulated data bits in the latches 810 by manipulating designated data bits in the latches 810 using one or more logical operations. For example, the mapping circuitry 812 may be responsive to control information 840 from the controller 806 to apply the logical operations 720 of FIG. 7 to the designated data bits 710. The mapping circuitry 812 may be configured to generate the manipulated data bits at the memory 804 after the data 842 has been received from the controller 806.

The write circuitry 808 may be operative to receive the data from the latches 810 and to store a first number of bits in each storage element of the group 822 of the storage elements 820 according to a first mapping of sequences of bits to states of the storage elements 820. The write circuitry 808 may be operative to store sets of the manipulated data bits to respective storage elements of the group 822 of the storage elements 820. The designated data bits correspond to states of the respective storage elements according to a second mapping of sequences of bits to states, where the second mapping is different than the first mapping.

The memory 804 may be configured to apply the first mapping as a built-in mapping. The second mapping may be created by loading the data 842 into the latches 810 and manipulating the designated data bits by logical register operations. The first mapping may be associated with a first error rate corresponding to a first logical page of an MLC word line. The second mapping may be associated with a second error rate corresponding to the first logical page of the MLC word line, where the second error rate is lower than the first error rate.

For example, the mapping circuitry 812 may be configured to perform a logical NOT operation to each data bit of a first group of data bits at a first latch of the latches 810. As another example, the mapping circuitry 812 may be configured to perform a bit-wise logical operation of a first group of data bits at the first latch and a second group of data bits at a second latch of the latches 810. To illustrate, the bit-wise logical operation can include an AND operation or an OR operation. As another illustration, the bit-wise logical operation can include a negated exclusive-OR (NOT-XOR) operation. As a further illustration, the bit-wise logical operation can include a swap operation. Examples of logical operations are described with respect to FIG. 9.

The memory 804 may be configurable to selectively apply the second mapping. For example, the control information 840 may indicate designated data bits to which the second mapping is to be applied. The designated data bits may be located at a second portion of each of the latches and undesignated data bits may be located at a first portion of each of the latches, such as the undesignated data bits 708 and the designated data bits 710 of FIG. 7. The mapping circuitry 812 may be configured to generate the manipulated data bits at the second portion of each of the latches 810 and to not manipulate the undesignated data bits at the first portion of each of the latches 810.

The second mapping may be applied to the designated data bits to be stored at a second portion of the group 822 of the storage elements 820 and the first mapping may be applied to the undesignated data bits to be stored at a first portion of the group 822 of the storage elements 820. For example, the first portion of the group 822 of the storage elements 820 and the second portion of the group 822 of the storage elements 820 may be in a single word line of an MLC flash memory. As another example, the memory 804 may include a first plane 850 and a second plane 852 of a multi-plane flash memory, and the first portion of the group 822 of the storage elements 820 may be at the first plane 850 and the second portion of the group 822 of the storage elements 820 may be at the second plane 852.

During operation, the data storage device 802 may receive the user data 832 from the host device 830. The data storage device 802 may encode the user data 832, such as at an ECC engine at the controller 806, to generate the data 842 (e.g. a codeword that encodes the user data 832). The controller 806 may transfer the data 842 to the memory 804, and the memory 804 may store the data 842 to the latches 810.

The controller 806 may also send the control information 840 to the memory 804. The mapping circuitry 812 may be responsive to the control information 840 to select designated data bits within the latches 810 for manipulation. The mapping circuitry 812 may manipulate the designated data bits within the latches 810 and the manipulated data bits (and un-manipulated data bits, if any) are written by the write circuitry 808 to the group 822 of the storage elements 820 according to the first mapping. After applying the first mapping to the undesignated data bits and applying the second mapping to the designated data bits, error rates associated with each logical page of the group 822 of the storage elements 820 (e.g. each logical page of a single word line) may be substantially equalized (i.e. each logical page of the group 822 of the storage elements 820 has an error rate that is substantially equal to an error rate of each of the other logical pages of the group 822 of the storage elements 820).

Figure 9:
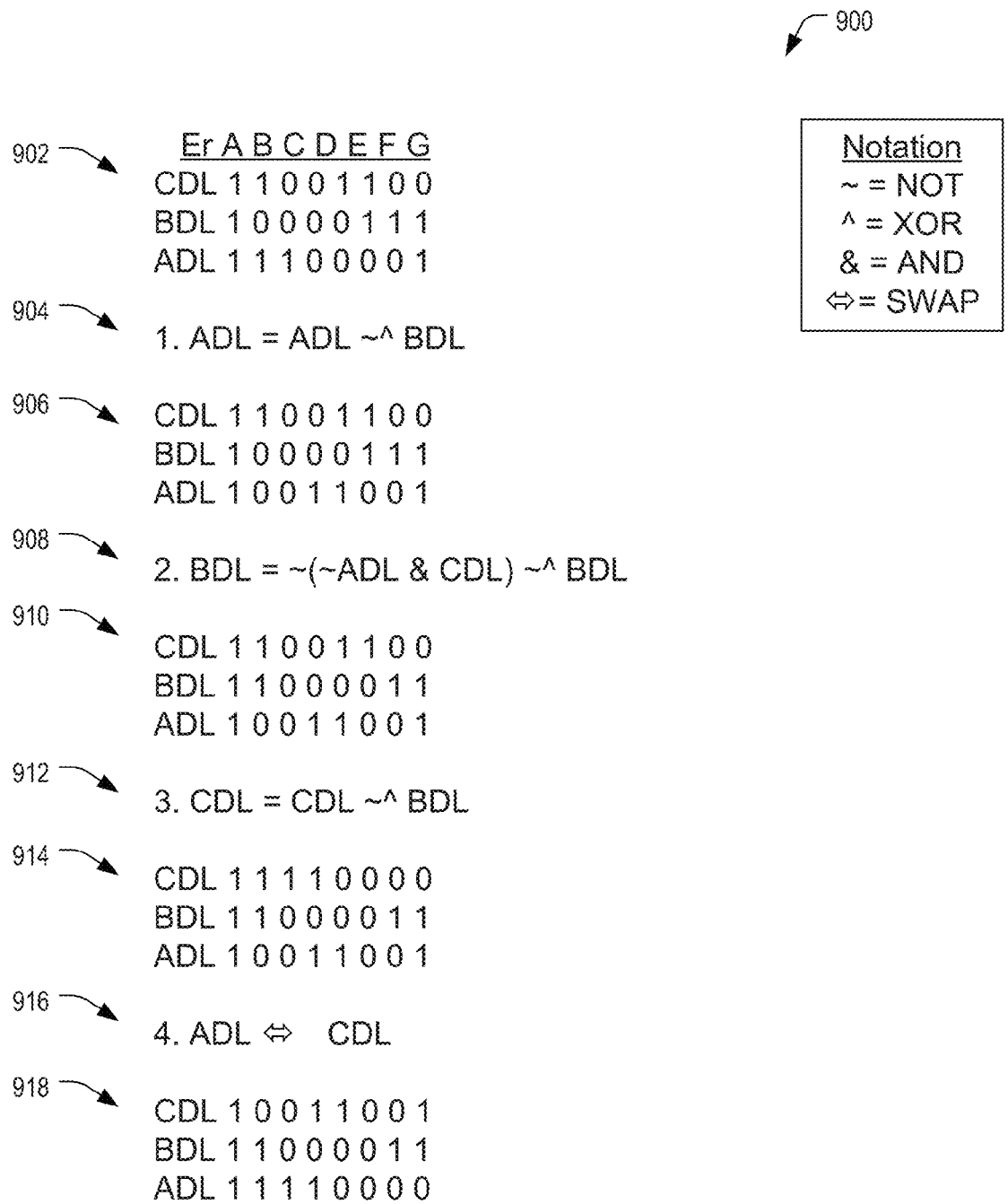
FIG. 9 is a diagram of a sequence of logical operations that may be applied to designated data bits by the storage device of FIG. 8.

FIG. 9 illustrates a sequence 900 of logical operations that may be applied to designated data bits by the mapping circuitry 812 of FIG. 8. The sequence of logical operations of FIG. 9 may be performed to convert between two Grey mappings, such as to convert a second Grey mapping to a built-in first Grey mapping that is applied when programming an MLC flash memory. An initial mapping 902 maps states (Er, A, B, C, D, E, F, and G) to data bits at first data latch (ADL), a second data latch (BDL) and a third data latch (CDL). The data latches ADL, BDL, and CDL may be internal latches in the flash memory, such as the latches 810 of FIG. 8.

A first operation 904 applies a NOT-XOR operation (~^) to ADL and BDL and stores the result to ADL, resulting in a mapping 906. A second operation 908 applies an AND operation (&), NOT operations (~), and a NOT-XOR operation to generate ~(~ADL & CDL)~^ BDL, and stores the result to BDL. A mapping 910 results from the second operation 908.

A third operation 912 applies a NOT-XOR operation to generate CDL~^ BDL and stores the result to CDL. A mapping 914 results from the third operation 912. A fourth operation 916 applies a swap operation ($\Leftrightarrow$) to ADL and CDL to generate a final mapping 918. The final mapping 918, resulting from applying the operations 904, 908, 912, and 916 to the initial data stored in the latches ADL, BDL, and CDL, may correspond to a built-in first mapping is applied to the contents of the latches ADL, BDL, and CDL.

The multi-operation method of FIG. 9 may correspond to the logical operation(s) 720 of FIG. 7. For example, the final mapping 918 may correspond to the built-in first mapping of bits to states 730, and the first mapping 902 may be the second mapping of bits to states to be applied to the designated data bits 710. By performing the logical operations 904, 908, 912, and 916 to the designated data bits 710 followed by the built-in first mapping 730, the designated data bits may be stored according to the second mapping.

For example, the second mapping (e.g. the mapping 902) may map the sequence of bits "101" to state A. Applying the logical operations 904, 908, 912, and 916 changes the sequence of bits "101" to the sequence of bits "011". The sequence of bits "011" may be stored as state "A" according to the built-in first mapping (e.g. the mapping 918). Therefore, the storage element c1 of FIG. 7 having the state s1 (e.g. state "A") could represent the bit sequence "011" according to the built-in first mapping, and the storage element cm of FIG. 7 having the same state s1 could represent the bit sequence "101" according to the second mapping. Application of the logical operations 904, 908, 912, and 916 to bits stored in designated portions of the latches 810 of FIG. 8 may be performed by the mapping circuitry 812.

Figure 10:
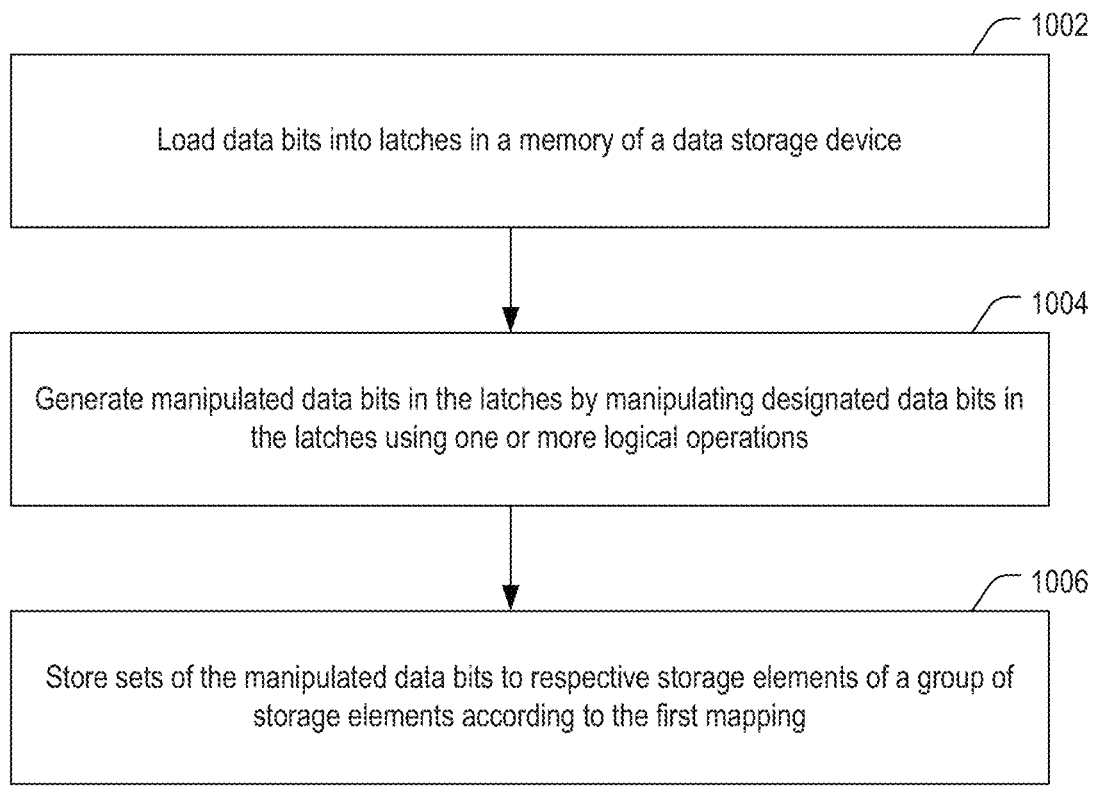
FIG. 10 is a flow diagram illustrating a particular embodiment of a method of writing data using multiple mappings of bits to states.

FIG. 10 depicts a flowchart that illustrates an embodiment of a method of writing data. The method may be performed in a data storage device with a controller and a memory, where the memory includes latches and multiple storage elements and where the memory is operative to store a first number of bits in each storage element according to a first mapping of sequences of bits to states of the storage elements. For example, the method may be performed in the data storage device 802 of FIG. 8.

Data bits are loaded into the latches within the memory of the data storage device, at 1002. Manipulated data bits are generated in the latches by manipulating designated data bits in the latches using one or more logical operations, at 1004. Sets of the manipulated data bits are stored to respective storage elements of the group of storage elements according to the first mapping, at 1006. The designated data bits correspond to states of the respective storage elements according to a second mapping of sequences of bits to states and the second mapping is different than the first mapping. For example, the designated data bits may include a portion of the data bits to be stored according to the second mapping, such as to equalize page reliabilities according to the example of Table 4 by applying the second mapping to ⅓ of the cells of the word line. In other embodiments, however, the designated data bits may be all of the data bits in order to effectively replace the first mapping with the second mapping.

The latches and the storage elements may be within a memory die that is configured to apply the first mapping as a built-in mapping, such as the memory 804 of FIG. 8. The second mapping may be created by loading the data bits into the latches and manipulating the data bits by performing logical register operations before storing the sets of the manipulated data bits. For example, the logical register operations may be the operations 904, 908, 912, and 916 of FIG. 9 to map designated data bits between Grey codes.

The memory die may include circuitry, such as the mapping circuitry 812 of FIG. 8, to perform a state transformation of the designated data bits stored by applying the one or more logical register operations to the designated data bits.

The memory may include a flash multi-level cell (MLC) memory, and the group of storage elements may be an MLC word line. The first mapping can be associated with a first error rate corresponding to a first logical page of the MLC word line, and the second mapping can be associated with a second error rate corresponding to the first logical page of the MLC word line. The second error rate may be lower than the first error rate.

For example, a first group of the data bits may be loaded into a first latch, and the designated data bits can be manipulated by performing a logical NOT operation to each data bit of the first group of data bits. As another example, a first group of the data bits may be loaded into a first latch and a second group of the data bits may be loaded into a second latch. Manipulating the designated data bits can include performing a bit-wise logical operation of the first group and the second group. For example, the bit-wise logical operation may include at least one of an AND operation and an OR operation or may include a negated exclusive-OR (NOT-XOR) operation. As another example, the bit-wise logical operation may include a swap operation.

The memory may be configurable to selectively apply the second mapping, such as in response to the control information 840 of FIG. 8. For example, the memory may be configurable to apply the second mapping to designated portions of the latches and not to undesignated portions of the latches, as illustrated in FIG. 7. A first portion of each of the latches may contain undesignated data bits and a second portion of each of the latches may contain the designated data bits. The manipulated data bits may be generated at the second portion of each of the latches to apply the second mapping to the designated data bits to be stored at a second portion of the group of storage elements while the first mapping is applied to the undesignated data bits to be stored at a first portion of the group of storage elements.

As another example, the memory may be configurable to select the second mapping from several available mappings that can be applied by manipulation of bits within the latches. To illustrate, the mapping circuitry 812 of FIG. 8 may be operable to support multiple mappings and may be responsive to the control information 840 to perform operations to achieve a particular mapping. For example, the controller 806 of FIG. 8 may select a particular mapping and may send the control information 840 to the mapping circuitry 812 indicating the selected mapping and designated bits to be manipulated to achieve the selected mapping. The control information 840 may specify an order of logical operations to be applied to the designated data bits, such as the operations 904, 908, 912, and 916 of FIG. 9. As yet another example, the memory may be configurable to not apply the second mapping so that all bits are mapped to states according to the first mapping.

In one embodiment, the first portion of the group of storage elements and the second portion of the group of storage elements may be in a single word line of a multi-level cell (MLC) flash memory. After applying the first mapping to the undesignated data bits and applying the second mapping to designated data bits, error rates associated with each logical page of the single word line may be substantially equalized. For example, the left-side mapping of Table 4 may be the first mapping that is applied to ⅔ of the storage elements of the word line (e.g. corresponding to the undesignated bits) and the right-side mapping of Table 4 may be the second mapping that is applied to ⅓ of the storage elements of the word line (e.g. corresponding to the designated bits) so that all pages have overall equal error rates. In another embodiment, the first portion of the group of storage elements is at a first plane of a multi-plane flash memory and the second portion of the group of storage elements is at a second plane of the multi-plane flash memory, such as the planes 850 and 852 of FIG. 8.

Matching Protection Level to Page Reliability

Another technique to accommodate unequal page reliabilities is to match a data protection level to the reliability of the page in which the data is stored. For example, different ECC redundancy may be allocated to different codewords or subcodes, according to the error rates of the page(s) in which the codewords or sub-codes are stored. An example of different allocation of redundancy per concatenated codeword is shown in FIG. 3. An example of different allocation of redundancy per sub-code is shown in FIG. 4.

The scheme shown in FIG. 4 may have a more complicated coding scheme due to asymmetry between sub-codes. To illustrate, sub-codes in the less reliable Upper page 410 have more parity than sub-codes in the more reliable pages 412, 414. The scheme shown in FIG. 3 uses codewords of different lengths, and a codeword may span over more than one page of the word line. For example, the first codeword 304 of FIG. 3 is longer than a single page (and hence spans over more than one page of the word line 302).

For an MLC flash memory with a large number of states per cell (e.g. M=4, 8, or 16), data may be first programmed into a cell (e.g. M=4, 8, or 16), data may be first programmed into a single-level cell (SLC) partition that serves as a "binary cache." The data stored in the SLC partition may be copied into a MLC partition using a background process. Initially storing data into a SLC partition and then copying the data to the MLC partition may provide several advantages:

1) Because MLC programming can be relatively slow, use of a binary cache can enable increased programming throughput and an improved user experience if the programming burst size is small enough and the binary cache is not filled.

2) Some flash memory protocols (e.g. Secure Digital (SD)) specify that the memory controller acknowledge that a previously sent data block is programmed into memory before a next data block is sent. The data blocks are typically smaller than the capacity of an MLC word line, which is usually large (e.g. 16 KB, 24 KB, or 32 KB). Hence, the data blocks may first be programmed into an SLC partition and after enough data is collected (e.g. enough data is stored in the SLC binary cache to fill an MLC block), the data stored in the SLC binary cache is copied into the MLC partition.

3) Programming of data into an MLC partition can be performed in large blocks that may contain many word lines (e.g. a 2 megabyte (MB) block composed of 64 word lines of size 32 KB per word line). Programming data to the MLC partition may be performed using a sequence of operations that may involve several nonconsecutive programming phases of each word line. Multiple nonconsecutive programming phases may cancel out certain cross-coupling effects and may induce narrow voltage distributions that enable the data storage device to maintain small error rates. Data may be first programmed into an SLC partition (e.g. a binary cache). Programming data into a SLC partition can be simpler than programming the data into an MLC partition and can be preformed one word line at a time. After programming the data into the SLC partition, the data may be copied into the MLC partition. The SLC partition can therefore function as a temporary storage of the data instead of using RAM for temporary storage of the data.

Several embodiments are disclosed to enable programming a long codeword (i.e. a codeword that is longer than an SLC page) into an SLC partition prior to copying the codeword from the SLC partition to an MLC partition.

One embodiment includes using a greater number of SLC pages to store data for a single MLC word line than the number of logical pages that are in the MLC word line. A long codeword may be programmed into the SLC pages such that a relative location of data within the SLC pages is the same as the relative location of the data within the pages of the MLC word line(s) into which the data will be copied. Programming the codeword into the same relative locations in the SLC pages as intended for the MLC pages enables internal copying from the SLC partition into the MLC partition using internal flash memory latches. Simple operations can be performed at the latches to combine data in a greater number of SLC pages into a fewer number of MLC pages. An example of such a programming procedure is illustrated in FIG. 11 for the MLC word line shown in FIG. 3.

Figure 11:
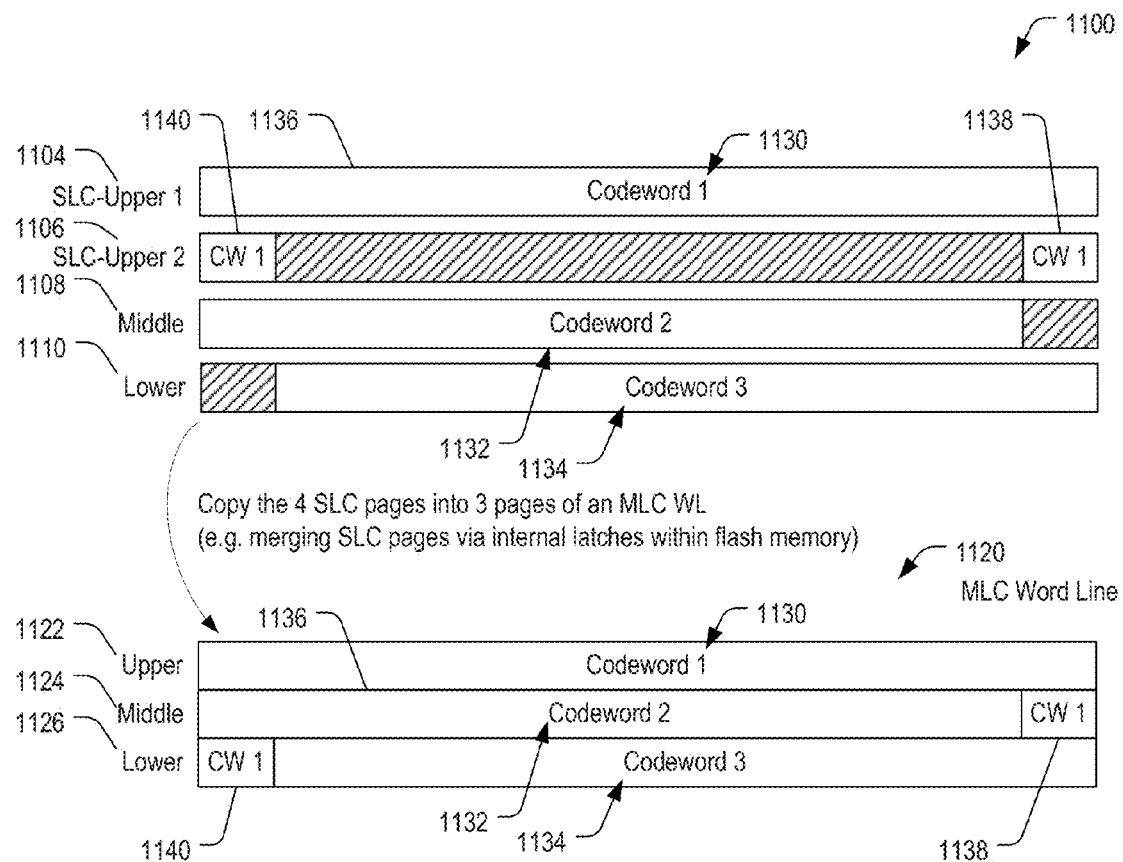
FIG. 11 is a diagram of a particular embodiment of storing codewords at an SLC portion of a flash memory and transferring the codewords to an MLC word line.

FIG. 11 depicts a particular embodiment 1100 of storing a first codeword (codeword 1) 1130, a second codeword (codeword 2) 1132, and a third codeword (codeword 3) 1134 at an SLC portion of a flash memory and transferring the codewords 1130-1134 to an MLC word line 1120. The first codeword 1130 has a length that exceeds a size of the pages in the SLC portion. A first SLC page (SLC Upper-1) 1104 stores a portion 1136 of the first codeword 1130 that is to be stored within an upper page 1122 of the MLC word line 1120. A second SLC page (SLC Upper-2) 1106 stores a second portion 1138 of the first codeword 1130 that is to be stored within a middle page 1124 of the MLC word line 1120. The second SLC page 1106 also stores a third portion 1140 of the first codeword 1130 that is to be stored in a lower page 1126 of the MLC word line 1120. A third SLC page 1108 stores the second codeword 1132 and a fourth SLC page 1110 stores the third codeword 1134.

The first portion 1136 of the first codeword 1130 has a length substantially equal to a SLC page size and substantially fills the first SLC page 1104. The second portion 1138 of the first codeword 1130 in the second SLC page 1106 occupies a page position (e.g. occupies last cells of the SLC page 1106 relative to a word line) that is not occupied by the second codeword 1132 in the third SLC page 1108. As a result, the second codeword 1132 and the second portion 1138 of the first codeword 1130 can be written together into a single latch without shifting bits to higher or lower bit positions. For example, the single latch may be one of the latches 810 of FIG. 8. Similarly, the third portion 1140 of the first codeword 1130 in the second SLC page 1106 occupies a page position (e.g. occupies first cells of the SLC page 1106 relative to the word line) that is not occupied by the third codeword 1134 in the fourth SLC page 1110. As a result, the third codeword 1134 and the third portion 1140 of the first codeword 1130 can be written together into a single latch without performing a bit shift.

Each SLC page 1104, 1106, 1108, 1110 may be copied into a respective internal flash memory latch. After loading the SLC pages into the latches, the first portion 1136 of the first codeword 1130 can remain in a first latch, the second portion 1138 of the first codeword 1130 can be combined with the second codeword 1132 into a second latch, and the third portion 1140 of the first codeword 1130 can be combined with the third codeword 1134 into a third latch. The bit values of the first, second, and third latches may be mapped to states of the MLC word line 1120 to program the upper page 1122, the middle page 1124, and the lower page 1126 to the MLC word line 1120.

FIG. 11 therefore illustrates an example of copying the stored content from a first number of SLC physical pages (e.g. the four SLC pages 1104-1110) to a second number of logical pages at a single MLC physical page (e.g. the three logical pages 1122-1126), where the second number is less than the first number. When using a binary cache in a multi-level cell (MLC) flash memory of B bits per cell, where B is a positive number (e.g. 3 bits per cell as shown in FIG. 11), at least one data page may be split into more than one single level cell (SLC) page, using more than B SLC pages for caching data of a single wordline of the MLC flash memory. To illustrate, four SLC pages 1104-1110 may cache data of the single MLC wordline 1120. A data storage device may receive data pages to be stored in the data storage device and may generate codewords corresponding to the received data pages, such as the codewords 1130, 1132, and 1134. The codewords may be stored to physical pages (e.g. SLC pages 1104-1110) of a first memory portion of the data storage device, such as a SLC portion or binary cache. A first portion of a particular codeword that corresponds to a particular data page, such as the first portion 1136 of the first codeword 1130, may be stored at the first physical page 1104. A second portion of the particular codeword, such as the second portion 1138 of the first codeword 1130, may be stored at the second physical page 1106. The codewords 1130, 1132, and 1134 may be copied from the physical pages 1104-1110 to a physical page of a second memory portion of the data storage device, such as the MLC word line 1120 in an MLC portion of memory.

As shown in FIG. 11, four SLC pages 1104, 1106, 1108, 1110 can be used in a binary cache in order to store only three pages 1122, 1124, 1126 of data in the MLC word line 1120. As a result, a relatively larger binary cache may be used as compared to using a same number of SLC pages per page of the MLC word line 1120. Using more SLC pages may induce higher wearing of the binary cache because more SLC pages are programmed for each MLC word line. However, the SLC-Upper 2 page 1106 may store only "spillover" redundancy of the first codeword 1130 that does not fit into the SLC-Upper 1 page 1104. As illustrated, when the spillover redundancy occupies a small portion of the SLC-Upper 2 page 1106, most cells of the SLC-Upper 2 page 1106 can remain erased. As a result, wearing due to repeated program/erase cycles can be reduced as compared to programming all of the cells of the SLC-Upper 2 page 1106. Controlling a binary cache so that each SLC page 1104, 1106, 1108, 1110 has a one-in-four probability to be programmed with the first portion 1136 of the first codeword 1130, with the second and third portions 1138, 1140 of the first codeword 1130, with the second codeword 1132, or with the third codeword 1134 can reduce an impact on wearing and endurance of the SLC partition.

An amount of time to program data into four pages of the binary cache may exceed an amount of time to program the data to three SLC pages. However, any increased programming time may be "hidden" by designing an appropriate pipeline operation for writing data. After programming the SLC-Upper 1 page 1104, and before programming the SLC-Upper 2 page 1106 with the "spillover" redundancy, a memory controller may inform a host sending the data that the upper page data is securely stored in flash memory, such that the host may deliver the data of the next page. Then, while the host is transferring the data of the next page and data of the next page is being encoded, the "spillover" redundancy of the upper page (e.g. the second and third portions 1138-1140) can be programmed into a next SLC page (e.g. the SLC-Upper 2 page 1106).

In case a power-down event occurs before the data of the SLC-Upper 2 page 1106 is programmed to the binary cache, a controller can recover the data of the first codeword 1130 because the second portion 1138 and the third portion 1140 of the first codeword 1130 may contain only "spillover" redundancy. This spillover redundancy is not required for correcting an error rate expected from SLC physical pages. For example, an SLC bit error rate may be much smaller than the bit error rate of the MLC-Upper page 1122 page. As a result, a data storage device may legitimately inform a host that upper page data is secured after the programming of only the SLC-Upper 1 page 1104 because redundant information that is encoded with a data word in the SLC-Upper 1 page 1104 is sufficient to enable recovery of the upper page data. An example is described in further detail with respect to FIG. 12.

A second embodiment to enable programming a long codeword to an SLC partition prior to copying the long codeword to an MLC partition includes programming only a portion of a codeword that fits into a single SLC page without programming a spillover portion of the codeword to a second SLC page. As a result, a "punctured" codeword is stored to the SLC partition without storing some of the codeword's bits to the SLC partition. Before copying the data from the SLC partition to the MLC partition (i.e. when all data to be written to the MLC partition is available at the SLC partition), the punctured codeword can be read from the SLC partition and decoded. Decoding the punctured codeword can correct errors that may be introduced in the SLC partition and can reconstruct the missing punctured part of the codeword. After decoding the punctured codeword to correct errors and to reconstruct the full codeword, the full codeword can be programmed to an appropriate location within logical pages of an MLC word line. A coding scheme can be designed to ensure a high probability of a successful decoding of the punctured codeword stored in the SLC partition because pages in the SLC partition may exhibit a much lower error rate as compared to pages of the MLC partition. The punctured part of the codeword may be only required for decoding the data when the data is stored in MLC pages, but the punctured part may be omitted when the data is stored on an SLC page. An example is described in further detail with respect to FIG. 13.

Copying data from a punctured codeword of an SLC partition into an MLC partition may therefore include controller actions, since a punctured codeword can be read from an SLC page and provided to the controller, and the controller can decode the punctured codeword to reconstruct the punctured part of the codeword. Transferring data to the controller and decoding the transferred data may contribute to a latency in storing the data to an MLC partition.

Controller involvement may be avoided when copying data from an SLC partition of a flash memory to an MLC partition of the flash memory by generating part of the codeword inside the flash memory via an encoding procedure instead of reconstructing the punctured part at the controller. The encoding procedure may include relatively non-complex logical operations in embodiments where complex logic may not be efficiently implemented within the flash memory. An example of a relatively simple encoding is a repetition code where a part of the codeword may be generated by repeating some of the codeword bits (e.g. the generated part can be a copy of a certain section of the codeword). An example is described in further detail with respect to FIG. 14.

Controller involvement in an SLC-to-MLC copying procedure may also be reduced by storing spillover sections of codewords in a RAM until the spillover sections are copied to an MLC partition. A spillover section of the codeword may be small and therefore may not require a large RAM size. In case of power down, spillover sections stored in the RAM may be lost. After power is restored, lost spillover sections of codewords may be reconstructed by reading punctured codewords from an SLC partition and decoding the punctured codewords.

A third embodiment to enable programming a long codeword to an SLC partition prior to copying the long codeword to an MLC partition may include programming data into the SLC partition using a different ECC code than is used for the MLC partition. The ECC code for the SLC partition may generate a codeword that fits into an SLC page (i.e. the codeword for a data page stored in the SLC partition has less parity than the codeword for the same data page stored in the MLC partition). To copy the data from the SLC partition into the MLC partition, the relevant SLC pages are read into the controller, data is decoded using the SLC ECC, data is encoded using the MLC ECC, and the MLC codewords are combined and programmed into the MLC word line. An example is described in further detail with respect to FIG. 15.

MLC programming may include several non-sequential programming phases of each word line of the MLC that is being programmed As a result, a RAM used by a memory controller may not have enough room to store all of the data required for completing the MLC programming (which may involve storing data to be written into many word lines). In one example, MLC programming with reduced use of RAM may be performed by repeating a "read SLC-decode SLC-encode MLC-program MLC" sequence several times (i.e. perform the sequence one time for each programming phase of the MLC word line). In another example, MLC programming with reduced use of RAM may be performed by reading SLC pages, decoding data read from the SLC pages according to an SLC ECC scheme, encoding the decoded data using an MLC ECC scheme, and programming the MLC codewords back to SLC, such that the data is encoded in the SLC pages in the MLC format.

Figure 12:
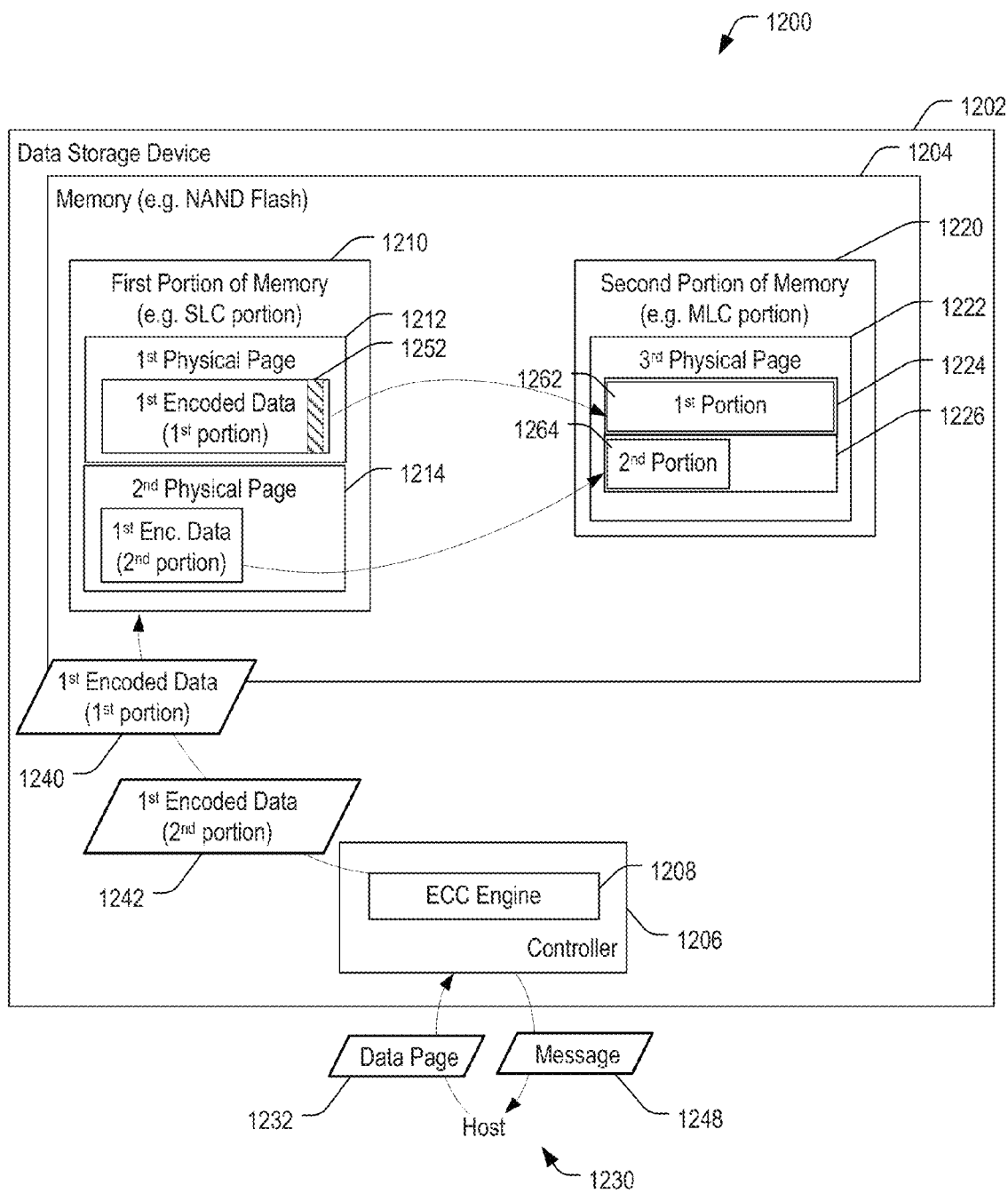
FIG. 12 is a block diagram of a particular embodiment of a system including a data storage device configured to write data by programming a long codeword into multiple physical pages.

FIG. 12 depicts a particular embodiment of a system 1200 including a data storage device 1202 configured to write data by programming a long codeword into multiple physical pages. The system 1200 includes the data storage device 1202 that can be operatively coupled to a host device 1230. The data storage device 1202 includes a memory 1204 coupled to a controller 1206. The memory 1204 includes a first portion 1210 that includes a first physical page 1212 and a second physical page 1214. The memory 1204 also includes a second portion 1220 having a third physical page 1222. The data storage device 1202 is configured to program a long codeword to multiple physical pages of the first portion 1210 and to later copy the stored data to the second portion 1220.

The data storage device 1202 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 1202 may be embedded memory in the host device 1230, such as eMMC® (trademark of JEDEC Solid State Technology Association, Arlington, Va.) and eSD, as illustrative examples.

The host device 1230 may be configured to provide data such as a data page 1232 to be stored at the data storage device 1202 or to request data to be read from the data storage device 1202. For example, the host device 1230 may include a mobile telephone, a music or video player, a gaming console, an electronic book reader, a personal digital assistant (PDA), a computer such as a laptop computer or notebook computer, any other electronic device, or any combination thereof. The host device 1230 may communicate with the data storage device 1202 in accordance with one or more protocols that specify that after the host device 1230 sends data to the data storage device 1202, the host device 1230 refrains from sending next data to the data storage device 1202 until the host device 1230 receives an acknowledgement that the prior data has been stored at the memory 1204.

The memory 1204 may include a flash memory having an SLC portion or partition (e.g. the first portion 1210) and an MLC portion or partition (e.g. the second portion 1220). The first physical page 1212 and the second physical page 1214 may each include storage elements such as SLC cells that store a single bit per SLC cell. The third physical page 1222 may include storage elements such as MLC cells that store multiple bits per cell. Each MLC cell can include bit values corresponding to multiple logical pages, such as a first logical page 1224 and a second logical page 1226 within the third physical page 1222.

The controller 1206 is configured to receive the data page 1232 from the host device 1230 while the data storage device 1202 is operatively coupled to the host device 1230. The controller 1206 is configured to initiate an encode operation to encode the data page 1232. The encode operation generates first encoded data that has a first portion 1240 and a second portion 1242.

The data storage device 1202 is configured to store the first portion 1240 of the first encoded data to the first physical page 1212. After storing the first portion 1240 to the first physical page 1212, the data storage device 1202 initiates storage of the second portion 1242 of the first encoded data to the second physical page 1214. For example, the first portion 1240 of the first encoded data may correspond to the first portion 1136 of the first codeword 1130 of FIG. 11, and the second portion 1242 of the first encoded data may correspond to the second and third portions 1138, 1140 of the first codeword 1130.

After storing the first encoded data to the first portion 1210, the data storage device 1202 is configured to copy a representation 1262 of the first portion 1240 of the first encoded data from the first physical page 1212 to the first logical page 1224 within the third physical page 1222. The data storage device 1202 is further configured to copy a representation 1264 from the second physical page 1214 to the second logical page 1226 within the third physical page 1222. For example, data to be copied to the second portion 1220 of the memory 1204 may be written from the first portion 1210 of the memory 1204 to a set of latches internal to the memory 1204, such as the latches 810 of FIG. 8. Data stored at the latches may be written to the third physical page 1222 according to one or more mappings of bits to states, as described with respect to FIGS. 8-10. The representations 1262, 1264 may differ from the portions of the first encoded data 1240, 1242, respectively, as a result of one or more bit errors that may occur in the first portion 1210 of the memory 1204, such as a representative bit error 1252.

The controller 1206 may be configured to send a message 1248 to the host device 1230 indicating that the data page 1232 has been successfully stored at the data storage device 1202 after storing the first portion 1240 to the first physical page 1212 but prior to storing the second portion 1242 to the second physical page 1214. For example, the controller 1206 may be configured to send the message 1248 to the host device 1230 in response to storing the first portion 1240 of the first encoded data. The memory 1204 may store the first portion 1240 of the first encoded data and the second portion 1242 of the first encoded data in a pipelined manner, sending the message 1248 in response to writing the first physical page 1212 in a first pipeline stage but prior to writing the second physical page 1214 in a subsequent pipeline stage. In systems that require an acknowledgement of successful data storage prior to sending more data, sending the message 1248 after storing the first portion 1240 enables the data storage device 1202 to maintain a storage data throughput rate as if each encoded data word were stored to a single page of the first portion 1210 of the memory 1204.

During operation, the data storage device 1202 may receive the data page 1232 from the host device 1230. The controller 1206 may provide the data page 1232 to an input of the ECC engine 1208 to generate first encoded data. The controller 1206 may send the first portion 1240 of the first encoded data to be written to the first physical page 1212. After writing the first portion 1240 of the first encoded data to the first physical page 1212, the controller 1206 may send the message 1248 to the host device 1230 and initiate storage of the second portion 1242 of the first encoded data to the second physical page 1214.

A power-off event may potentially occur after the first portion 1240 of the first encoded data is written to the first physical page 1212 but before completion of writing the second portion 1242 of the first encoded data to the second physical page 1214. In response to resumption of power after such a power-off event, the controller 1206 may recover the original data page 1232 by reading the representation 1262 of the first portion 1240 of the first encoded data from the first physical page 1212 and decoding the representation 1262 of the first portion 1240 at the ECC engine 1208. To illustrate, the first portion 1240 of the first encoded data can include sufficient redundant information to enable recovery of the data page 1232 at a lower expected error rate at the first physical page 1212 as compared to a relatively higher expected error rate at the third physical page 1222. The controller 1206 can decode the retrieved first portion 1240 to recover the data page 1232 when the number of missing bits (of the second portion 1242 of the first encoded data) and the number of bit errors occurring in the first portion 1240 of the first encoded data together do not exceed an error correction capability of the ECC coding scheme.

Figure 13:
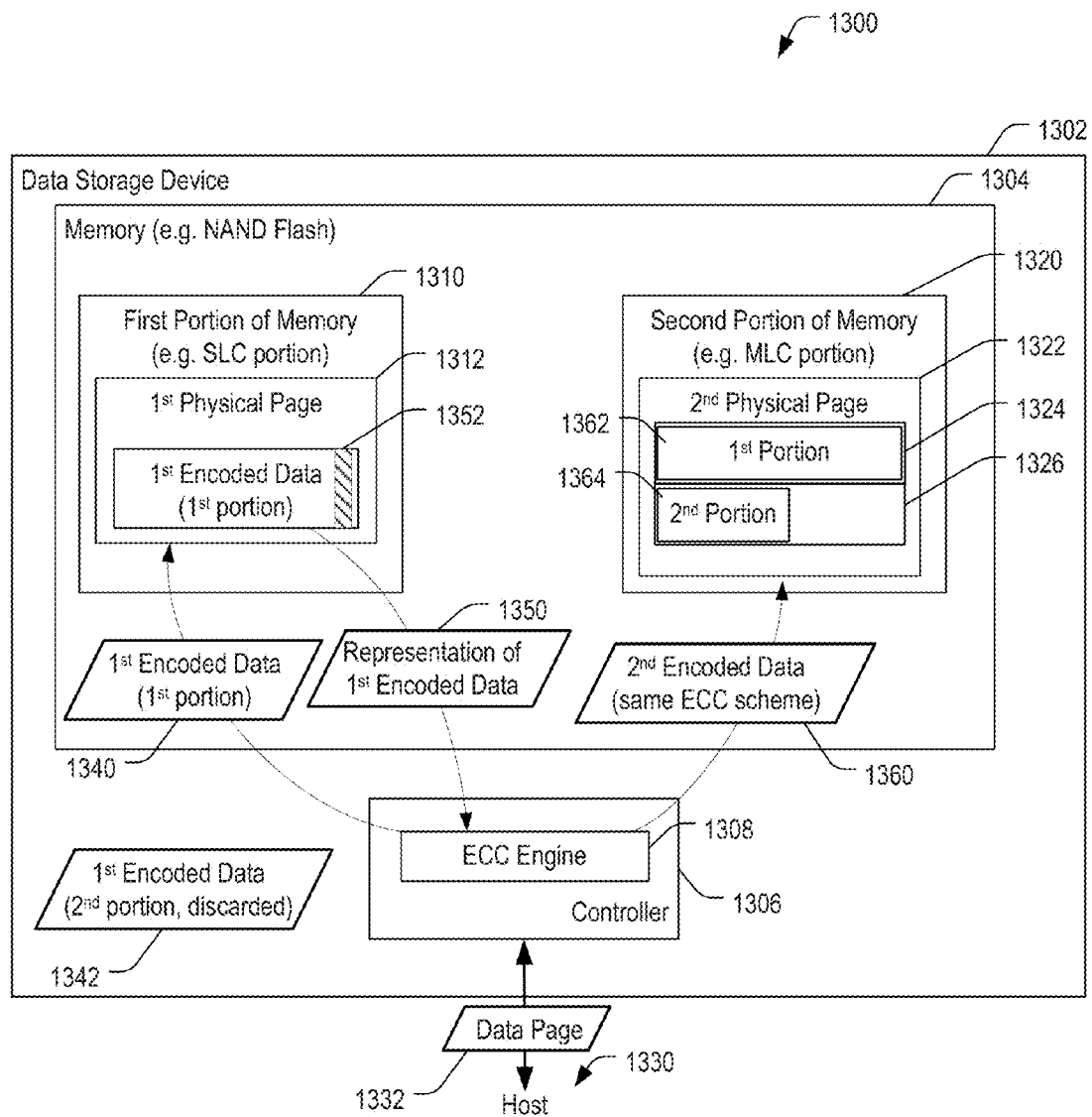
FIG. 13 is a block diagram of a particular embodiment of a system to store data in a first portion of a memory using a punctured codeword before copying the stored data to a second portion of the memory.

FIG. 13 depicts an embodiment of a system 1300 to store data in a first portion 1310 of a memory 1304 using a punctured codeword before copying the stored data to a second portion 1320 of the memory 1304. The system 1300 includes a data storage device 1302 that is configured to be operatively coupled to a host device 1330. For example, the host device 1330 may correspond to the host device 1230 of FIG. 12.

The data storage device 1302 includes a controller 1306 with an ECC engine 1308 and also includes the memory 1304 (e.g. a NAND flash memory). The first portion 1310 of the memory 1304 (e.g. an SLC portion that functions as a binary cache) includes a first physical page 1312 and the second portion 1320 of the memory 1304 (e.g. an MLC portion) includes a second physical page 1322. The second physical page 1322 includes a first logical page 1324 and also includes a second logical page 1326 that has a higher reliability than the first logical page 1324.

The controller 1306 is configured to initiate a first encoding operation to encode a data page 1332 received from the host device 1330. For example, when the controller 1306 determines that the data page 1332 is to be stored at the first logical page 1362, the controller 1306 configures the ECC engine 1308 to encode the data page 1332 to generate first encoded data (e.g. a long codeword) that has sufficient redundancy to accommodate a relatively lower reliability of the first logical page 1324. Otherwise, when the controller 1306 determines that a data page is to be stored at a higher-reliability page (e.g. the second logical page 1326), the controller 1306 may configure the ECC engine 1308 to generate a shorter codeword having fewer redundancy bits. For example, the long codeword may be the first codeword 1130 of FIG. 11 and the shorter codeword may be the second codeword 1132 of FIG. 11.

The first encoded data (i.e. the long codeword) may exceed a length of the first logical page 1362 and may also exceed a length of the first physical page 1312 (i.e. the first encoded data would span over more than one page of the first portion 1310 of the memory 1304). The first encoded data may also include more redundancy bits than necessary to correct for an expected error rate of the first physical page 1312. The controller 1306 may puncture the first encoded data and write a first portion 1340 of the first encoded data to the first physical page 1312 while discarding a second portion 1342 of the first encoded data. For example, the first portion 1340 of the first encoded data may include user data and parity bits, and the second portion 1342 of the first encoded data may not include user data and may instead include "spillover" parity bits.

The controller 1306 is configured to regenerate the first encoded data from the first portion 1310 of the memory 1304 by reading a representation 1350 of the first encoded data from the first physical page 1312. The representation 1350 is decoded at the ECC engine 1308 to correct errors that may have occurred at the first physical page 1312, such as a representative bit error 1352. The controller 1306 is configured to initiate a second encode operation at the ECC engine 1308 to encode the recovered data page. The second encode operation generates second encoded data 1360.

The second encoded data 1360 is generated using a same ECC scheme as the first encoded data (i.e. the first portion 1340 and the second portion 1342) and has a first portion 1362 that substantially fills the first logical page 1324 and a second portion 1364 that fills at least part of the second logical page 1326. Hence, the second encoded data 1360 spans over more pages (i.e. the first logical page 1324 and a portion of the second logical page 1326) than the first portion 1340 of the first encoded data that spans over the single physical page 1312.

In contrast to the system of FIG. 12, data may be temporarily stored at the first portion 1310 of the memory 1304 without requiring multiple pages of the first portion 1310 to store long codewords. Instead, long codewords that exceed a page length are punctured for storage in the first portion 1310 of the memory 1304, and the punctured bits are re-generated for later storage at the second physical page 1322.

Figure 14:
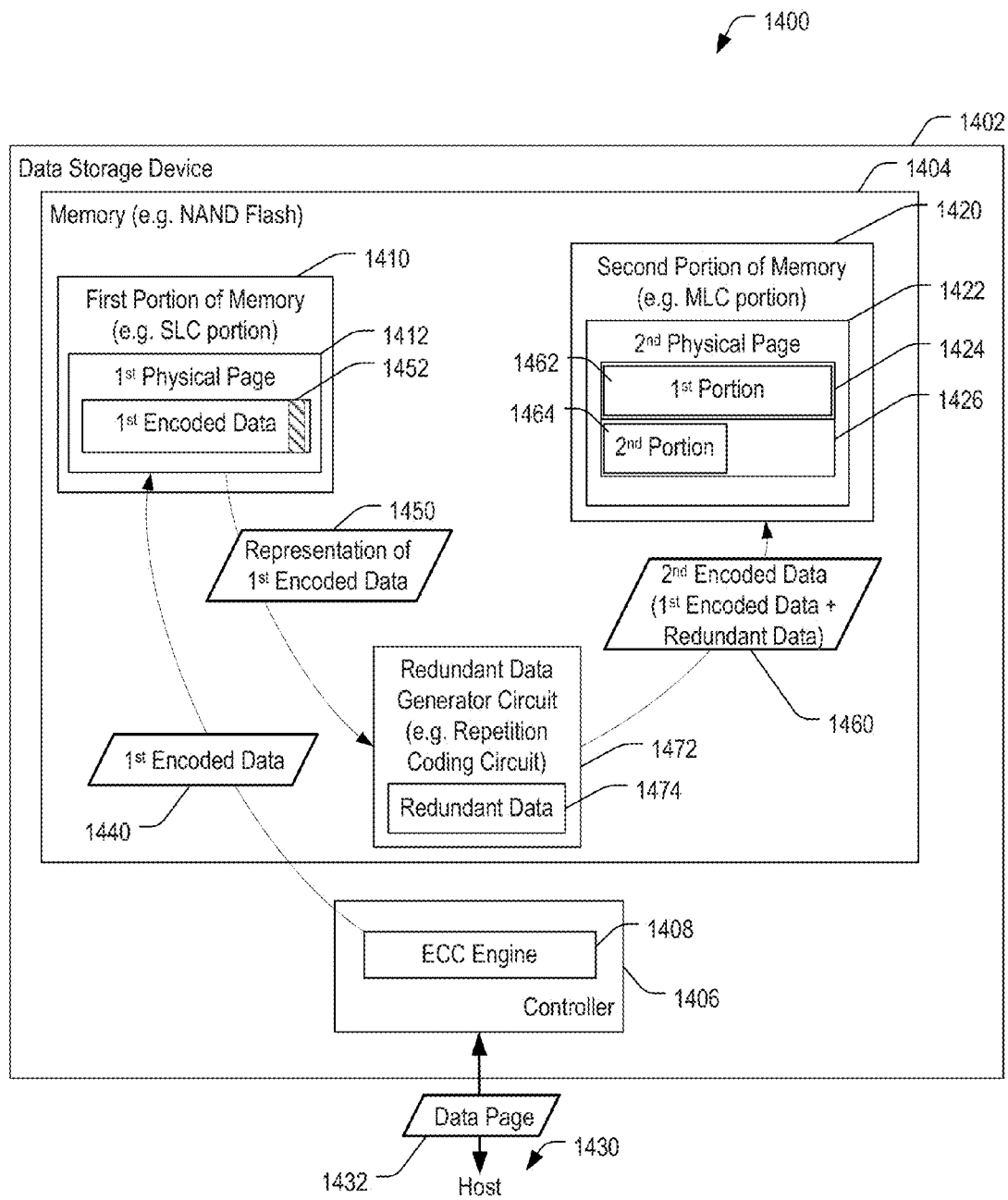
FIG. 14 is a block diagram of a particular embodiment of a system to store data in a first portion of a memory and generating additional redundancy data at the memory prior to storing the data to a second portion of the memory.

FIG. 14 depicts an embodiment of a system 1400 to store data in a first portion 1410 of a memory 1404 and to generate additional redundancy data at the memory 1404 prior to storing the data to a second portion 1420 of the memory 1404. The system 1400 includes a data storage device 1402 that is configured to be operatively coupled to a host device 1430. For example, the host device 1430 may correspond to the host device 1230 of FIG. 12.

The data storage device 1402 includes a controller 1406 with an ECC engine 1408 and also includes the memory 1404 (e.g. a NAND flash memory). The first portion 1410 of the memory 1404 (e.g. an SLC portion that functions as a binary cache) includes a first physical page 1412 and the second portion 1420 of the memory 1404 (e.g. an MLC portion) includes a second physical page 1422. The second physical page 1422 includes a first logical page 1424 and also includes a second logical page 1426 that has a higher reliability than the first logical page 1424.

The controller 1406 is configured to initiate an encode operation to encode a data page 1432 received from the host device 1430. The encode operation generates first encoded data 1440 and stores the first encoded data 1440 to the first physical page 1412. The first encoded data 1440 has a size that does not exceed a size of the first physical page 1412. In other embodiments, the first encoded data 1440 may have a size that exceeds the size of the first physical page and the controller 1406 may puncture the first encoded data 1440 to fit within a single page in a manner similar to the controller 1306 of FIG. 13.

The memory 1404 includes a redundant data generator circuit 1472 that is configured to receive a representation 1450 of the first encoded data 1440 (the representation 1450 may include one or more errors, such as a representative bit error 1452) and to generate redundant data 1474. For example, the redundant data generator circuit 1472 may include a repetition coding circuit that is configured to generate the redundant data 1474 by copying at least part of the representation 1450 of the first encoded data 1440. Alternatively, or in addition, the redundant data generator circuit 1472 may be configured to implement one or more complex encoding techniques (as compared to repetition coding) to generate the redundant data 1474. The redundant data 1474 is added, concatenated, or otherwise combined with the representation 1450 to generate second encoded data 1460 that is stored to the second physical page 1422.

The second encoded data 1460 has a first portion 1462 that substantially fills the first logical page 1424 and a second portion 1464 that fills at least part of the second logical page 1426. Hence, the second encoded data 1460 spans over more pages (i.e. the first logical page 1424 and a portion of the second logical page 1426) than the first encoded data 1440 that spans over the single first physical page 1412.

In contrast to the system of FIG. 12, the system 1400 uses a single physical page (i.e. the first physical page 1412) to cache the first encoded data 1440. For example, the ECC engine 1408 may encode the received data page 1432 to have a codeword length that does not exceed a page size of the first physical page 1412. Alternatively, the ECC engine 1408 may encode the received data page 1432 to have a codeword length that exceeds a page size of the first physical page 1412 (i.e. a long codeword) and may puncture the codeword so that only a first portion is stored at the first physical page 1412 while a punctured portion is discarded in a manner similar to the system of FIG. 13.

However, in contrast to the system of FIG. 13, copying of information from the first portion 1410 of the memory 1404 (e.g. an SLC binary cache) to the second portion 1420 of the memory 1404 (e.g. an MLC partition) is performed entirely within the memory 1404 without involvement of the controller 1406. As a result, a latency that would result from data transfer from the memory 1404 to the controller 1406 and from the controller 1406 back to the memory 1404 is avoided.

Figure 15:
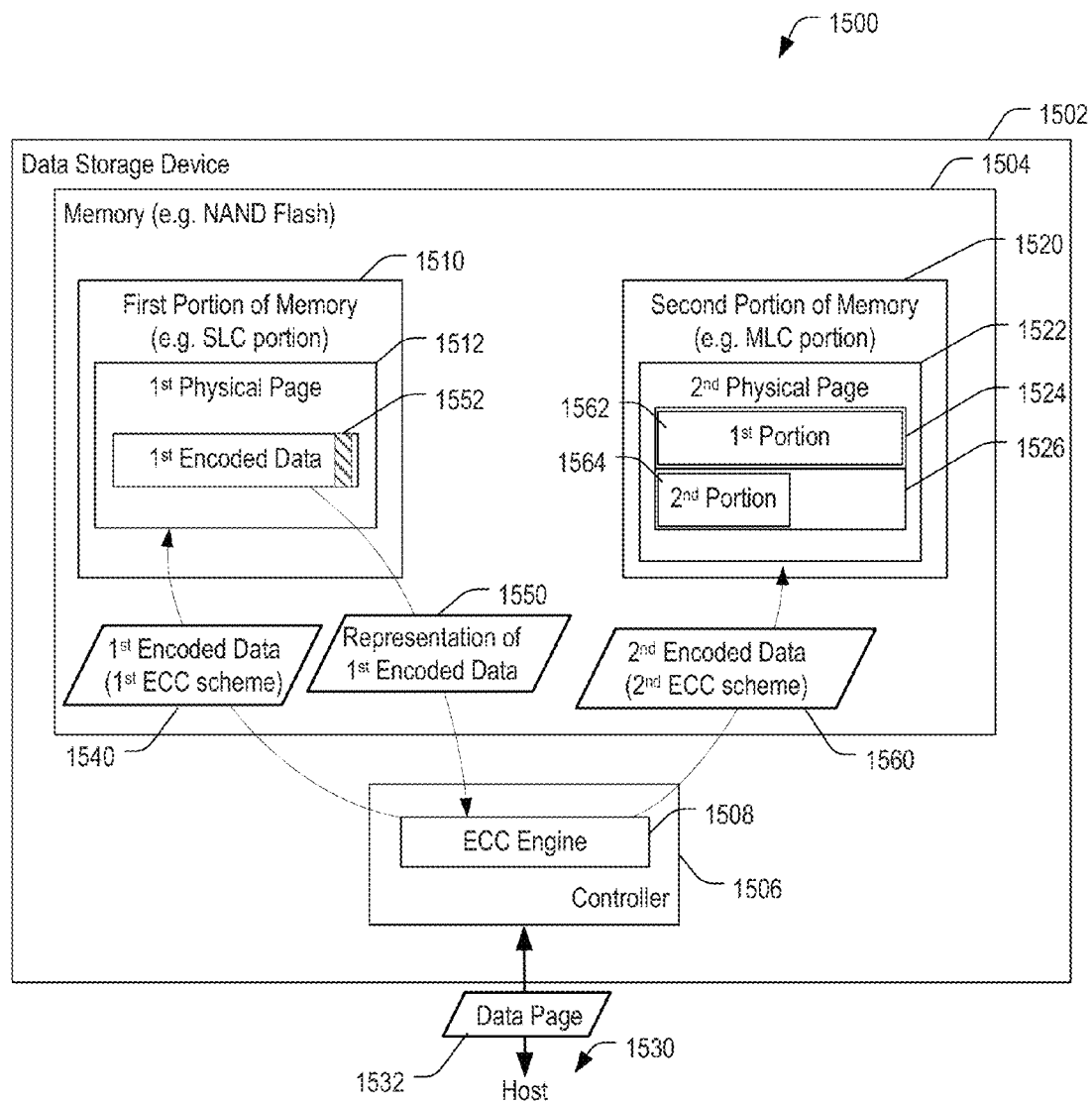
FIG. 15 is a block diagram of a particular embodiment of a system to store data using different ECC schemes to encode data to be cached at a first portion of a memory and to encode the data to be stored at a second portion of the memory.

FIG. 15 depicts an embodiment of a system 1500 to store data using different ECC schemes to encode data to be cached at a first portion 1510 of a memory 1504 (e.g. an SLC portion) and to encode data to be stored at a second portion 1520 of the memory 1504 (e.g. an MLC portion). The system 1500 includes a data storage device 1502 that is configured to be operatively coupled to a host device 1530. For example, the host device 1530 may correspond to the host device 1230 of FIG. 12.

The data storage device 1502 includes a controller 1506 with an ECC engine 1508 and also includes the memory 1504 (e.g. a NAND flash memory). The first portion 1510 of the memory 1504 (e.g. an SLC portion that functions as a binary cache) includes a first physical page 1512 and the second portion 1520 of the memory 1504 (e.g. an MLC portion) includes a second physical page 1522. The second physical page 1522 includes a first logical page 1524 and also includes a second logical page 1526 that has a higher reliability than the first logical page 1524.

The controller 1506 is configured to initiate a first encoding operation to encode a data page 1532 received from the host device 1530 to be written to the first portion 1510 of the memory 1504. The first encoding operation includes configuring the ECC engine 1508 to generate first encoded data 1540 according to a first ECC scheme. The first encoded data 1540 may include sufficient redundancy to enable recovery of the data page 1532 based on a reliability of the first physical page 1512. The first encoded data 1540 may be sized to span a single page of the first portion 1510 of the memory 1504 (i.e. no portion of the first encoded data 1540 is stored to a page other than the first physical page 1512).

After storing the first encoded data 1540 to the first physical page 1512, a representation 1550 of the first encoded data 1540 may be read from the first physical page 1512 and provided to the controller 1506. The representation 1550 may differ from the first encoded data 1540 due to the presence of one or more bit errors, such as a representative bit error 1552.

The controller 1506 is configured to cause the ECC engine 1508 to decode the representation 1550 to recover the data page 1532.

The controller 1506 is configured to encode the recovered data page 1532 at the ECC engine 1508 according to a second ECC scheme. For example, when the controller 1506 determines that the data page 1532 is to be stored at the first logical page 1524, the controller 1506 configures the ECC engine 1508 to encode the data page 1532 to generate second encoded data 1560 (e.g. a long codeword) that has sufficient redundancy to accommodate a relatively lower reliability of the first logical page 1524.

The second encoded data 1560 (i.e. the long codeword) may exceed a length of the first logical page 1524. A first portion 1562 of the second encoded data 1560 may substantially fill the first logical page 1524 and a second portion 1564 of the second encoded data may fill at least part of the second logical page 1526. Hence, the second encoded data 1560 spans over more pages (i.e. the first logical page 1524 and a portion of the second logical page 1526) than the first encoded data 1540 that spans over the single physical page 1512.

Figure 16:
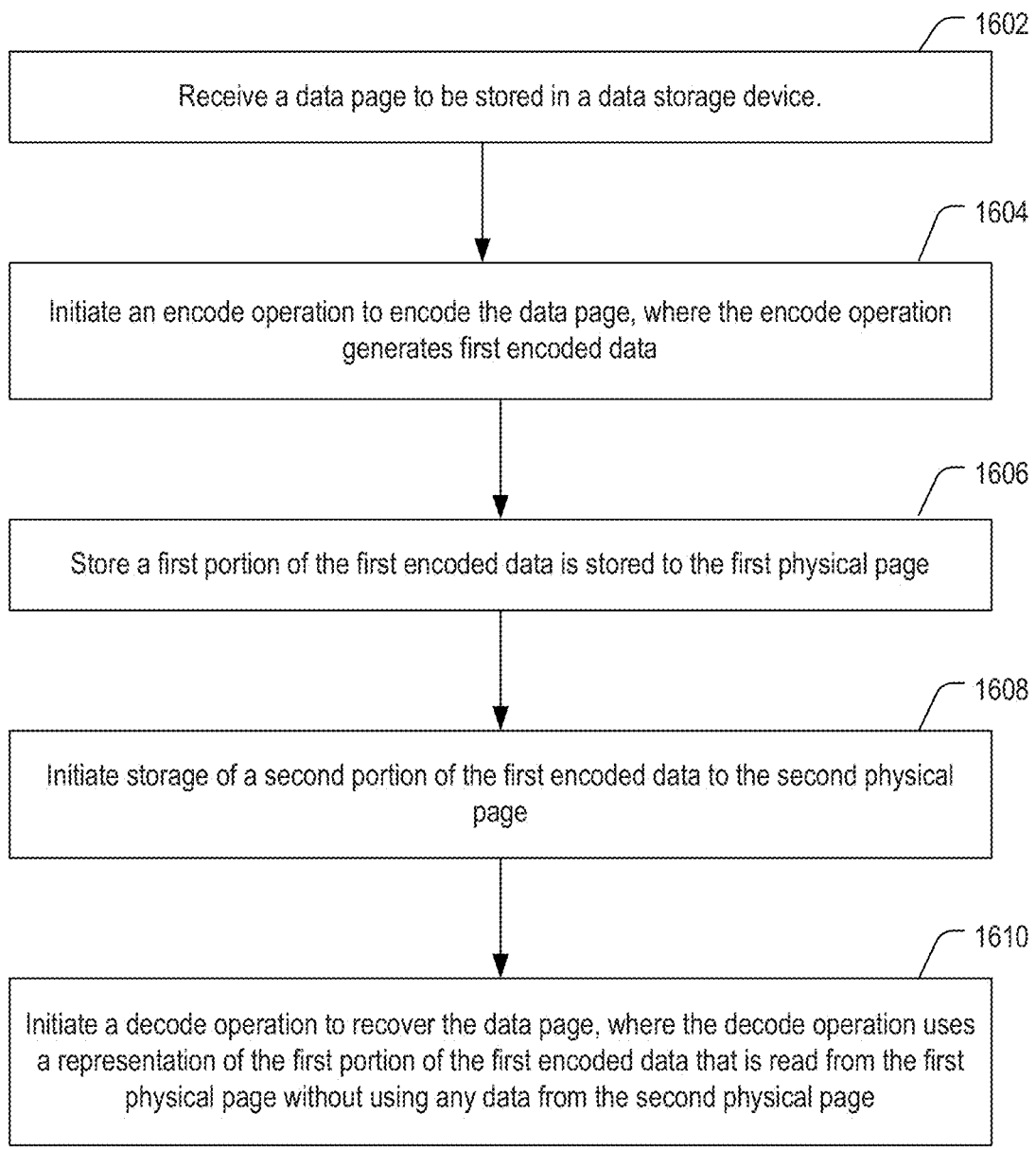
FIG. 16 is a flow diagram illustrating a particular embodiment of a method that includes writing multiple portions of encoded data and recovering data from a single portion of the multiple portions.

FIG. 16 illustrates an embodiment of a method that includes writing multiple portions of encoded data and recovering data from a single portion of the multiple portions. The method may be performed in a data storage device with multiple physical pages including a first physical page and a second physical page. For example, the method may be performed in the data storage device 1202 of FIG. 12.

A data page is received to be stored in the data storage device, at 1602. The data page may be received from a host device while the data storage device is operatively coupled to the host device. For example, the data storage device 1202 may be physically or wirelessly coupled to the host device 1230. The data storage device 1202 may receive the data page 1232 from the host device 1230.

An encode operation is initiated to encode the data page, at 1604. The encode operation generates first encoded data. For example, the first encoded data may correspond to the first codeword 1130 of FIG. 11.

A first portion of the first encoded data is stored to the first physical page, at 1606. Storage of a second portion of the first encoded data to the second physical page is initiated, at 1608. The second portion of the first encoded data may include only parity bits. For example, the data storage device may include a flash memory having a single-level cell (SLC) portion and a multi-level cell (MLC) portion. The first physical page and the second physical page may be in the SLC portion (e.g. a binary cache) for storing received data until copied to a third physical page in a multi-level cell (MLC) portion of the flash memory.

A message may be sent to the host device in response to storing the first portion of the first encoded data, such as the message 1248 of FIG. 12. The message may indicate that the data page has been successfully stored at the data storage device. The message may be sent prior to completing storage of the second portion of the first encoded data. The message may be sent before the second portion is stored because the stored first portion of the data page has sufficient redundancy to recover the data page according to a reliability of the first physical page.

A decode operation is initiated to recover the data page, at 1610. For example, the decode operation may be initiated in response to resumption of power after a power-off event prior to completion of writing the second portion of the first encoded data. The decode operation uses a representation of the first portion of the first encoded data that is read from the first physical page without using any data from the second physical page.

After recovering the data page via the decode operation, a second encode operation may be initiated to encode the data page. The second encode operation may generate second encoded data, and a first portion of the second encoded data may be stored to a third physical page. For example, the first portion of the second encoded data may be the representation 1262 of the first portion 1240 stored in the first logical page 1224 within the third physical page 1222 of FIG. 12. A second portion of the second encoded data may be stored to a second logical page within the third physical page, such as the representation 1264 of the second portion 1242 stored in the second logical page 1226 of FIG. 12.

The first encoded data may have a length exceeding a size of the first physical page and the second encoded data may have a length exceeding a size of the first logical page. As described with respect to FIGS. 11-12, because the first logical page may have a lower reliability than the second logical page, additional parity bits may be used to encode the data page, causing the codeword to have a length exceeding the size of the first logical page and the first physical page.

Figure 17:
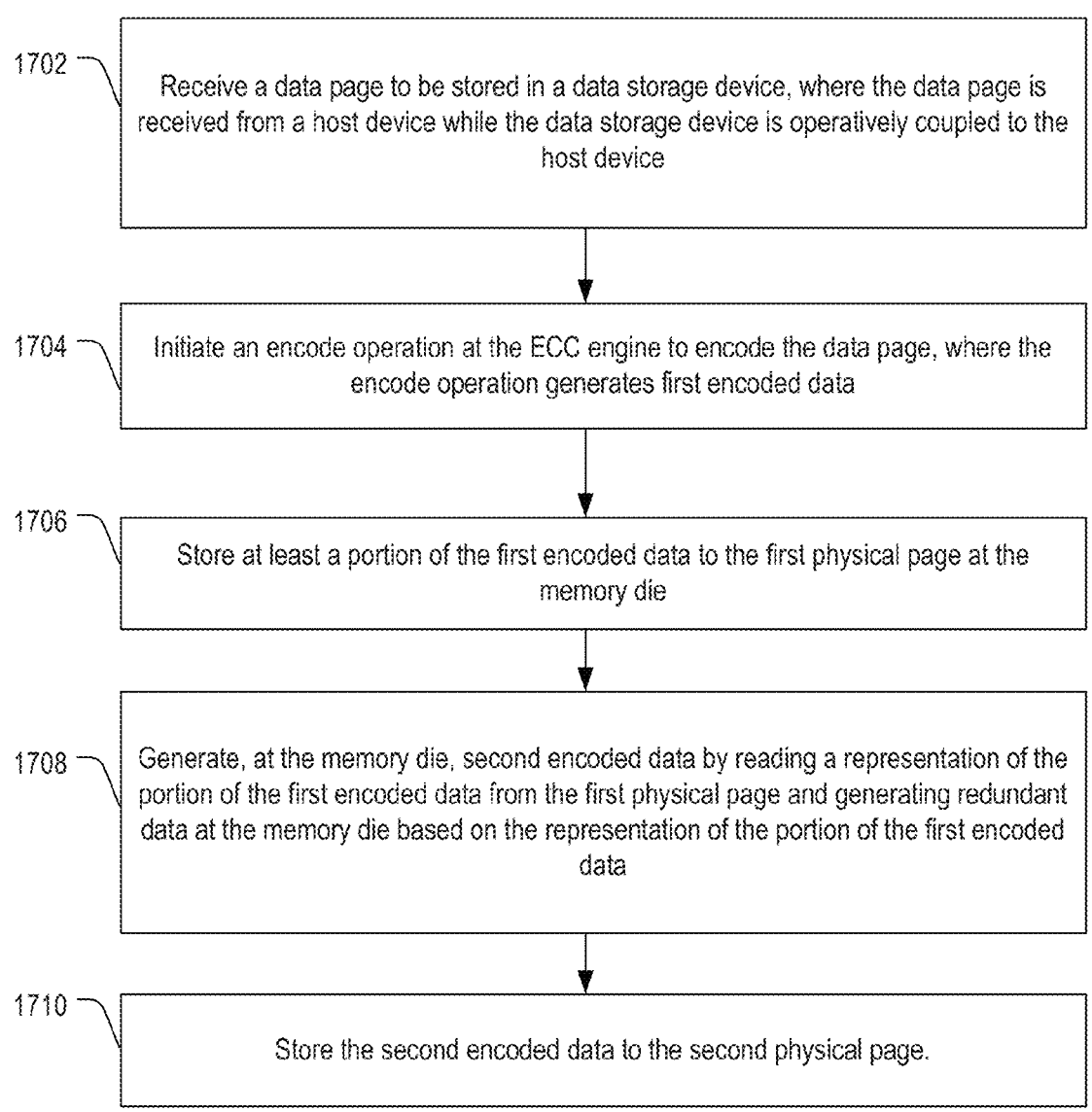
FIG. 17 is a flow diagram illustrating a particular embodiment of a method that includes generating additional redundant data within a memory die.

FIG. 17 illustrates an embodiment of a method that includes generating additional redundant data within a memory die. The method may be performed in a data storage device with a controller and a memory die, where the controller includes an error correction coding (ECC) engine and the memory die includes multiple physical pages including a first physical page and a second physical page. For example, the method may be performed in the data storage device 1402 of FIG. 14.

A data page to be stored in the data storage device is received, at 1702. The data page is received from a host device while the data storage device is operatively coupled to the host device. For example, the data storage device 1402 may be physically or wirelessly coupled to the host device 1430. The data storage device 1402 may receive the data page 1432 from the host device 1430.

An encode operation may be initiated at the ECC engine to encode the data page, at 1704. The encode operation generates first encoded data, such as the first encoded data 1440 of FIG. 14. At least a portion of the first encoded data is stored to the first physical page at the memory die, at 1706.

Second encoded data may be generated at the memory die, at 1708. The second encoded data may be generated by reading a representation of the portion of the first encoded data from the first physical page, such as the representation 1450 of FIG. 14, and generating redundant data at the memory die based on the representation of the portion of the first encoded data.

For example, the redundant data may be generated at the redundant data generator circuit 1472 of FIG. 14. The redundant data may be generated at the memory die by copying at least part of the representation of the portion of the first encoded data. The second encoded data is stored to the second physical page, at 1710.

For example, an SLC binary cache can be used for temporary storage of codewords. To illustrate, the first encoded data may be stored to the first physical page at a flash single level cell (SLC) page, and the second encoded data may be stored to the second physical page at multiple flash multi-level cell (MLC) logical pages. Because the redundant data is generated at the memory die, controller involvement (and a corresponding delay due to data transfer from the memory die to the controller and back to the memory die) can be avoided.

Figure 18:
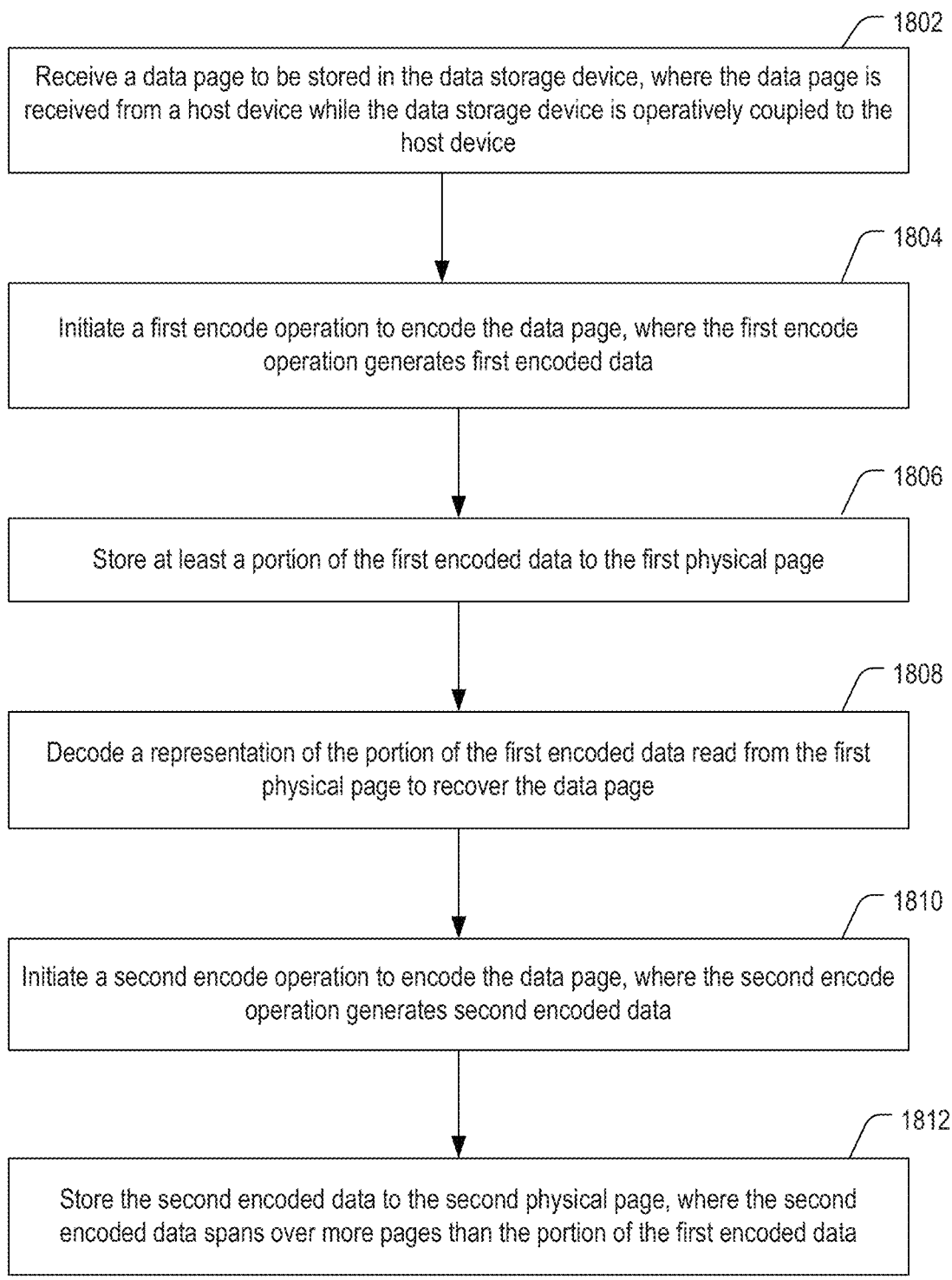
FIG. 18 is a flow diagram illustrating a particular embodiment of a method of writing data to a memory.

FIG. 18 illustrates an embodiment of a method of writing data to a memory. The method may be performed in a data storage device with multiple physical pages (e.g. a first physical page and a second physical page).

A data page is received to be stored in the data storage device, at 1802. The data page is received from a host device while the data storage device is operatively coupled to the host device. For example, the data page may be the data page 1332 received from the host device 1330 of FIG. 13. As another example, the data page may be the data page 1532 received from the host device 1530 of FIG. 15.

A first encode operation is initiated to encode the data page, at 1804. The first encode operation generates first encoded data. For example, the first encode operation may be performed at the ECC engine 1308 of FIG. 13. As another example, the first encode operation may be performed at the ECC engine 1508 of FIG. 15.

At least a portion of the first encoded data is stored to the first physical page, at 1806. All of the first encoded data may be stored to the first physical page, such as the first encoded data 1540 of FIG. 15. Alternatively, the first encoded data may include a first portion and a second portion, such as the portions 1240-1242 of FIG. 12 or the portions 1340-1342 of FIG. 13. The first portion may be stored to the first physical page and the second portion may be discarded.

A representation of the portion of the first encoded data read from the first physical page is decoded to recover the data page, at 1808. For example, the representation 1350 may be decoded at the ECC engine 1308 of FIG. 13. As another example, the representation 1550 may be decoded at the ECC engine 1508 of FIG. 15.

A second encode operation is initiated to encode the data page, at 1810. The second encode operation generates second encoded data. For example, the second encode operation may be performed at the ECC engine 1308 of FIG. 13 to generate the second encoded data 1360. As another example, the second encode operation may be performed at the ECC engine 1508 of FIG. 15 to generate the second encoded data 1560.

The second encoded data is stored to the second physical page, at 1812. The second encoded data spans over more pages than the portion of the first encoded data. The portion of the first encoded data may be stored to the first physical page at a flash page that is more reliable than the second physical page. For example, in a binary caching implementation, the portion of the first encoded data may be stored to the first physical page at a flash single level cell (SLC) page and the second encoded data may be stored to the second physical page at multiple flash multi-level cell (MLC) logical pages.

In some embodiments, the first encode operation uses the same error correction coding (ECC) scheme as the second encode operation. For example, the data storage device 1302 of FIG. 13 uses the same ECC scheme to encode the first encoded data 1340 and the second encoded data 1360. In other embodiments, the first encode operation uses a first error correction coding (ECC) scheme and the second encode operation uses a second ECC scheme that is different than the first ECC scheme. For example, the data storage device 1502 of FIG. 15 uses different ECC schemes to encode the first encoded data 1540 and to encode the second encoded data 1560.

Matching Storage Capacity to Page Reliability

Another technique to accommodate unequal page reliabilities includes storing more information on more-reliable pages and less information on less-reliable pages. A Multi-Level-Coding (MLC) scheme with different codes having the same code lengths, but possibly different code rates, may be used for the different pages of the word line. Two possible mappings of concatenated codewords of such an MLC scheme into the pages of the word line are shown in FIGS. 5 and 6. Flash memory management may be modified for such schemes because different pages store different amounts of information.

In an alternative technique, each page may store the same amount of user data (e.g. 8 KB) but may store a different amount of management data, control data, or any other side information. An example of side information that can be stored on more reliable pages of the word line (which would have higher storage capacity as a result of using less redundancy for the user data) is statistics information, such as statistics information regarding the stored data or regarding the word line's cell voltage distribution. Such side information may be used for purposes of adjusting a read level, improving error correction capability, managing data, one or more other purposes, or any combination thereof. The management data, control data, or side information can be coded separately from the user information and need not be coded together with user information within the same codeword.

Utilizing Some of the Redundant Cells in the Reliable Pages for Shaping

Unequal page reliabilities may be addressed by using increased storage capacity of the more reliable pages (the increased storage capacity due to fewer parity bits for encoding user data) for shaping a probability distribution over programmed states. Appropriate shaping of the probability distribution can be used for endurance enhancement, error rate reduction, "noise" mitigation, or any combination thereof. Because more reliable pages of a MLC word line require less ECC redundancy in order to provide a same reliability as the less reliable page(s) of the MLC word line, the unused redundancy in more reliable pages can be utilized as a "shaping" redundancy. A "shaping" redundancy can enable inducement of a designated non-uniform probability distribution over the programmed states. For example, high and low states may be programmed less frequently, which in turn should reduce the wearing of the cells and mitigate certain program disturb effects.

Figure 19:
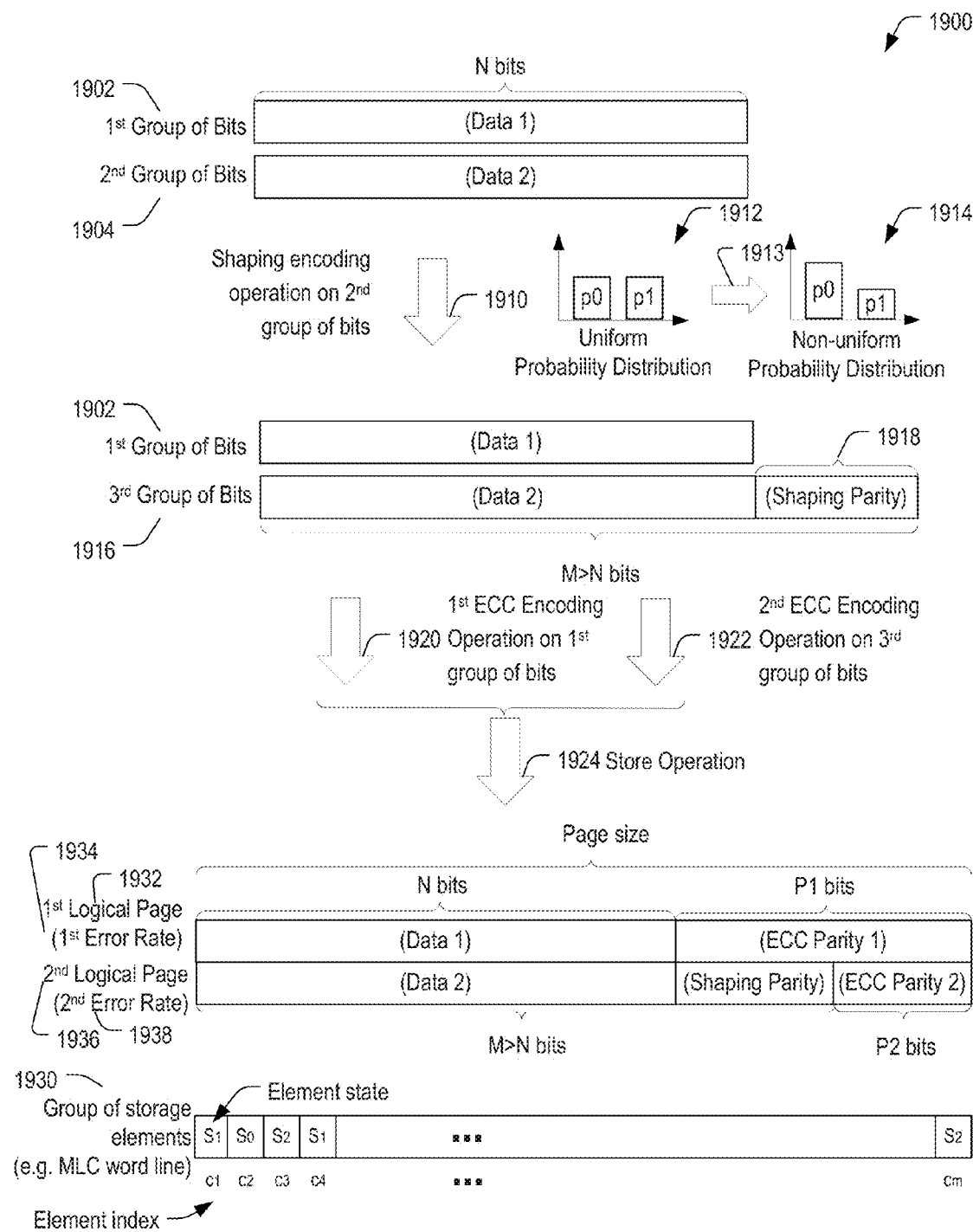
FIG. 19 is a general diagram illustrating a particular embodiment of storing data using shaping redundancy based on page reliability.

FIG. 19 illustrates an example 1900 of storing data using shaping redundancy based on page reliability. Data including a first group 1902 of bits representing first data (Data 1) and a second group 1904 of bits representing second data (Data 2) may be received at a memory such as a flash memory. Each of the first group 1902 and the second group 1904 can include N bits to be stored at a single word line of a MLC memory.

A shaping encoding operation 1910 is performed on the second group 1904 of bits to generate a third group 1916 of bits. The second group 1904 of bits may have been encoded so that a probability of a "0" bit value (p0) occurring at a bit location is substantially equal to a probability of a "1" bit value (p1), illustrated as a uniform probability distribution 1912 of bit values of the second group 1904 of bits. The uniform probability distribution 1912 is depicted as a bar graph that illustrates a probability of a "0" bit value as a height of a bar labeled "p0" and a probability of a "1" as a height of a bar labeled "p1." A transformation 1913 produces a non-uniform probability distribution 1914 of bit values in the third group 1916 of bits. The non-uniform probability distribution 1914 illustrates that the probability of a "0" bit in the third group 1916 of bits is greater than the probability of a "1" bit.

The third group 1916 of bits has M bits (M>N) and is illustrated as additional bits (shaping parity) 1918 appended to the second group 1904 of bits. However, it should be understood that the third group 1916 of bits need not include the second group 1904 of bits with the appended shaping parity 1918 and may instead be formed of transformed data bits. Although the additional bits 1918 are referred to as "shaping parity" or "shaping parity bits," it should be understood that added redundancy of the additional bits 1918 may not be made out of parity-checks.

A first ECC encoding operation 1920 is performed on the first group 1902 of bits and a second ECC encoding operation 1922 is performed on the third group 1916 of bits. Data resulting from the first ECC encoding operation 1920, illustrated as the first data (Data 1) with appended first ECC parity bits (ECC Parity 1) is stored to a first logical page 1932 via a store operation 1924. Data resulting from the second ECC encoding operation 1922, illustrated as the second data (Data 2), the shaping parity 1918, and second ECC parity bits (ECC Parity 2), is stored to a second logical page 1936 via the store operation 1924.

Because the first logical page 1932 has a first error rate 1934 that is greater than a second error rate 1938 of the second logical page 1936, the first data may be protected with more ECC parity than protects the second data. The number of bits of the first ECC parity bits (P1) may equal the sum of the number of bits of the second ECC parity (P2) and the number of bits of the shaping parity 1918. The second ECC parity may provide substantially the same error protection to the second data based on the second error rate 1938 as the first ECC parity provides to the first data based on the first error rate 1934.

The first logical page 1932 and the second logical page 1936 are within a group of storage elements 1930 such as a physical page of a MLC memory. The group of storage elements 1930 includes M storage elements such as flash memory cells (illustrated as cells having indexes c1 ... cm). Each storage element stores a state (s0, s1, etc.) representing multiple bits. For example, the first storage element c1 has a state s1 representing a first bit for the first logical page and a second bit for the second logical page.

By increasing a probability of "0" bits and decreasing a probability of "1" bits, the shaping encoding operation 1910 affects a distribution of the states of the group of storage elements 1930. Although FIG. 19 illustrates two logical pages 1932, 1936, other implementations may include three or more logical pages. For example, a flash memory with M=8 state cells can use the Grey mapping of Table 5.

TABLE 5

A mapping for M = 8 with type 2-2-3 page reliabilities

| State: | Er | A | B | C | D | E | F | G |
|---|---|---|---|---|---|---|---|---|
| Upper Page: | 1 | 1 | 0 | 0 | 1 | 1 | 0 | 0 |
| Middle Page: | 1 | 0 | 0 | 0 | 0 | 1 | 1 | 1 |
| Lower Page: | 1 | 1 | 1 | 0 | 0 | 0 | 0 | 1 |

Each page may store 8 KB of user data and have 1 KB of redundancy (i.e. the word line contains 8 KB+1 KB=9 KB cells, 1 KB=1024 bytes). Examples of how user data can be encoded into the pages of a word line (e.g. 8 KB per page) and how the redundancy is allocated are described with respect to FIGS. 19 and 20. In the illustrated example of FIG. 19, for the upper page (i.e. the first logical page 1932, which is less reliable than the second logical page 1936) the entire redundancy area is utilized for ECC redundancy. For lower and/or middle pages, which are more reliable, the redundancy area is utilized for both ECC redundancy and shaping redundancy, as described with respect to FIG. 20. Information theoretic analysis shows that in order to achieve the same reliability for all three pages, lower and middle pages that exhibit an error rate which is only ⅔ of that of the upper page require only about 683B of redundancy (out of the available 1 KB). As a result, about 341B of redundancy are available for shaping.

The available redundancy can be utilized as follows: the 8 KB user data stored on the lower or middle pages is first encoded with a shaping code, which maps the user data into a "shaped" word of size 8533B (=8 KB+341B), which has a reduced fraction of "1"s as compared to the original user data (alternatively, the shaping may be used to reduce the fraction of "0"s). Then the "shaped" word is encoded using an ECC encoder into a 9 KB codeword (8533B+683B). If the user data is random (i.e. equal probability for "0"s and "1"s) then the shaping redundancy of 341B over 8192B of user data can enable reducing the fraction p of "1"s in the codeword from 50% to about 38% on the average (p=$H_b^{-1}$ (8192/8533)≅0.38, where $H_b(p)$=-p·log$_2$(p)-(1-p)·log 2(1-p)). The resulting probability distribution over the programmed states of the "shaped" cells may be given by:

$$P=[0.5 \cdot p^2 \; 0.5 \cdot (1-p) \cdot p \; 0.5 \cdot (1-p) \cdot p \; 0.5 \cdot (1-p) \cdot (1-p) \; 0.5 \cdot (1-p) \cdot (1-p) \cdot p \; 0.5 \cdot (1-p) \cdot p \; 0.5 \cdot p^2]$$

$$=[0.0722 \; 0.1178 \; 0.1178 \; 0.1922 \; 0.1922 \; 0.1178 \; 0.1178 \; 0.0722]$$

Since in this example the ECC redundancy cells are not "shaped," distribution over the cells' programmed states may be substantially uniform (U=[⅛ ⅛ ⅛ ⅛ ⅛ ⅛ ⅛ ⅛]). Hence, the overall distribution over the programmed states along the word line may be:

$$(8532/9216) \cdot P + (684/9216) \cdot U = [0.0761 \; 0.1183 \; 0.1183 \; 0.1872 \; 0.1872 \; 0.1183 \; 0.1183 \; 0.0761]$$

Thus, the probability for the two extreme states (e.g. states 'Er' and 'G' of Table 5) may be significantly reduced. The reduced probability of the most extreme states enables reduced cell wearing (and hence higher cycling and data retention performance) and reduced program disturb effects (and hence a reduced error rate).

Figure 20:
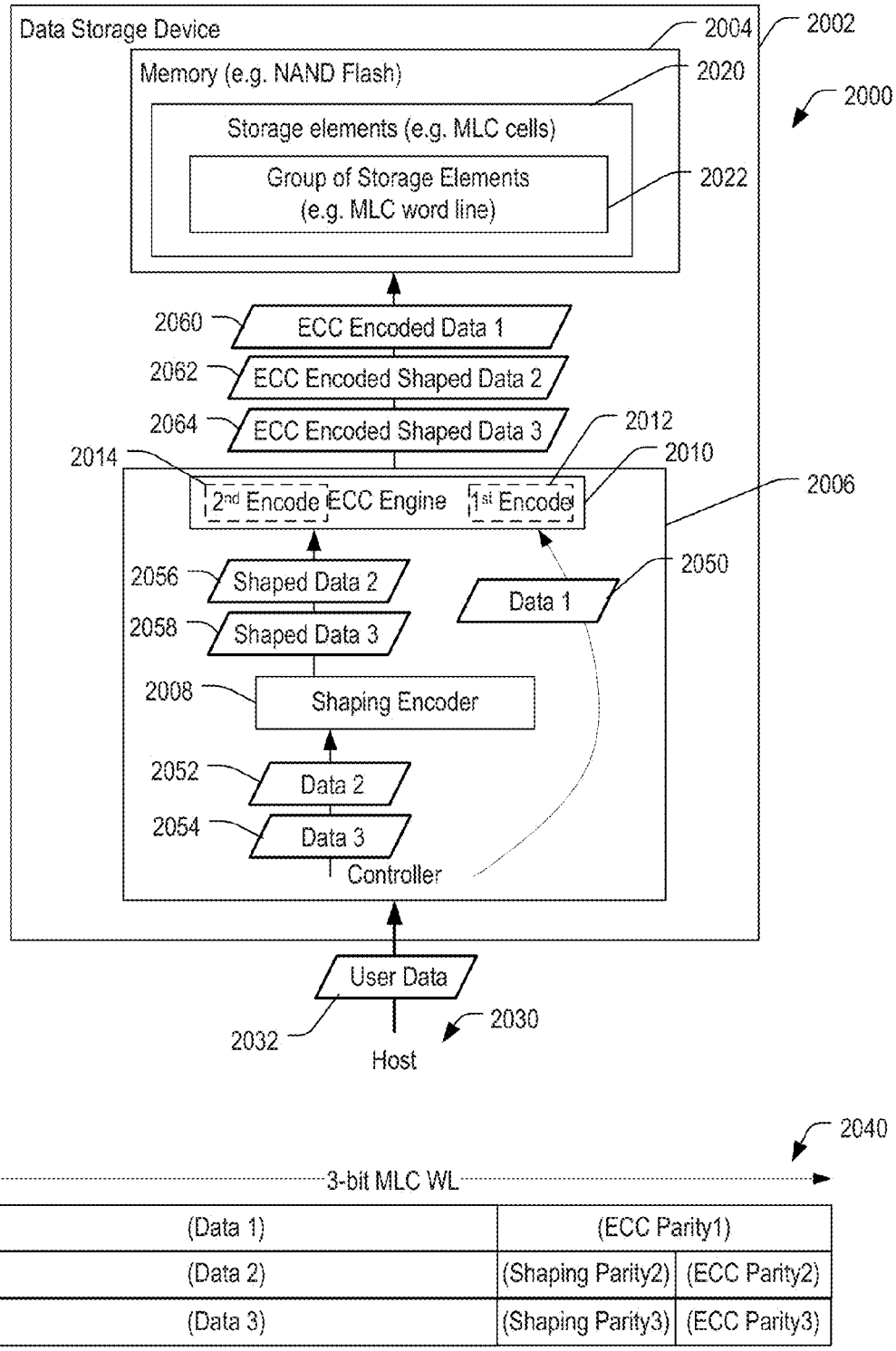
FIG. 20 is a block diagram of a particular embodiment of a system to store data using shaping redundancy based on page reliability.

FIG. 20 illustrates a system to store data using shaping redundancy based on page reliability. The system 2000 includes a data storage device 2002 that is configured to be operatively coupled to a host device 2030. For example, the host device 2030 may correspond to the host device 1230 of FIG. 12.

The data storage device 2002 includes a controller 2006 with a shaping encoder 2008 and an ECC engine 2010. The data storage device 2002 also includes a memory 2004, such as a flash multi-level cell (MLC) memory. The memory 2004 includes storage elements 2020, such as flash MLC cells, and one or more groups of the storage elements, such as a representative group 2022. To illustrate, the group 2022 may be a MLC word line, such as a representative 3-bit MLC word line 2040.

The shaping encoder 2008 is configured to receive input data having a first distribution of "1" and "0" values and to generate output data with a modified distribution of "1" and "0" values. The shaping encoder 2008 may be configured to apply a shaping operation that generates shaping parity bits so that the resulting output data (e.g. the input data with the shaping parity appended) has a non-uniform probability distribution of bit values. The shaping encoding operation may increase a likelihood that individual cells of a physical page of the MLC memory 2004 would be programmed to intermediate states and may decrease a likelihood that the individual cells of the physical page of the MLC memory 2004 would be programmed to a lowest state, or to a highest state, or both. For example, the shaping encoder 2008 may be configured to perform the shaping encoding operation 1910 of FIG. 19.

The controller 2006 is configured to receive user data 2032 from the host device 2030. The user data 2032 includes a first group 2050 of bits (Data 1) that will be stored in an upper page of a MLC word line (WL), a second group 2052 of bits (Data 2) that will be stored in a middle page of the MLC word line, and a third group 2054 of bits (Data 3) that will be stored in a lower page of the MLC word line. The upper page has a higher error rate than the middle and lower pages.

The controller 2006 is configured to perform a shaping encoding operation on the second group 2052 and on the third group 2054 but not on the first group 2050. The second group 2052 and the third group 2054 are provided to the shaping encoder 2008 to generate shaped second data 2056 and shaped third data 2058, respectively. The shaped second data 2056 includes more bits than the second group 2052 and the shaped third data 2058 includes more bits than the third group 2054.

The controller 2006 is configured to provide the first group 2050 to the ECC engine 2010, bypassing the shaping encoder 2008. The ECC engine 2010 applies a first ECC encoding operation 2012 that generates first ECC parity (ECC Parity 1) based on the first group 2050 of data bits to form ECC encoded first data 2060. The controller 2006 is configured to provide the shaped second group 2056 to the ECC engine 2010 to apply a second ECC encoding operation 2014 that generates second ECC parity (ECC Parity 2) to form ECC encoded shaped second data 2062. Similarly, the shaped third group 2058 is provided to the ECC engine 2010 to generate third ECC parity (ECC Parity 3) to form ECC encoded shaped third data 2064.

The first ECC parity bits of the ECC encoded first data 2060 include more bits than the second ECC parity bits of the ECC encoded shaped second data 2062 to provide greater error correction capability for the less-reliable upper page of the MLC word line 2040. For example, the first ECC parity bits may enable correction of up to a first number of errors in the upper logical page and the second ECC parity bits may enable correction of up to a second number of errors in the middle logical page. A first probability that a number of errors in the upper logical page exceeds the first number may substantially equal a second probability that a number of errors in the middle logical page exceeds the second number. Because the middle and lower pages require less parity for a same amount of error correction capability as the upper page, the shaping parity generated by the shaping encoder 2008 can be included in a parity portion of the MLC word line 2040.

The controller 2006 is configured to send the first ECC encoded data 2060 (i.e. the first group 2050 and first error correction coding (ECC) parity bits corresponding to the first group 2050) to the MLC memory 2004 to be stored at the first logical page (e.g. the upper page) that is contained within a physical page of the MLC memory 2004. The controller 2006 is configured to send the ECC encoded shaped second data 2062 and the ECC encoded shaped third data 2064 to the MLC memory 2004 to be stored at a second logical page (e.g. the middle page) and third logical page (e.g. the lower page), respectively, contained within the physical page of the MLC memory 2004.

Figure 21:
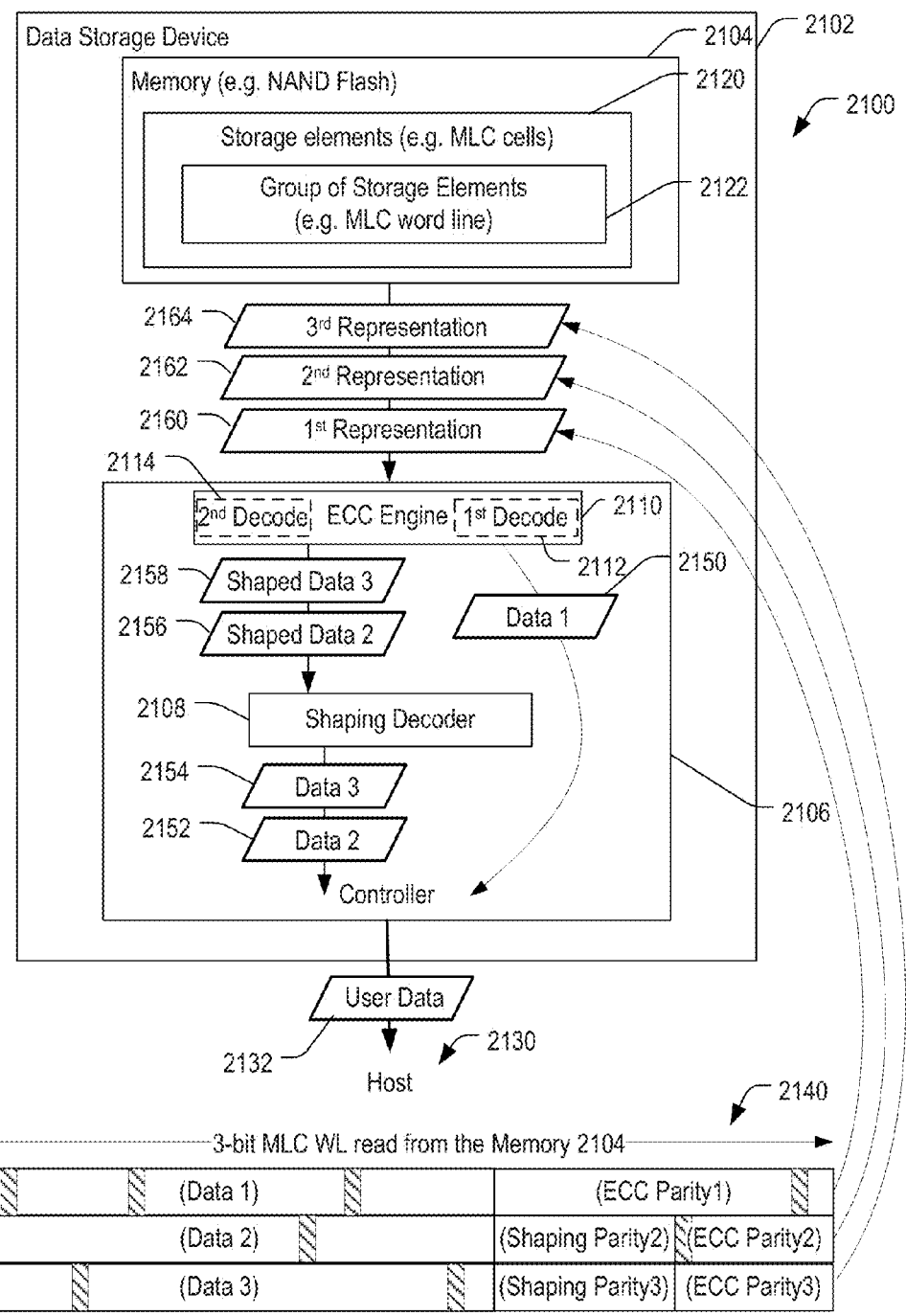
FIG. 21 is a block diagram of a particular embodiment of a system to retrieve data that includes shaping redundancy based on page reliability.

FIG. 21 illustrates a system to recover data that has been shaped using shaping redundancy based on page reliability, such as to read and decode data that has been encoded and stored by the system of FIG. 20. The system 2100 includes a data storage device 2102 configured to be operatively coupled to a host device 2130. The data storage device 2102 includes a memory 2104 such as a flash MLC memory coupled to a controller 2106. The memory 2104 includes storage elements 2120 such as flash MLC cells and one or more groups of the storage elements, such as a representative group 2122 (e.g. a MLC word line). The controller 2106 includes an ECC engine 2110 and a shaping decoder 2108. The data storage device 2102 and the host device 2130 may correspond to the data storage device 2002 and host device 2030 of FIG. 20, respectively.

A representative 3-bit MLC word line 2140 of the MLC memory 2104 is illustrated as having an upper page, a middle page, and a lower page that may be read by the controller 2106. The controller 2106 is configured to retrieve a first representation 2160 of first data (Data 1) and first ECC parity bits (ECC Parity 1) from a first logical page that is within a physical page of the MLC memory 2104, such as the upper page of the 3-bit MLC word line 2140. The controller 2106 is configured to retrieve a second representation 2162 of shaped second data (Data 2 and Shaping Parity 2) and second ECC parity bits (ECC Parity 2) from a second logical page that is within the physical page of the MLC memory, such as the middle page of the 3-bit MLC word line 2140. The controller 2106 is configured to retrieve a third representation 2164 of shaped third data (Data 3 and Shaping Parity 3) and third ECC parity bits (ECC Parity 3) from a third logical page that is within the physical page of the MLC memory, such as the lower page of the 3-bit MLC word line 2140.

The representations 2160-2164 may include one or more bit errors, indicated as hatched portions of the logical pages of the 3-bit MLC word line 2140 for illustrative purposes. The controller 2106 is configured to initiate a first ECC decode operation 2112 of the first representation 2160 at the ECC engine 2110 to recover the first data 2150. The controller 2106 is configured to initiate a second ECC decode operation 2114 of the second representation 2162 to recover the shaped second data 2156 and of the third representation 2164 to recover the shaped third data 2158.

The controller 2106 is configured to initiate a shaping decoding operation on the shaped second data 2156 to generate the second data 2152 and on the third shaped data 2158 to generate the third data 2154. The second data 2152 has fewer bits than the shaped second data 2156, and the third data 2154 has fewer bits than the shaped third data 2154. The shaping decoding operation is performed at the shaping decoder 2108 and is configured to produce a uniform probability distribution of bit values in the second data 2152 and a uniform probability distribution of bit values in the third data 2154. The controller 2106 may be configured to provide the first data 2150, the second data 2152, and the third data 2154 to the host device 2130 as user data 2132.

Because the upper page has a higher error rate than the middle page and the lower page, the first ECC parity includes more bits than the second ECC parity and more bits than the third ECC parity. For example, the first ECC parity may enable correction of up to a first number of errors in the first representation 2160, and the second ECC parity may enable correction of up to a second number of errors in the second representation 2162, where the first number is greater than the second number. By providing more parity for the less reliable upper page and less parity for the more reliable middle page, a first probability that a number of errors in the first representation 2160 exceeds the first number may substantially equal a second probability that a number of errors in the second representation 2162 exceeds the second number. As a result, each of the middle and lower logical pages may have a same chance of having uncorrectable errors as the upper logical page, while extra space in the word line due to reduced parity can be used to shape the data to reduce wearing and/or program disturb effects at the MLC memory 2104.

Figure 22:
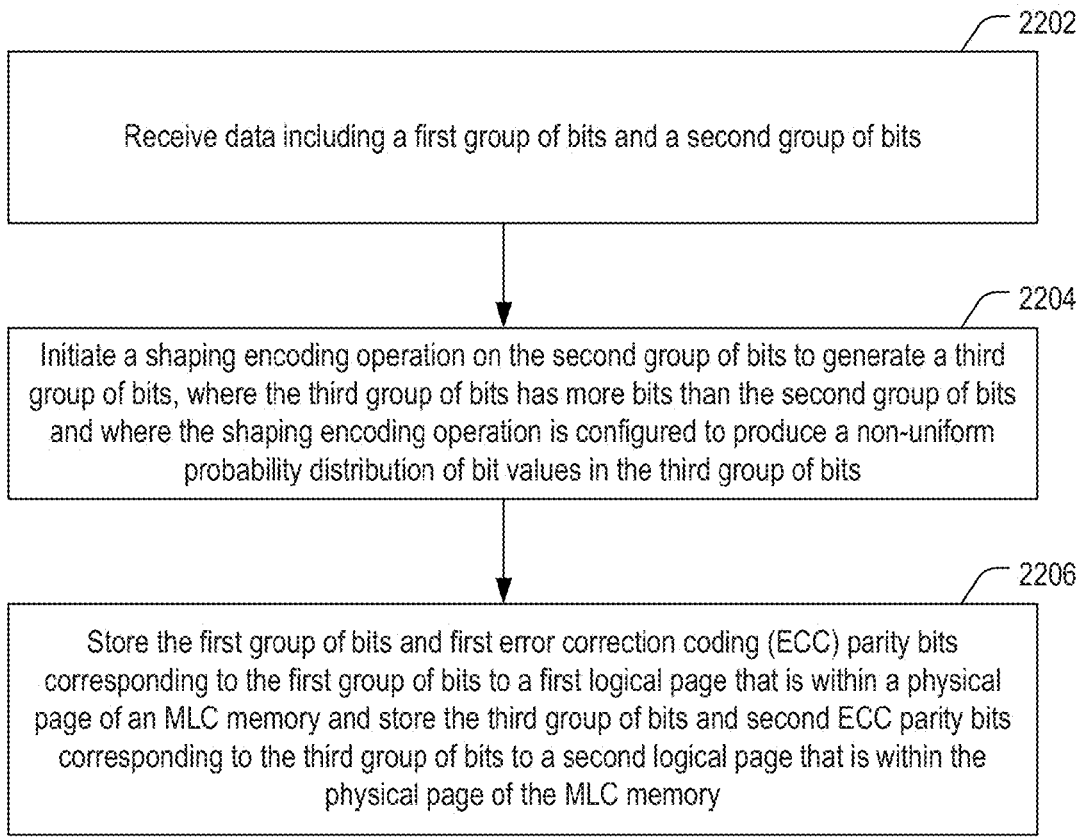
FIG. 22 is a flow diagram of a particular embodiment of a method of writing data that includes initiating a shaping encoding operation.

FIG. 22 illustrates a particular embodiment of a method to write data using shaping redundancy based on page reliability. The method of writing data may be performed in a data storage device with a flash multi-level cell (MLC) memory. For example, the method may be performed by the controller 2006 of FIG. 20.

Data including a first group of bits and a second group of bits is received, at 2202. For example, the first group of bits may be the first data 2050 and the second group of bits may be the second data 2052 of FIG. 20.

A shaping encoding operation is initiated on the second group of bits to generate a third group of bits, at 2204. For example, the third group of bits may be the shaped second data 2056 of FIG. 20. The third group of bits has more bits than the second group of bits. The shaping encoding operation is configured to produce a non-uniform probability distribution of bit values in the third group of bits.

The first group of bits and first error correction coding (ECC) parity bits corresponding to the first group of bits (e.g. ECC encoded first data 2060 of FIG. 20) are stored to a first logical page that is within a physical page of the MLC memory, and the third group of bits and second ECC parity bits corresponding to the third group of bits (e.g. ECC encoded shaped second data 2062 of FIG. 20) are stored to a second logical page that is within the physical page of the MLC memory, at 2206.

The first logical page may be associated with a first error rate and the second logical page may be associated with a second error rate that is less than the first error rate. The first ECC parity bits include more bits than the second ECC parity bits. For example, the ECC Parity 1 in the upper logical page of the 3-bit MLC word line 2040 of FIG. 20 includes more bits than the ECC Parity 2 in the middle logical page.

The ECC parity bits may be determined so that each logical page has an approximately equal likelihood of uncorrectable errors. For example, the first ECC parity bits may enable correction of up to a first number of errors in the first logical page and the second ECC parity bits may enable correction of up to a second number of errors in the second logical page. A first probability that a number of errors in the first logical page exceeds the first number may substantially equal a second probability that a number of errors in the second logical page exceeds the second number.

In some embodiments, the shaping encoding operation increases a likelihood that individual cells of the physical page of the MLC memory would be programmed to intermediate states and decreases a likelihood that the individual cells of the physical page of the MLC memory would be programmed to a lowest state. In some embodiments, the shaping encoding operation increases a likelihood that individual cells of physical page of the MLC memory would be programmed to intermediate states and decreases a likelihood that the individual cells of the physical page of the MLC memory would be programmed to a highest state. By reducing a likelihood that MLC cells are programmed to a lowest state (e.g. 'Er' in Table 5) and/or to a highest state (e.g. 'G' in Table 5), an amount of cell wearing to the MLC cells may be reduced and a useful life of the MLC memory may be extended.

Figure 23:
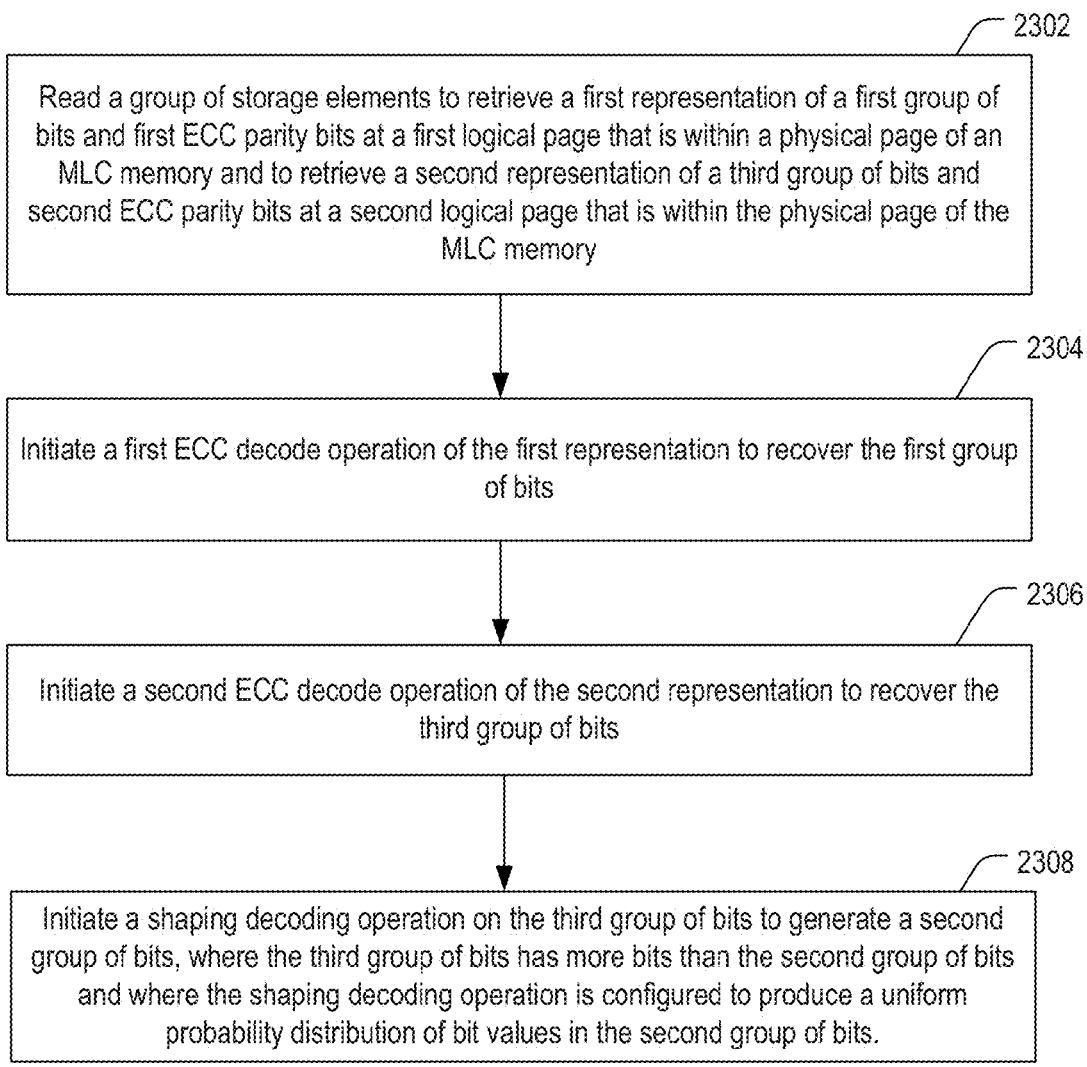
FIG. 23 is a flow diagram of a particular embodiment of a method of reading data that includes initiating a shaping decoding operation.

FIG. 23 illustrates a particular embodiment of a method to read data that has been shaped using shaping redundancy based on page reliability. The method of reading data may be performed in a data storage device with a flash multi-level cell (MLC) memory. For example, the method may be performed by the controller 2106 of FIG. 21.

A group of storage elements are read to retrieve a first representation of a first group of bits and first ECC parity bits at a first logical page that is within a physical page of the MLC memory and to retrieve a second representation of a third group of bits and second ECC parity bits, at 2302. The second representation that is retrieved is at a second logical page that is within the physical page of the MLC memory. For example, the first representation 2160 and the second representation 2162 may be read from the MLC memory 2104 of FIG. 21.

A first ECC decode operation of the first representation is initiated to recover the first group of bits, at 2304. For example, the first ECC decode operation may be the first decode operation 2112 of FIG. 21.

A second ECC decode operation of the second representation is initiated to recover the third group of bits, at 2306. For example, the second ECC decode operation may be the second decode operation 2114 of FIG. 21 that decodes a longer word (e.g. Data 2 and Shaping Parity 2) using fewer parity bits (e.g. ECC Parity 2) than the first decode operation 2112 that decodes Data 1 using ECC Parity 1.

A shaping decoding operation on the third group of bits is initiated to generate a second group of bits, at 2308. The third group of bits has more bits than the second group of bits. The shaping decoding operation is configured to produce a uniform probability distribution of bit values in the second group of bits.

The first logical page may be associated with a first error rate and the second logical page may be associated with a second error rate that is less than the first error rate. Therefore, the first ECC parity bits may include more bits than the second ECC parity bits. The first ECC parity bits may enable correction of up to a first number of errors in the first representation, and the second ECC parity bits may enable correction of up to a second number of errors in the second representation. As a result, a first probability that a number of errors in the first representation exceeds the first number may substantially equal a second probability that a number of errors in the second representation exceeds the second number.

Soft Bits

A method is disclosed to read each page of a MLC word line separately to reduce a number of sense operations during a read of a single page. As a by-product, data from a single latch may be sent from the flash memory to the controller as compared to transferring data from several latches to the controller, such as in an interleaved storage scheme where the data of one code-word is located in several latches. In addition to sense time savings, a delay caused by the controller to send a "change column" command to the flash memory and delay caused by execution of the change column command by the flash memory may be avoided. Thus, during a random read (as opposed to serial read of sequential memory addresses), read latency can be reduced as compared to an interleaved scheme. Soft bit methods as described herein may be performed using any of the code structures as described with respect to FIGS. 1-6 but are not limited to use with the code structures of FIGS. 1-6 and may instead by applied to any code structure.

Reducing read latency may be accomplished by reducing sense time. An ability to read a single logical page to retrieve data (as opposed to reading all logical pages at a MLC physical page) may be maintained even in case a reliability of a flash memory deteriorates due to wear.

A soft input decoder's correction capability can be improved if the flash memory is read with higher resolution. Higher resolution data, denoted as soft bit (SB) information, is read from the array on each flash memory cell. As the voltage resolution is improved, (e.g. the read threshold voltage is estimated with more precision) the number of soft bits required to represent the read resolution increases. As a result, more sense operations may be performed and more bytes of data may be transferred from the flash memory latches to the controller in order to make use of high read resolution to increase the correction capability of the decoder. More sense operations and data transferred to the controller may cause random reads to be delayed and read throughput of the flash memory to be decreased.

However, a number of sense operations and transfer time may be reduced when a random read is to be performed, without significant impact on correction capability, using soft bits. The flash memory may still be operated via page-by-page read while soft bits are obtained for each page separately. For example, using the mapping depicted above in Table 5, each of the logical pages (Lower/Middle/Upper) can be read independently from one another and increased read resolution may be employed which in turn results in corresponding increased correction capability of the soft input decoder. Although Table 5 illustrates a 2-2-3 mapping (i.e. two transitions or "swaps" in the lower page, two swaps in the middle page, and three swaps in the upper page), in other embodiments a 2-3-2 mapping or a 3-2-2 mapping may be replaced for the 2-2-3 mapping of Table 5.

If an application requests a set of sequential read operations in between random reads (for example, in a solid-state drive (SSD) application when a large file is read which occupies at least one full word line), then assuming the same correction capability of the page-by-page read is retained for the sequential read, a reduced number of soft bits may be sent from the flash memory to the controller per each read cell. Methods to reduce the number of soft bits may be particularly useful when the soft bits represent voltage regions/intervals which are not uniform. In a particular embodiment, the same bit patterns for the soft bits are preserved for both the sequential read and the page-by-page read, enabling soft input decoder initialization tables to be simplified and enabling implementation of a system including both of these modes to be less complex than using different soft bit patterns for sequential reads as for page-by-page reads.

Conventional systems that read higher resolution from the flash memory cells of a MLC array often acquire data on all of the array pages. For example, for an MLC flash memory with three bits per cell (3-BPC) reading, two more sense operations may be taken for each of the seven read thresholds to obtain two soft bits. The first sense operation (for each of the seven read thresholds) is done with a read voltage which is slightly lower than the read threshold, and the second sense operation is done with a read voltage which is slightly higher than the read threshold. A set of 21 sense operations may be employed in order to obtain higher resolution information to the controller. In the 3-BPC example, a total of five pages may be sent from the flash memory to the controller in order to decode the data. These five pages include three pages for the hard bits (HB) and two pages for the soft bits. Five pages are used since the 21 thresholds define 22 voltage intervals and distinguishing between 22 different intervals requires more than 4 bits. Each of the 22 options (i.e. 22 voltage intervals defined by 21 thresholds, illustrated in FIG. 28) represents a voltage band associated to each cell. In case the data is stored such that each code-word resides in only one logical page, the data sent to the controller includes sufficient bits to decode all three logical pages, even though only one of the logical pages is required.

In a particular embodiment, information on the exact voltage band each cell resides in within the voltage window may be disregarded, and information on the location of the read threshold only within the state it resides in is retained. The voltage band of the read state may be divided into regions of voltage in which the cells are read with voltage threshold in the vicinity of the 'middle of the state' is considered highly reliable while cells read in a region closer to the overlap section between adjacent states are less reliable. The more the voltage interval (which may include several voltage bands) is closer to the overlap region between adjacent states of a cell, the greater a degradation of the reliability of the bit(s) associated with transition from '0' to '1' or from '1' to '0' in the corresponding transition between the two adjacent states. A Gray mapping may be used so that only a single bit stored in the cell is associated with reduced probability, the bit belonging to one of the logical pages programmed to the corresponding word line.

Figure 24:
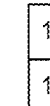
FIG. 24 is a general diagram illustrating a particular embodiment an upper logical page mapping in which three reliability intervals are defined for each state.

FIG. 24 depicts an embodiment 2400 of an Upper page with the mapping as described in Table 5 in which three reliability intervals are defined for each state. A first table 2402 illustrates states (Er-G) of the logical page, a hard bit (HB) associated with each state, and additional sensed bits (S1-S4). The sense S1 is performed with a read voltage that is slightly lower than the read voltage used to produce the hard bit. Thus, the transitions from 0 to 1 and from 1 to 0 are slightly lower (to the left) of the transitions of the hard bit. The sense S2 is performed with a read voltage that is slightly higher than the read voltage used to produce the hard bit. Thus, the transitions from 0 to 1 and from 1 to 0 are slightly higher (to the right) of the transitions of the hard bit. The sense S3 is performed with a read voltage that is slightly lower than S1. Thus, the transitions from 0 to 1 and from 1 to 0 are slightly lower (to the left) of the transitions of S1. The sense S4 is performed with a read voltage that is slightly higher than S2. Thus, the transitions from 0 to 1 and from 1 to 0 are slightly higher (to the right) of the transitions of S2. A second table 2404 illustrates soft bits SB1-SB2 that are generated using the sensed bits S1-S4. Note that the two soft bits SB1, SB2 contain relevant reliability information, and using only these two soft bits does not affect the performance of a soft low-density parity-check (LDPC) decoder, relative to using the 4 senses S1-S4. Also note that the five senses around each transition point partition the full voltage range into 16 sections, thus in principle the five senses could be mapped to four pages rather than the five pages depicted in the first table 2402. A third table 2406 shows resulting data (HB, SB1, SB2) that is sent to the controller in response to reading the Upper page. In the third table 2406 it is evident that the '00' combination of SB1 and SB2 represents relatively low reliability and the '11' combination of SB1 and SB2 represents relatively high reliability. These representations can be converted into a log-likelihood ratio (LLR) or other soft value information and fed to a soft input decoder.

In FIG. 24, only the Upper page is read, and two soft bits for the Upper page are generated in the flash memory latches and transferred to the controller for processing by the decoder. Three pages (HB, SB1, and SB2) are transferred from the flash memory to the controller instead of the five bits (HB, S1, S2, S3, S4) read from the cell. Note that the information on the exact voltage band of the read cells is lost. However, the correction capability for the codeword that resides in the upper page is only slightly impacted as compared to schemes where information on the exact voltage band is retained. The number of sense operations can be reduced from 35 to 15 when reading a single logical page with soft bits as compared to a conventional system that reads all logical pages (e.g. Upper, Middle, and Lower) with soft bits. For example, the hard bit can be read using three sense operations (one sense operation at the transition between states A and B, between states C and D, and between states E and F) instead of seven sense operations (one sense operation between each of the eight states Er, A . . . G). Reduction from 35 to 15 sense operations is applicable for the upper page as defined in the 2-2-3 mapping of Table 5. However, when considering the middle or lower page of Table 5, an even more substantial reduction of sense operations may be obtained, e.g. from 35 to 10.

The error correction capability effect of transferring just the two soft bit pages SB1 and SB2 instead of the four pages S1-S4 is very small. For example, if parity allocated to the codeword in the Upper page is around 10%, error correction capability may be reduced as compared with conventional schemes by less than 0.2% in terms of cell error rate (CER). A theoretical correction capability (Shannon Bound) under a BICM decoder can be above 4% in terms of CER. Note that the gain in terms of reduction of total delay due to sense operations and data transfer is relatively large, while the possible loss in correction capability for the system is relatively small. A system read performance gain arising due to reduction of total delay includes a sense operation gain, which in this particular embodiment reaches a factor of about 2, and a gain in terms of a lower number of pages of data transferred from the flash memory to the controller, which in this particular embodiment is 40%. Considering a flash memory that is designed to operate for applications in which random read is the main mode of operation, such gains are significant.

Examination of the scheme depicted in FIG. 24 reveals that medium reliability indicated by the soft bit pattern '10' is composed of a voltage region (or group of voltage intervals), the voltage region composed from 6 different voltage bands, so getting the medium reliability soft bit pattern '10' for a specific cell does not disclose the exact voltage band in which the cell resides. Nevertheless, the voltage region (or group of voltage intervals) information is sufficient for a soft input decoder to decode the code word placed in the upper page with only minor loss in correction capability.

Figure 30:
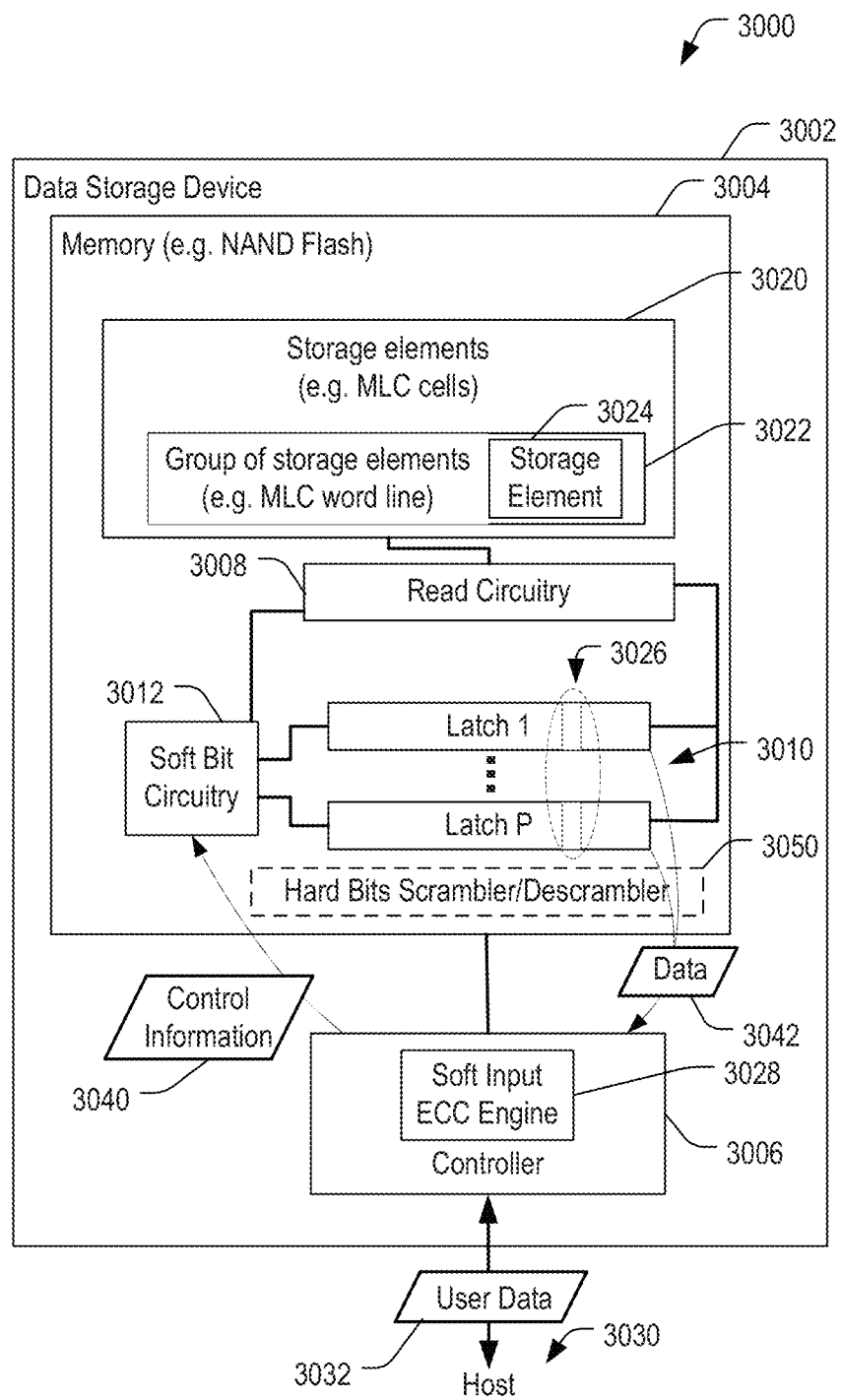
FIG. 30 is a block diagram of a system including a data storage device configured to perform data read operations according to one or more of FIGS. 24-29.

Another advantage of a soft bit scheme such as depicted in FIG. 24 in which the actual state information is lost is the ability to operate a scrambler/descrambler inside the flash memory array as long as the descrambler is applied to only the hard bit(s) read from the logical page while the soft bits are sent to the controller as read (e.g. without de-scrambling the soft bits). An example of a data storage device configured to read data according to the soft bit scheme of FIG. 24 is illustrated in FIG. 30.

Figure 25:
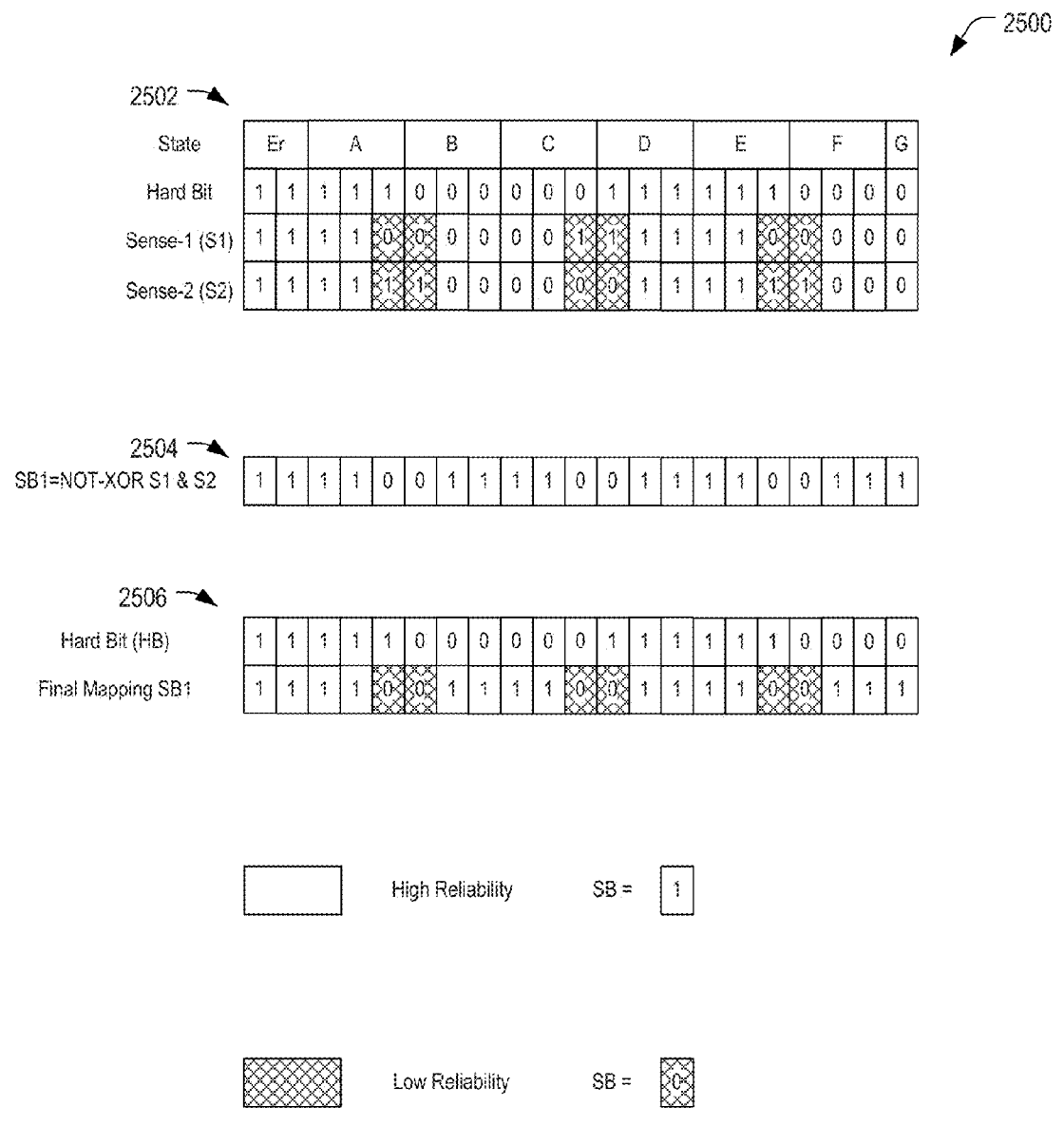

A similar scheme to the one presented in FIG. 24 for two soft bits is provided for the case of one soft bit in FIG. 25. FIG. 25 depicts an embodiment of page-by-page 1-SB read reliability settings for an Upper page. A first table 2502 illustrates states, sensed hard bits (HB), and additional sensed bits (S1, S2). A second table 2504 illustrates soft bit values generated by the logical operation NOT (S1 XOR S2). A third table 2506 depicts a mapping of hard bit and soft bit values to be sent to the controller. As illustrated, a soft bit value of '0' refers to relatively low reliability and a soft bit value of '1' refers to relatively high reliability.

For some application commands, an entire word line may be read. In order to obtain the same resolution as in the page-by-page read, 35 sense operations may be employed, as described in further detail in FIG. 26. However, because the entire word line is read, the 35 sense operations are operated with shifts in sets of seven sense operations, instead of three sense operations as depicted in FIG. 24 for an Upper page (and two sense operations for the Lower and Middle pages per a single command from the controller).

Because the first sense operation in each set of sense operations can require more time than consecutive sense operations attributed to the same command using seven sense operations per each command, a total reduction of sense timing may be achieved in case all 35 thresholds are sensed when the entire three pages of the word line are required. The first sense operation in each command may require more time than subsequent sense operations because a capacitor within the sense circuit is charged to set the voltage applied to the control gate of the cell and the sense amplifier circuit is started.

Figure 26:
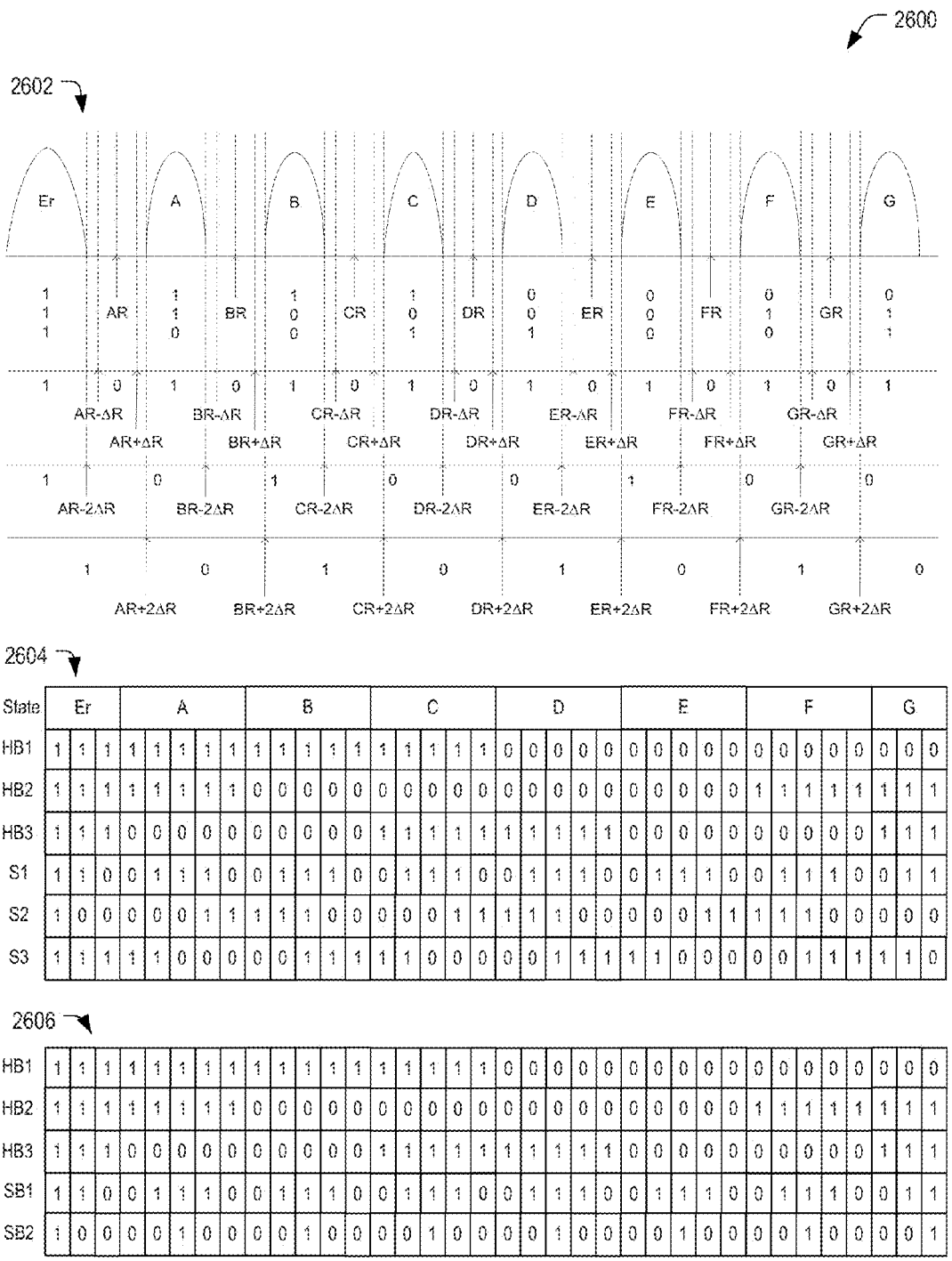
FIG. 26 is a general diagram illustrating a particular embodiment of a sensing scheme including a graphical depiction of cell state distributions and threshold read voltages for hard bits and additional sensed bits.

FIG. 26 shows an embodiment 2600 of a sensing scheme including a graphical depiction 2602 of cell distributions for states (Er, A, . . . G) and threshold read voltages for hard bits (e.g. voltages AR, BR, . . . GR) and for additional sensed bits (e.g. voltages AR−ΔR, AR+ΔR). A first table 2604 illustrates a mapping of each voltage interval between adjacent threshold read voltages to a set of six bits including three hard bits (HB1, HB2, HB3) and three sensed soft bits (S1, S2, S3). A second table 2606 illustrates a mapping of each voltage interval to a set of five bits to be sent to the controller after performing a logical operation on the sensed soft bits.

Figure 27:
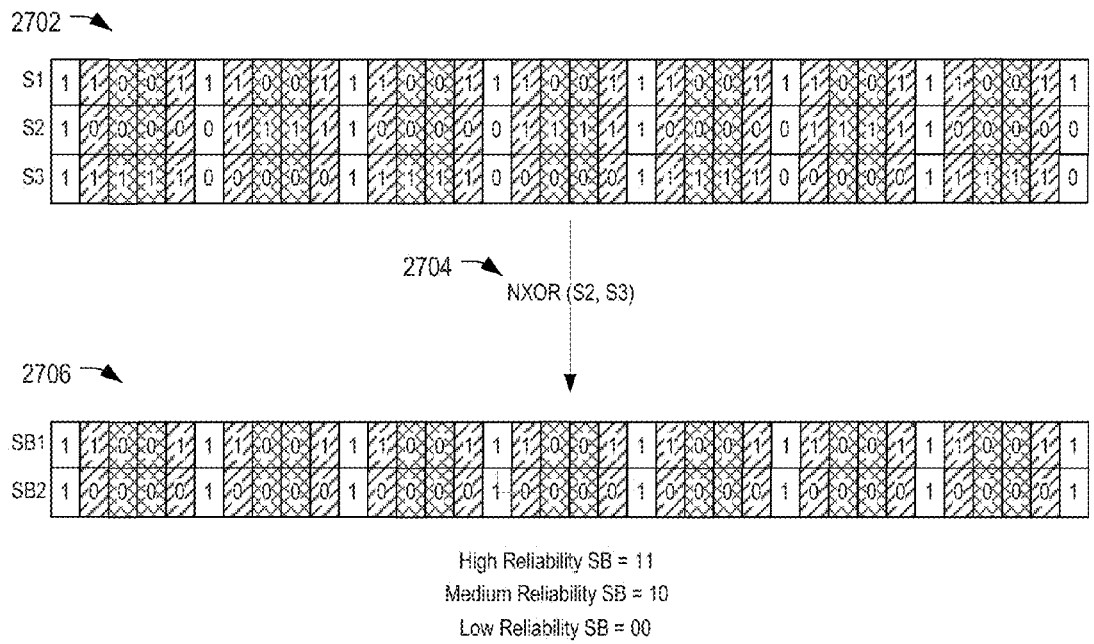
FIG. 27 is a general diagram illustrating a particular embodiment of reliability voltage regions according threshold read voltages depicted in FIG. 26.

The sensing scheme depicted in FIG. 26 includes a pattern of six bits per cell representing the voltage band the cell resides in. Instead of a transfer of these six bits per cell from latches in the memory to the controller, the last two rows depicted in the table 2604 as S2 and S3 can be unified into one page of soft bit data using a NOT {XOR(S2, S3)} cell-by-cell operation inside the flash memory latches, as depicted in FIG. 27, and then transferring the result to the controller. As illustrated in FIG. 27, a first table 2702 of the bits S1, S2, S3 of table 2604 in FIG. 26 is mapped via a NOT {XOR(S2, S3)} operation 2704 to generate soft bits SB1 and SB2 illustrated in a second table 2706 and corresponding to the soft bits SB1 and SB2 of the table 2606 of FIG. 26.

Soft bit generation as depicted in FIG. 26 can be independent from hard bit generation. As a result, the soft bits may be generated in a same number of latches or fewer latches as used to provide the hard bits. For example, the soft bit generation of FIG. 26 may use a same number of latches as a conventional flash memory. FIG. 27 illustrates high reliability, medium reliability, and low reliability voltage regions (each composed from multiple voltage bands) with corresponding representative bit patterns of 11, 10, and 00. Note that these patterns (in FIG. 27) match the same bit patterns obtained in the page-by-page read as depicted in FIG. 24. S2 and S3 referred to in FIG. 27 correspond to the S2 and S3 presented in FIG. 26. SB1 and SB2 in FIG. 27 represent the same reliability as the bits in FIG. 24 even though FIG. 24 corresponds to a page-by-page read and FIG. 27 corresponds to a sequential read.

Even though the hard bit mapping (of the Upper page) in FIG. 26 is different than the mapping presented for the Upper page hard bit in FIG. 24, the representation of the soft bits remains the same because the soft bit pages are read independent of the hard bit pages. Soft bits may therefore be read independently from the selected mapping scheme.

Comparing the scheme depicted in FIG. 27 to a conventional read scheme, the scheme depicted in FIG. 27 results in transferring five pages from the controller to the flash memory as opposed to six pages, corresponding to a 16% reduction in transfer time. However, had a page-by-page procedure been selected for the case when the entire word line data is required, then instead of transferring nine pages (e.g. performing 35 sense operations, transferring three pages (i.e. one HB and two SB) for each logical page separately, and transferring 3×3=9 pages altogether) only five pages are computed, resulting in reduction of transfer time of about 44%.

Furthermore, the same set of two soft bits can serve all three logical pages (Upper, Middle, and Lower) upon activating the decoder in the controller employing the same transformation between soft bit patterns and soft input reliability. As a result, design and implementation of the soft input decoder set to decode each of the logical pages independently may be simplified. One embodiment for such operation includes: (1) sense and transfer the two soft bits into the controller, (2) sense just the hard bits of the upper page, (3) decode the upper page, (4) sense and transfer only the hard bits of the middle page, (5) decode the middle page, (6) sense and transfer only the hard bits of the lower page, and (7) decode the lower page. In this embodiment, two latches in the memory and three buffers in the controller may be sufficient for operation, which may reduce the cost of both the memory and the controller while keeping a correction capability of the soft input decoder in a near-optimal region.

Figure 28:
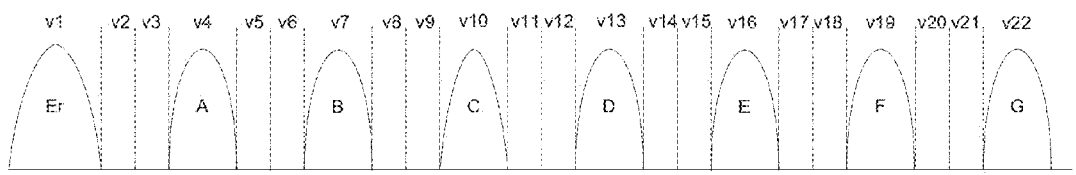
FIG. 28 is a general diagram illustrating a particular embodiment of a sensing scheme that provides a single soft bit.
Figure 29:
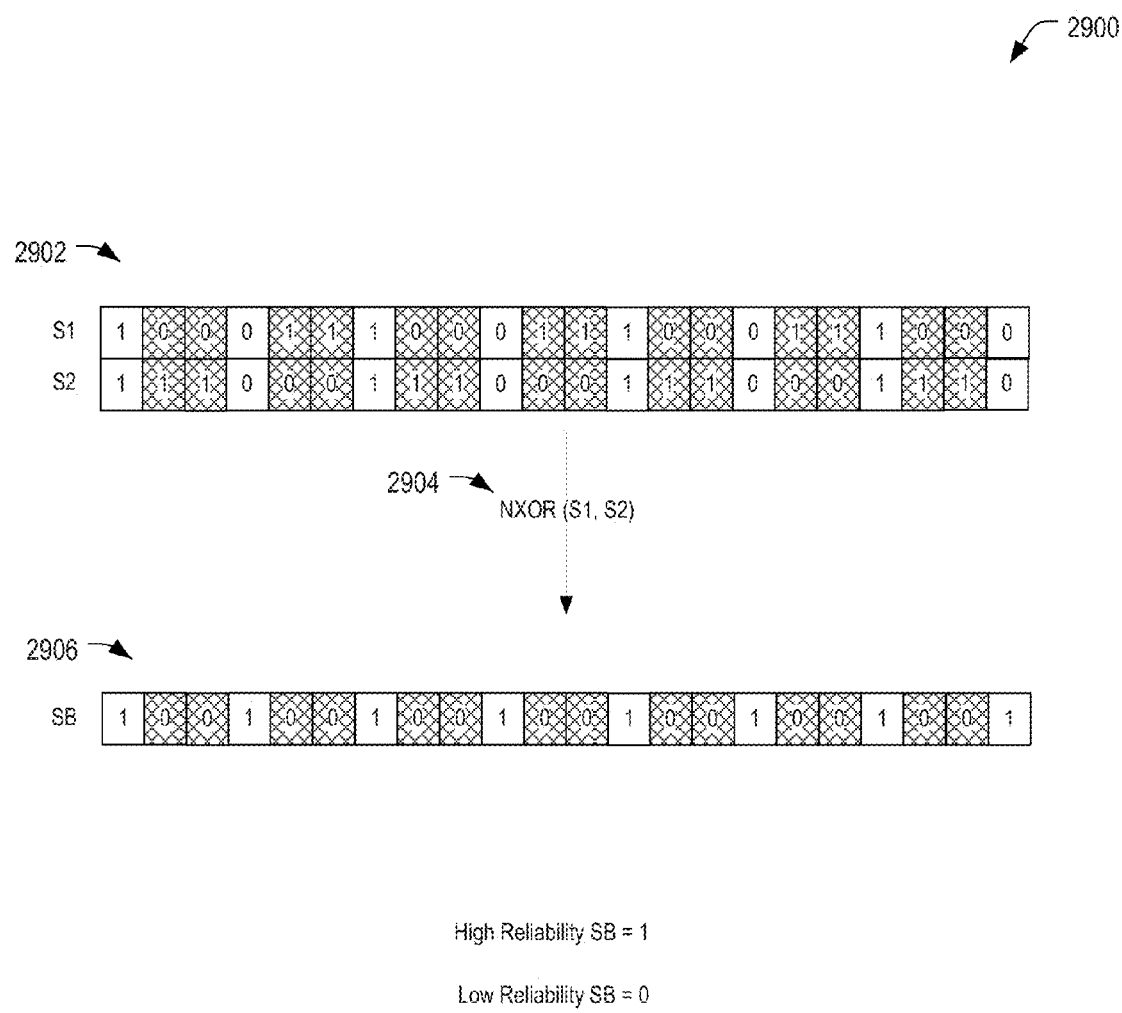
FIG. 29 is a general diagram illustrating a particular embodiment of reliability voltage regions using a single soft bit according threshold read voltages depicted in FIG. 28.

A substantially similar approach can be used when only one soft bit is provided (e.g. with a more reliable condition of the flash memory that enables operation with a single soft bit instead of two soft bits). FIG. 28 illustrates an embodiment 2800 of providing a single soft bit. A graphical depiction 2802 of voltage intervals v1-v22 corresponds to states of a storage element (e.g. Er, A, . . . G) and regions between the states. A first table 2804 illustrates a mapping of sensed hard bits (HB1, HB2, HB3) and soft bits (S1, S2). A second table 2806 illustrates a mapping of the hard bits and a single soft bit (SB) to be sent to the controller. FIG. 29 depicts an embodiment 2900 of generating a single soft bit 2906 from two sensed soft bits 2902, such as the SB of the second table 2806 of FIG. 28, generated by a NOT {XOR(S1, S2)} operation 2904.

FIGS. 28-29 illustrate schemes for one soft bit read in a manner similar to the two soft bits of FIG. 26-27. The schemes of FIGS. 28-29 provide a same soft bit mapping as the page-by-page read (e.g. the soft bits in FIG. 25 and FIG. 29 have a same mapping) and also provide independence between hard bit and soft bit read and generation. For example, soft bits may be read and generated in a consistent manner for every one of the hard bits.

The examples depicted and described with respect to FIGS. 24-29 with one and two soft bits are not limiting and are provided for ease of explanation. Equivalent, identical, or similar methods can be applied to any number of bits per cell stored in the memory and soft bits read when a number of sense operations per overlap region is an odd number. For example, in a two bit per cell implementation, 9 sense operations enable generation one hard bit and one soft bit, 15 sense operations enable generation of one hard bit and two soft bits, and 21 sense operations enable generation of one hard bit and three soft bits. For four bits per cell, 45 sense operations enable generation of one hard bit and one soft bit, and 75 sense operations enable generation of one hard bit and two soft bits. In a general case using any SB threshold sensing that is either even or odd, uniform or non uniform, the disclosed embodiments of page-by-page soft bit read are still viable; however, it may not be guaranteed that a common soft bit pattern representation can be used for page-by-page read and sequential read. Alternatively, reading page-by-page soft bits alone may be independent from a number of selected sense operations.

FIG. 30 depicts a particular embodiment of a system 3000 that includes a data storage device 3002 that can be operatively coupled to a host device 3030. The data storage device 3002 includes a memory 3004, such as a NAND flash memory, coupled to a controller 3006. The controller 3006 may include a soft input error correction coding (ECC) decoder 3028. The memory 3004 includes storage elements 3020, read circuitry 3008, latches 3010, and soft bit circuitry 3012. The soft bit circuitry 3012 enables the data storage device 3002 to apply any one or more of the schemes depicted in FIGS. 24-29.

The data storage device 3002 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 3002 may be embedded memory in the host device 3030, such as eMMC® (trademark of JEDEC Solid State Technology Association, Arlington, Va.) and eSD, as illustrative examples.

The memory 3004 includes the multiple storage elements 3020, including a group 3022 of the storage elements 3020. For example, the storage elements 3020 may include MLC cells. To illustrate, the memory 3004 may include a multilevel cell (MLC) flash memory and the group 3022 of the storage elements 3020 may be a MLC word line.

The latches 3010 are operative to latch data that is read from the group 3022 of the storage elements 3020, such as an MLC word line. For example, the data storage device 3002 may implement the soft bit scheme of FIG. 26 with one latch 3010 storing the data for HB1, a second latch 3010 storing the data for HB2, a third latch 3010 storing the data for HB3, a fourth latch 3010 storing the data for S1, a fifth latch 3010 storing the data for S2, and a sixth latch 3010 storing the data for S3. Here, P=6 with respect to the soft bit circuitry 3012.

The soft bit circuitry 3012 is operative to manipulate soft data bits in the latches 3010 using one or more logical operations to reduce a total number of soft bits for transfer to the controller 3006 as data 3042. For example, the soft bit circuitry 3012 may apply a XOR operation to data from two latches to generate soft bit data, such as applying a NOT {XOR (S0, S1)} operation to generate soft bit SB1 and applying a NOT {XOR (S2, S3)} operation to generate soft bit SB2. The soft bit circuitry 3012 may be responsive to control information 3040 from the controller 3006 to apply one or more additional logical operations to the data in the latches 3010 and to provide the resulting data to the controller 3006. To illustrate, in response to a first request for data from a first logical page of the group 3022, the read circuitry 3008 may populate the latches 3010 with read data, the soft bit circuitry 3012 may generate the SB1 data, and the HB and SB1 data are sent to the controller 3006. In response to a second request for additional soft bit data for the same logical page of the group 3022 (e.g. when ECC decoding engine 3028 fails using the HB and SB1 data, or it is the case that the ECC decoding duration is sufficiently large such that adding another soft bit justifies the extra sensing and transfer time while decreasing the ECC decoding duration), the soft bit circuitry 3012 may generate the SB2 data and send the SB2 data to the controller 3006.

The read circuitry 3008 may be operative to apply read threshold voltages to the group 3022 to sense hard bit and soft bit data from storage elements of the group 3022. For example, the read circuitry 3008 may determine a set of read voltages, apply each of the read voltages to the storage elements of the group 3022 and determine a hard or soft bit value (e.g. by applying the read voltages to gates of NAND flash cells to determine whether the read threshold exceeds a threshold voltage of the NAND flash cells).

As an example, a capacitor that can be charged at a known rate may be used to apply the read voltages. The capacitor may be charged and the group 3022 may be sensed when the capacitor reaches an initial voltage, such as the voltage AR in FIG. 26, after which additional sequential sensing operations may be performed according to the corresponding voltages level. To illustrate, the capacitor may be charged to the voltage BR from the voltage AR after a known charging time, and may be charged to the voltage CR from the voltage BR after the same known charging time. The hard bits may be generated during a first set of sensing operations during which the capacitor is charged from an initial sensing value (e.g. the voltage AR) to a final sensing value (e.g. the voltage GR). Soft bits may be sensed during one or more other sets of sensing operations, such as a set of sensing operations from the voltage AR−ΔR to the voltage GR−ΔR and another set of sensing operations from the voltage AR+ΔR to the voltage GR+ΔR.

In principle, assuming there are a sufficient number of latches 3010 in the memory 3004 (e.g. 'P' is large enough), sensing can be all done in one sequence. For example, a set of 21 non-uniform charging step sizes for reading the hard bits and one soft bit may be as follows: AR−×ΔR, AR, AR+ΔR, BR−ΔR, BR, BR+ΔR, CR−ΔR, CR, CR+ΔR, DR−ΔR, DR, DR+ΔR, ER−ΔR, ER, ER+ΔR, FR−ΔR, FR, FR+ΔR, GR−ΔR, GR, GR+ΔR. In an illustrative example, using the mapping of Table 5, thresholds BR, DR, and FR are used to generate with upper page hard bit information (HB1) into Latch 1, thresholds AR and ER are used to generate with middle page hard bit information (HB2) into Latch 2, thresholds CR and GR are used to generate with lower page hard bit information (HB3) into Latch 3, thresholds AR−ΔR, AR+ΔR, BR−ΔR, BR+ΔR, CR−ΔR, CR+ΔR, DR−ΔR, DR+ΔR, ER−ΔR, ER+ΔR, FR−ΔR, FR+ΔR, GR−ΔR, and GR+ΔR are used to generate with one soft bit page one soft bit information into Latch 4, resulting in hard and soft bit data as depicted in table 2806 of FIG. 28. In the same manner, 35 thresholds can be read in a single sequence of non-uniform voltage jumps, equivalent to 35 capacitor charging time intervals, such that the data in Latch 1-4 is still generated using the same senses as described; however, SB-2 may be generated into Latch 5, employing the sensing at voltage levels AR−2×ΔR, AR+2×ΔR, BR−2×ΔR, BR+2×ΔR, CR−2×ΔR, CR+2×ΔR, DR−2×ΔR, DR+2×ΔR, ER−2×ΔR, ER+2×ΔR, FR−2×ΔR, FR+2×ΔR, GR−2×ΔR, and GR+2×ΔR, resulting in the mapping as depicted in table 2606 of FIG. 26.

When a sequential read is performed that requires reading of all hard bits in the group 3022, the read circuitry 3008 may operate to perform sensing at all reference voltages illustrated in FIG. 26 in five separate commands, e.g. at voltages AR, BR, CR, DR, ER, FR, GR, then at voltages AR−ΔR, BR−ΔR, CR−ΔR . . . GR−ΔR, then at voltages AR+ΔR, BR+ΔR, CR+ΔR . . . GR+ΔR, then at voltages AR−2ΔR, BR−2ΔR, CR−2ΔR . . . GR−2ΔR, and then at voltages AR+2ΔR, BR+2ΔR, CR+2ΔR . . . GR+2ΔR. The separate commands may use the same circuitry with a different voltage shift applied to each command, providing reduced complexity as compared to using a single sequence that is different for HB only, 1-SB and 2-SB's. However, when a request is received at the memory 3004 to read a single logical page, such as the logical page corresponding to HB2, the read circuitry 3008 may operate to perform sensing at fewer than all reference voltages. For example, HB2 may be read using sensing voltages BR and FR (as per the mapping example in table 2604 of FIG. 26) without using sensing voltages AR, CR, DR, ER, and GR.

Note that the hard bit reading voltages (AR, BR, CR, DR, ER, FR, GR) may be equally spaced, but the soft bit reading voltages are not uniformly distributed, but rather are centered around the hard bit reading voltages. The value of the difference voltage ΔR which defines the placement of the soft bit reading voltages can be determined to improve or to substantially optimize the correction capability of the soft bit decoder.

However, the hard bit reading voltages (AR, BR, CR, DR, ER, FR, GR) may not be equally spaced. If the hard bit reading voltages were equally spaced, then in a 2-2-3 mapping such depicted in Table 5, the upper page would have larger number of errors since the upper page includes three transitions between consecutive states that change the hard bit representation while the lower and middle pages each have only two transitions between two consecutive states for which the mapping changes the bit. Therefore, if the states are uniformly spaced within the voltage window and the cell voltage distribution of each state is equal, 1.5 times more errors are expected to occur in the upper page as compared with lower or middle pages. Another example is the mapping as depicted in FIG. 26, referred to as a 1-2-4 mapping. In this case, the BER in HB3 is 4 times higher than the BER observed in HB1. Thus, applying the same code to all three pages means that, if the page having the highest BER is considered for setting the amount of redundancy in the ECC code, there may be wasted correction capability for a page having a smaller BER. Therefore, the BER may be at least partially balanced between the logical pages such that the same ECC code is applied to all three pages. This may be referred to as BER balancing. One method for balancing the BER for the example case of the mapping depicted in Table 5 is to "shift apart" states 'C' and 'D' while keeping all other states in the same location. This operation would reduce the number of errors in the upper page attributed to the overlap region between states 'C' and 'D' while increasing the number of errors for the middle page in the overlap region between states 'D' and 'E' (as the position of state 'E' is left unchanged). In a similar manner, the number of errors in the lower page is increased since state 'C' is moved to the left (lower threshold voltage) while state 'B' remains in the same position, thus the number of errors in the lower page is increased as a result of the increase in the overlap between states 'B' and 'C'. The amount of moving apart of state 'C' from state 'D' controls the increased reliability of the upper page until such point in which the BER of all three pages may be fully balanced. In the case of the 1-2-4 mapping specified in FIG. 26, in addition to setting states 'C' and 'D' closer to each other, states 'F' and 'E' may be set closer to each other and states 'A' and 'B' may be set closer to each other. Many options exist to provide BER balancing, and the present disclosure includes embodiments where the position of the states in the voltage window are modified by adjusting the verify level of each state separately.

The memory 3004 may also include a scrambler/descrambler 3050. The scrambler/descrambler 3050 may include circuitry configured to modify data values to be stored in the storage elements 3020, such as by applying a XOR operation of the data values with an output of a linear feedback shift register. The scrambler/descrambler 3050 may also be configured to modify data values read from the storage elements 3020 to descramble data that was scrambled prior to storage. The scrambler/descrambler 3050 is configured to scramble and descramble hard bits only without scrambling or descrambling any soft bits.

During operation, the memory 3004 may receive a request for data stored in the group 3022. A set of bits 3026 corresponding to a particular storage element 3024 of the group 3022, such as such as a representative memory cell of a flash MLC word line, is generated in the memory 3004. The set of bits 3026 can be stored as a bit in each of one or more of the latches 3010 that corresponds to a value stored in the particular storage element 3024.

The set of bits 3026 indicates a group of threshold voltage intervals. For example, the set of bits 3026 may correspond to the hard bit of the upper page (HB1) and the soft bit SB of FIG. 28. To illustrate, the upper page may be read without reading the middle page and the lower page, and the set of bits "11" (e.g. HB1='1', SB='1') can correspond to the group of voltage intervals v1, v4, v7, and v10 of FIG. 28, and the set of bits "10" (e.g. HB1='1', SB='0') can correspond to the group of voltage intervals v2, v3, v5, v6, v8, v9, and v11.

A threshold voltage of the particular storage element 3024 of FIG. 30 corresponds to one of the threshold voltage intervals within the group of threshold voltage intervals. In the example where the upper page is read to generate the set of bits 3026 as a single hard bit (e.g. HB1 of FIG. 28) and a single soft bit (e.g. SB of FIG. 28), if the particular storage element 3024 has a threshold voltage that is within the voltage interval v4 (i.e. state A) of FIG. 28, the set of bits 3026 indicates the group of threshold voltage intervals v1, v4, v7, and v10 (i.e. the threshold voltage intervals that match the set of bits HB1='1', SB='1'). At least one threshold voltage interval within the group of threshold voltage intervals is separated from another threshold voltage interval within the group of threshold voltage intervals by an intervening threshold voltage interval that is not within the group of threshold voltage intervals. To illustrate, the intervals v1 and v4 in the group of threshold voltage intervals (that includes v1, v4, v7, and v10) are separated by the intervals v2 and v3 that are not within the group of threshold voltage intervals (i.e. not v1, v4, v7, or v10).

The set of bits 3026 in FIG. 30 is sent to the controller 3006 in FIG. 30 as the data 3042 of FIG. 30 as part of a transfer of data in the latches 3010 resulting from the read request. The set of bits 3026 can include a first hard bit (e.g. HB1 of FIG. 28) that corresponds to a value stored in the particular storage element and a first soft bit (e.g. SB of FIG. 28) that corresponds to a reliability measure for the stored value, e.g. what is the confidence level with the value read of the stored bit.

The particular storage element 3024 may be within a physical page of the memory 3004 that includes a first logical page and a second logical page, such as a logical page storing HB1 and a logical page storing HB2 of FIG. 28. A state of the particular storage element 3024 corresponds to multiple hard bits that include the first hard bit corresponding to the first logical page and a second hard bit corresponding to the second logical page. For example, the particular storage element 3024 may have the state "A" illustrated in FIG. 28 that corresponds to the first hard bit HB1 having the value "1", the second hard bit HB2 having the value "1", and the third hard bit HB3 having the value "0".

The set of bits 3026 of FIG. 30 may be generated in response to a request to read the first logical page (e.g. to read HB1 of FIG. 28). To illustrate, when the memory 3004 receives a request to read the first logical page, the set of bits 3026 includes the first hard bit (e.g. HB1) but does not include the second hard bit (e.g. HB2).

The first hard bit and the first soft bit are provided to the soft input ECC decoder 3028 of FIG. 30 as part of an ECC decode operation of data that is read from the memory 3004 of FIG. 30. The first soft bit may indicate whether the threshold voltage is within a center region of any of the threshold voltage intervals of the group of threshold voltage intervals. For example, in FIG. 28, a SB value of "1" indicates that a threshold voltage is within one of the voltage ranges v1, v4, v7, v10, v13, v16, v19, and v22, i.e. in a center region of one of the defined states Er, A, B, C, D, E, F, and G, respectively, and not within overlap regions between adjacent states.

The first set of bits 3026 (of FIG. 30) may be sent to the controller 3006 (of FIG. 30) in response to receiving the first request from the controller 3006 (of FIG. 30) for first stored data. After sending the first set of bits 3026 (of FIG. 30) to the controller 3006 (of FIG. 30), a second request for additional information corresponding to the first stored data may be received at the memory 3004 (of FIG. 30) from the controller 3006 (of FIG. 30). A second soft bit corresponding to the particular storage element 3024 (of FIG. 30) may be determined at the memory 3004 (of FIG. 30). For example, if the first set of bits 3026 (of FIG. 30) corresponds to the hard bit (HB) and the final mapping is of two soft bits as depicted in table 2406 of FIG. 24, then the second soft bit SB2 of FIG. 24 may be generated by performing a NOT {XOR (S3, S4)} operation within latches 3010 of FIG. 30 out of S3 and S4 of FIG. 24 residing also in latches 3010 of FIG. 30 and then sent to the controller 3006 (of FIG. 30) through data layer 3042 (of FIG. 30) without going into de-scrambling 3050 (of FIG. 30).

The second soft bit indicates whether the threshold voltage is within a second region of any of the voltage intervals of the group of threshold voltage intervals. To illustrate, the hard bit (HB) illustrated in FIG. 24 has a "1" value for states Er-A, a "0" value for states B-C, a "1" value for states D-E, and a "0" value for states F-G. The soft bit SB1 of FIG. 24 has a "0" value in voltage intervals closest to the transition between states A and B, between states C and D, and between states E and F. The second region of each particular voltage interval is centered substantially at a midpoint of the particular voltage interval and differs from the first region. For example, the second soft bit SB2 indicates a threshold voltage as within a voltage interval farther from the transition between the states A and B than the first soft bit SB2, farther from the transition between states C and D than the first soft bit SB2, and farther from the transition between states E and F than the first soft bit SB2. The second soft bit value may be sent to the controller 3006 (of FIG. 30) to provide additional reliability information to assist in decoding.

The memory 3004 may be configured to provide a same soft bit pattern to indicate reliability during a page-by-page read operation as during a sequential read operation. For example, the soft bit pattern illustrated in FIG. 25 includes a first soft bit SB1 that has a "0" value in the voltage intervals adjacent to each transition of the hard bit corresponding to the page (i.e. low reliability) and a "1" elsewhere (i.e. high reliability). As another example, the soft bit pattern illustrated in FIG. 27 includes a set of bits SB1, SB2 with a "11" value indicating high reliability, "10" indicating a medium reliability, and "00" indicating low reliability. The soft bit pattern may be independent of a selected mapping scheme of bits to states. For example, soft bit values of the soft bit patterns of FIG. 25 and FIG. 27 are determined based on proximity to a transition between states and instead of being dependent on a specific mapping of bits to states.

The set of bits may be descrambled at the memory 3004 (of FIG. 30) by applying the scrambler/descrambler 3050 (of FIG. 30) to the first hard bit without applying the scrambler/descrambler 3050 (of FIG. 30) to the first soft bit. For example, the hard bit may indicate a state (or group of states) of the particular storage element 3024 (of FIG. 30) while the soft bit(s) may indicate a reliability of the hard bit (e.g. how close the storage element 3024 is to a transition between hard bit values).

Figure 31:
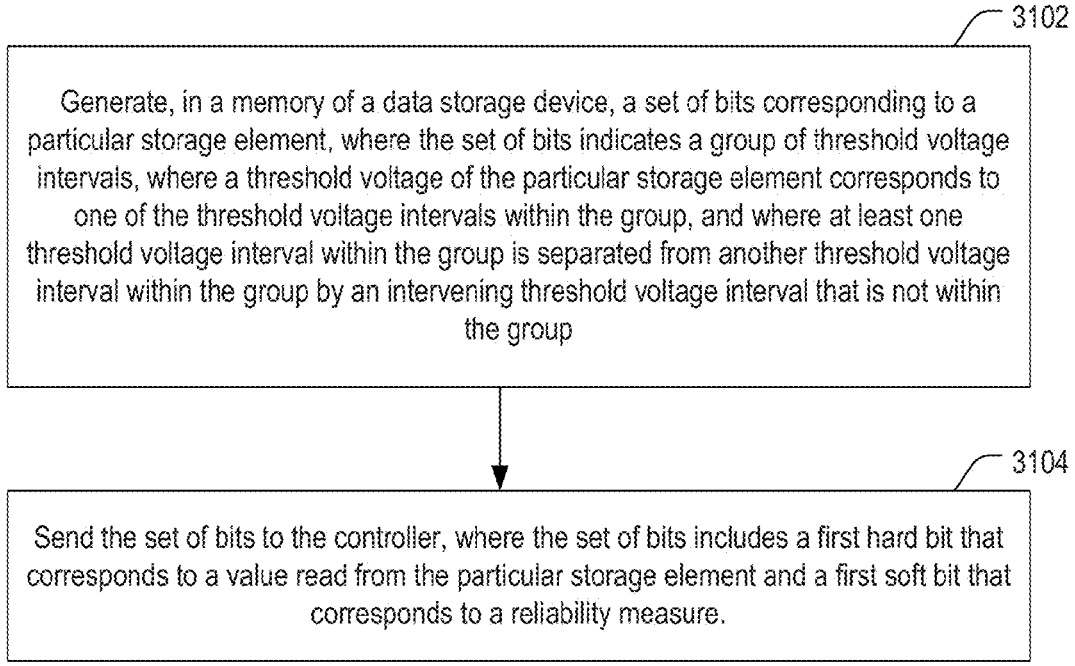
FIG. 31 is a flow diagram of a particular embodiment of reading data that may be performed by the data storage device of FIG. 30.

FIG. 31 illustrates an embodiment of a method or reading data using soft bits. The method may be performed in the data storage device 3002 of FIG. 30. A set of bits corresponding to a particular storage element is generated in the memory, at 3102 (of FIG. 31). The set of bits indicates a group of threshold voltage intervals. A threshold voltage of the particular storage element corresponds to one of the threshold voltage intervals within the group. At least one threshold voltage interval within the group is separated from another threshold voltage interval within the group by an intervening threshold voltage interval that is not within the group.

The set of bits is sent to the controller, at 3104 (of FIG. 31). The set of bits includes a first hard bit that corresponds to a value read from the particular storage element and a first soft bit that corresponds to a reliability measure. The reliability measure may indicate the confidence level for read value to represent the hard bit value.

The particular storage element may be within a physical page of the memory. The physical page includes a first logical page and a second logical page. A state of the particular storage element corresponds to multiple hard bits that include the first hard bit corresponding to the first logical page and a second hard bit corresponding to the second logical page. The set of bits may be generated in response to a request to read the first logical page. To illustrate, when the memory receives a request to read the first logical page, the set of bits includes the first hard bit but does not include the second hard bit.

The controller may include a soft input error correction coding (ECC) decoder and the first hard bit and the first soft bit may be provided to the soft input ECC decoder as parts of an ECC decode operation of data that is read from the memory. The first soft bit may indicate whether the threshold voltage is within a center region of any of the threshold voltage intervals of the group of threshold voltage intervals. The first set of bits may be sent to the controller in response to a first request from the controller for first stored data. After sending the first set of bits to the controller, a second request for additional information corresponding to the first stored data may be received at the memory from the controller.

In response to the second request, a second soft bit corresponding to the particular storage element may be determined at the memory. The second soft bit may indicate whether the threshold voltage is within a second region of any of the voltage intervals of the group of threshold voltage intervals. The second region of each particular voltage interval may be centered substantially at a midpoint of the particular voltage interval, and the second region differs from the first region. The second soft bit value is sent to the controller to provide additional information for soft input ECC decoding.

Although various components depicted herein are illustrated as block components and described in general terms, such components may include one or more microprocessors, state machines, or other circuits configured to enable a data storage device, such as the data storage device 802 of FIG. 8, to perform the particular functions attributed to such components, or any combination thereof. For example, the controller 806 of FIG. 8 may represent physical components, such as controllers, state machines, logic circuits, or other structures to instruct the mapping circuitry 812 to perform logical operations on data in the latches 810 to modify or to substantially equalize page reliability at the group of elements 822.

The controller 806 may be implemented using a microprocessor or microcontroller programmed to generate the control information 840 to instruct the mapping circuitry 812. In a particular embodiment, the controller 806 includes a processor executing instructions that are stored at the memory 804. Alternatively, or in addition, executable instructions that are executed by the processor may be stored at a separate memory location that is not part of the memory 804, such as at a read-only memory (ROM) (not shown).

In a particular embodiment, the data storage device 802 may be a portable device configured to be selectively coupled to one or more external devices. However, in other embodiments, the data storage device 802 may be attached or embedded within one or more host devices, such as within a housing of a portable communication device. For example, the data storage device 802 may be within a packaged apparatus, such as a wireless telephone, a personal digital assistant (PDA), gaming device or console, a portable navigation device, or other device that uses internal non-volatile memory. In a particular embodiment, the data storage device 802 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the FIGs. are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for writing data, the method comprising:
in a data storage device, performing:
receiving data pages to be stored in the data storage device;
generating codewords corresponding to the received data pages;
storing the codewords to physical pages of a first memory portion of the data storage device, wherein a first portion of a particular codeword that corresponds to a particular data page is stored at a first physical page of the first memory portion and wherein a second portion of the particular codeword is stored at a second physical page of the first memory portion; and
copying the codewords from the physical pages of the first memory portion to a physical page of a second memory portion of the data storage device.

2. The method of claim 1, wherein the particular codeword is a concatenated codeword that includes multiple sub-codes and joint parity of the multiple sub-codes.

3. The method of claim 2, wherein each of the multiple sub-codes includes a sub-code data portion and a sub-code parity portion, wherein the first portion of the particular codeword includes the sub-code data portions and wherein the second portion of the particular codeword includes the joint parity.

4. The method of claim 3, wherein generating and storing the multiple sub-codes and the joint parity enables multi-phase decoding of each of the sub-codes.

5. The method of claim 1, wherein the data storage device includes a flash memory, wherein the first memory portion includes single-level cells (SLC) of the flash memory, and wherein the second memory portion includes multi-level cells (MLC) of the flash memory.

6. The method of claim 5, wherein the physical page of the second memory portion is a single MLC wordline.

7. The method of claim 5, wherein each of the multi-level cells is configured to store data according to a first number of bits per cell, wherein a second number corresponds to a count of the received data pages, and wherein the second number equals the first number.

8. The method of claim 7, wherein the codewords are stored to a third number of the physical pages of the first memory portion, the third number greater than the second number.

9. The method of claim 1, wherein the particular codeword includes user data, first parity bits, and second parity bits, wherein the user data and the first parity bits are included in the first portion of the particular codeword, and wherein the second parity bits are included in the second portion of the particular codeword.

10. The method of claim 9, wherein the physical page of the second memory portion includes a first logical page, a second logical page, and a third logical page, wherein the first portion of the particular codeword is copied to the first logical page, wherein the second portion of the particular codeword is copied to the second logical page, and wherein a third portion of the particular codeword is copied to the third logical page.

11. The method of claim 1, wherein the data pages are received from a host device while the data storage device is operatively coupled to the host device.

12. The method of claim 1, wherein each physical page of the first memory portion has a substantially equal probability of being programmed with the first portion of the particular codeword or with the second portion of the particular codeword.

13. The method of claim 1, wherein relative positions of codewords portions in the physical pages of the first portion of the memory are maintained when the codeword portions are copied from the first memory portion to logical pages of the physical page of the second memory portion.

14. The method of claim 1, further comprising, in response to receiving a request from a host device for a particular data portion:
    reading a first portion of a codeword corresponding to the requested data portion from a first page via a single page read;
    initiating a first decode operation to decode the requested data portion based on read data and read parity from the first page; and
    in response to a decoding failure of the first decode operation:
        reading, from a second page, a second portion of the codeword corresponding to the requested data portion; and
        initiating a second decode operation to decode the requested data portion based on the read data and the read parity and further based on read joint parity from the second portion of the codeword.

15. A data storage device comprising:
a memory with physical pages; and
a controller configured to generate codewords corresponding to data pages that are received from a host device while the data storage device is operatively coupled to the host device and to store the codewords to physical pages of a first portion of the memory, wherein a first portion of a particular codeword that corresponds to a particular data page is stored at a first physical page of the first memory portion and wherein a second portion of the particular codeword is stored at a second physical page of the first memory portion,
wherein the data storage device is configured to copy the codewords from the first portion of the memory to a physical page of a second portion of the memory.

16. The data storage device of claim 15, wherein the particular codeword is a concatenated codeword that includes multiple sub-codes and joint parity of the multiple sub-codes to enable multi-phase decoding of each of the sub-codes.

17. The data storage device of claim 16, wherein each of the multiple sub-codes includes a sub-code data portion and a sub-code parity portion, wherein the first portion of the particular codeword includes the sub-code data portions and wherein the second portion of the particular codeword includes the joint parity.

18. The data storage device of claim 15, wherein the memory includes a flash memory, wherein the first portion of the memory is a single level cell (SLC) portion of the flash memory, and wherein the second portion of the memory is a multi-level cell (MLC) portion of the flash memory.

19. The data storage device of claim 18, wherein the physical page of the second portion of the memory is a single MLC wordline.

20. The data storage device of claim 18, wherein the MLC portion is configured to store data according to a first number of bits per cell, wherein the controller is configured to generate the codewords corresponding to a second number of the data pages that are received, and wherein the second number equals the first number.

21. The data storage device of claim 20, further comprising an error correction coding (ECC) engine, wherein the controller is configured to provide the data pages to the ECC engine to generate the codewords.

22. The data storage device of claim 20, wherein the codewords are stored to a third number of the physical pages of the first memory portion, the third number greater than the second number.

23. The data storage device of claim 15, wherein the particular codeword includes user data, first parity bits, and second parity bits, wherein the user data and the first parity bits are included in the first portion of the particular codeword, and wherein the second parity bits are included in the second portion of the particular codeword.

24. The data storage device of claim 23, wherein the physical page of the second portion of the memory includes a first logical page, a second logical page, and a third logical page, wherein the first portion of the particular codeword is copied to the first logical page, wherein the second portion of the particular codeword is copied to the second logical page, and wherein a third portion of the particular codeword is copied to the third logical page.

25. The data storage device of claim 15, wherein the controller is configured to provide each physical page of the first memory portion with a substantially equal probability of being programmed with the first portion of the particular codeword or with the second portion of the particular codeword.

26. The data storage device of claim 15, wherein relative positions of codeword portions in the physical pages of the first memory portion are maintained when the codeword portions are copied to logical pages of the physical page of the second memory portion.

27. The data storage device of claim 15, wherein the controller is configured, in response to receiving a request from the host device for a particular data portion, to read a first portion of a codeword corresponding to the requested data portion from a first page via a single page read and initiate a first decode operation to decode the requested data portion based on read data and read parity from the first page, and wherein the controller is further configured, in response to a decoding failure of the first decode operation, to read a second portion of the codeword corresponding to the requested data portion from a second page and to initiate a second decode operation to decode the requested data portion based on the read data and the read parity and further based on read joint parity from the second page.

28. A method for writing data into a multi-level cell (MLC) flash memory device of B bits per cell, wherein B is a positive number, the method comprising:
   receiving B data pages to be stored in the memory device;
   encoding each of the B data pages into corresponding one or more codewords;
   for each of the B data pages, storing the corresponding one or more codewords into single level cell (SLC) cells in the memory device, wherein for at least one of the B data pages the corresponding one or more codewords are stored into more than one SLC page; and
   copying all of the codewords corresponding to the B data pages from the SLC cells into a wordline of MLC cells.

29. A data storage device comprising:
   a multi-level cell (MLC) flash memory device of B bits per cell, wherein B is a positive number; and
   a controller coupled to the MLC flash memory device, wherein the controller is configured to receive B data pages to be stored in the MLC flash memory device and encode each of the B data pages into corresponding one or more codewords,
wherein the data storage device is configured, for each of the B data pages, to store the corresponding one or more codewords into single level cell (SLC) cells in the MLC flash memory device, wherein for at least one of the B data pages the corresponding one or more codewords are stored into more than one SLC page, and
wherein the data storage device is further configured to copy all of the codewords corresponding to the B data pages from the SLC cells into a wordline of MLC cells.

* * * * *